(12) United States Patent
Tomozawa et al.

(10) Patent No.: US 7,530,676 B2
(45) Date of Patent: May 12, 2009

(54) PIEZOELECTRIC ELEMENT, INKJET HEAD, ANGULAR VELOCITY SENSOR, METHODS FOR MANUFACTURING THEM AND INKJET RECORDING DEVICE

(75) Inventors: Atsushi Tomozawa, Osaka (JP); Eiji Fujii, Osaka (JP); Hideo Torii, Osaka (JP)

(73) Assignee: Panasonic Corporation, Osaka (JP)

( * ) Notice: Subject to any disclaimer, the term of this patent is extended or adjusted under 35 U.S.C. 154(b) by 417 days.

(21) Appl. No.: 10/560,001

(22) PCT Filed: Feb. 21, 2005

(86) PCT No.: PCT/JP2005/002739

§ 371 (c)(1),
(2), (4) Date: Dec. 8, 2005

(87) PCT Pub. No.: WO2005/086248

PCT Pub. Date: Sep. 15, 2005

(65) Prior Publication Data

US 2006/0170736 A1    Aug. 3, 2006

(30) Foreign Application Priority Data

Mar. 5, 2004  (JP) .............................. 2004-062928
Mar. 5, 2004  (JP) .............................. 2004-062978

(51) Int. Cl.
*B41J 2/045* (2006.01)
(52) U.S. Cl. .............................. 347/71; 347/68; 347/72
(58) Field of Classification Search ........................ None
See application file for complete search history.

(56) References Cited

U.S. PATENT DOCUMENTS 6,194,818 B1    2/2001   Sumi et al.
6,402,304 B1 *  6/2002   Qiu et al. ....................... 347/68
6,455,106 B1 *  9/2002   Qiu et al. .................. 427/372.2

(Continued)

FOREIGN PATENT DOCUMENTS

JP            04-057242         2/1992

(Continued)

OTHER PUBLICATIONS

Cheng et al.: Thin Solid Films, vol. 385, Issues 1-2, Apr. 2001, pp. 5-10, Thickness-dependent microstructures and electrical properties of PZT films derived from sol-gel process.*

(Continued)

*Primary Examiner*—Julian D Huffman
*Assistant Examiner*—Alexander C Witkowski
(74) *Attorney, Agent, or Firm*—Harness, Dickey & Pierce, P.L.C.

(57) ABSTRACT

A piezoelectric element includes two electrode films and a layered piezoelectric film which is sandwiched between the electrode films and made of two thin piezoelectric films each having preferred orientation along the (111) plane. The two thin piezoelectric films are aggregates of columnar grains, respectively, which are continuously linked to each other. The columnar grains of the second thin piezoelectric film have a larger average cross-sectional diameter than the columnar grains of the first thin piezoelectric film. The ratio of the thickness of the layered piezoelectric film to the average cross-sectional diameter of the columnar grains of the second thin piezoelectric film is 20 to 60 inclusive.

25 Claims, 30 Drawing Sheets

U.S. PATENT DOCUMENTS

| | | | |
|---|---|---|---|
| 6,494,567 B2 * | 12/2002 | Murai | 347/71 |
| 6,624,458 B2 * | 9/2003 | Takamatsu et al. | 257/295 |
| 6,705,708 B2 * | 3/2004 | Murai | 347/70 |
| 7,083,269 B2 * | 8/2006 | Murai | 347/68 |
| 2002/0168831 A1 * | 11/2002 | Miyasaka | 438/396 |

FOREIGN PATENT DOCUMENTS

| | | |
|---|---|---|
| JP | 10-081016 | 3/1998 |
| JP | 10-209517 | 8/1998 |
| JP | 11-191646 | 7/1999 |
| JP | 11-214763 A | 8/1999 |
| JP | 3021930 | 1/2000 |
| JP | 2000-208828 A | 7/2000 |
| JP | 2000-252544 A | 9/2000 |
| JP | 2000-307163 A | 11/2000 |
| JP | 2001-088294 A | 4/2001 |
| JP | 2001-223403 A | 8/2001 |
| JP | 2002-363256 A | 12/2002 |
| JP | 3481235 | 10/2003 |
| JP | 2004-079991 A | 3/2004 |

OTHER PUBLICATIONS

Sumi et al.: Thin Solid Films, vol. 315, Issues 1-2, Mar. 1998, pp. 77-85: Effect of the annealing temperature on structural and piezoelectric properties of the sol-gel Pb(Zr 0.56Ti 0.44) 0.90 (Mg 1/3 Nb 2/3) 0.10 O3 films.*

Barzegar: Study of Size (Aspect Ratio) Effect on Longitudinal Piezoelectric Coefficient Measured by Quasistatic Technique, 2002 IEEE Ultrasonics Symposium.*

Takayama, R., et al.; "Preparation of epitaxial $Pb(Zr_xTi_{1-x})O_3$ thin films and their crystallographic, pyroelectric, and ferroelectric properties", Journal of Applied Physics, U.S.A., The American Institute of Physics, Feb. 15, 1989, vol. 65, No. 4, pp. 1666-1670.

* cited by examiner

FIG. 2
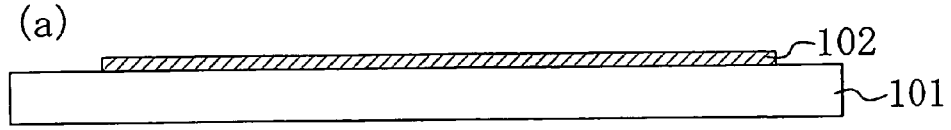
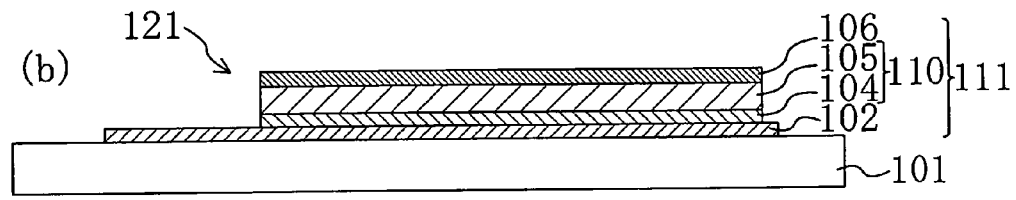
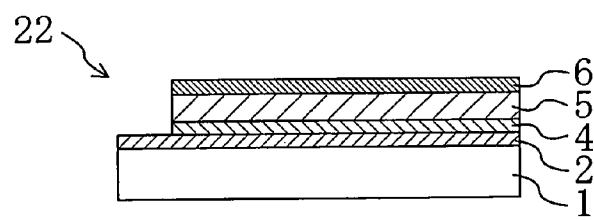
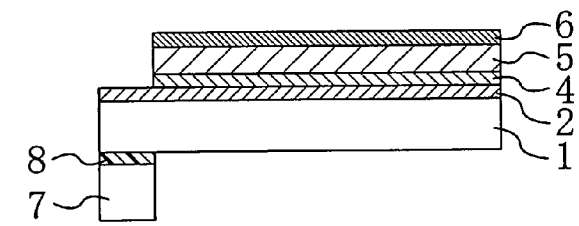
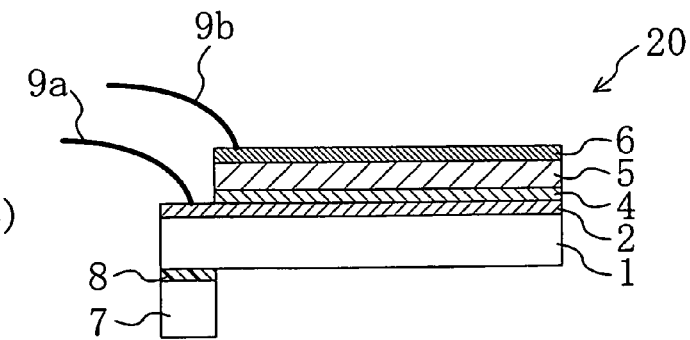

FIG. 4
(a)
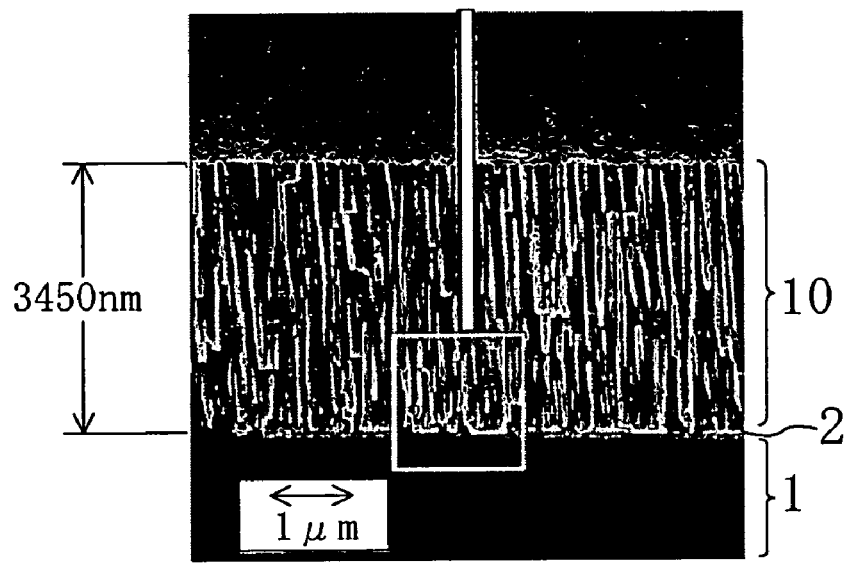
(b)
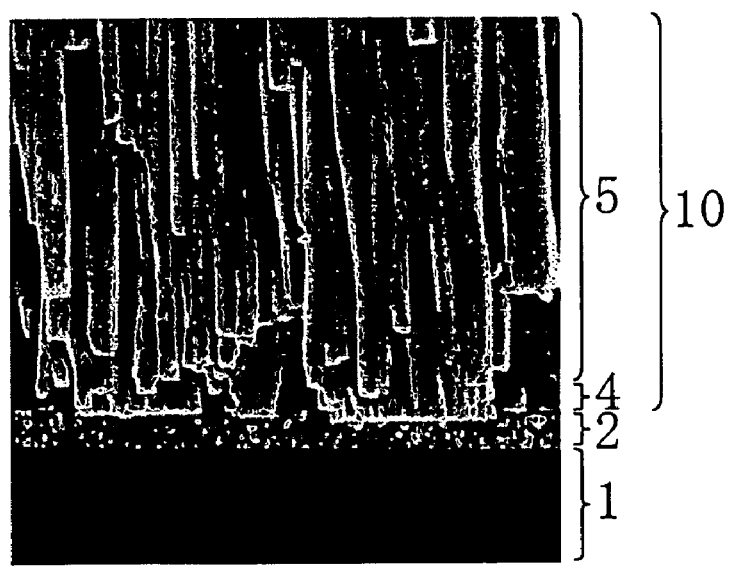

FIG. 9
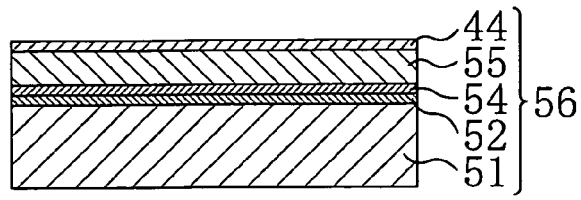
(a)
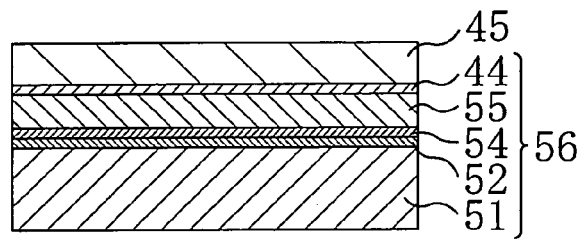
(b)
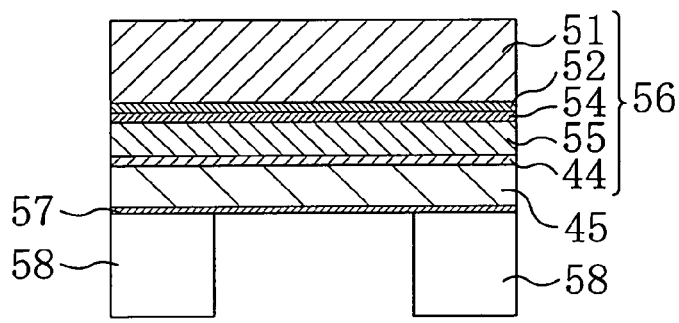
(c)
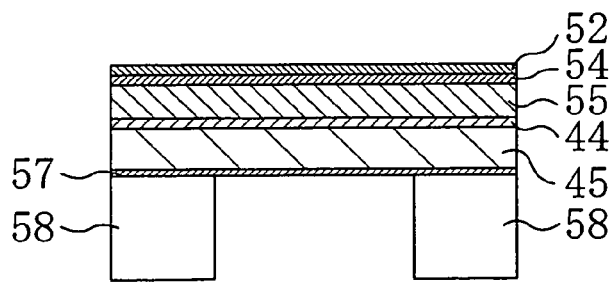
(d)
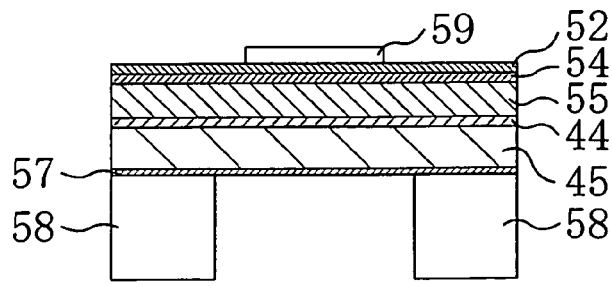
(e)

FIG. 10
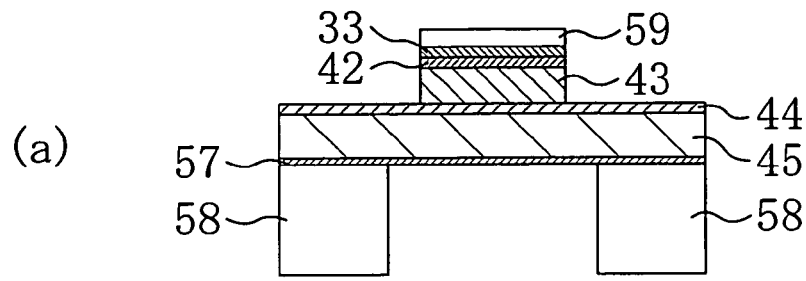
(a)
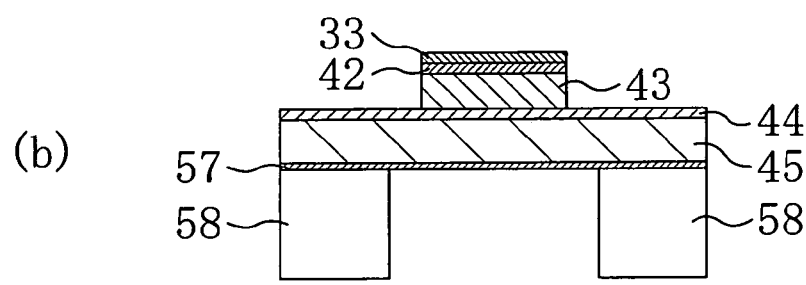
(b)
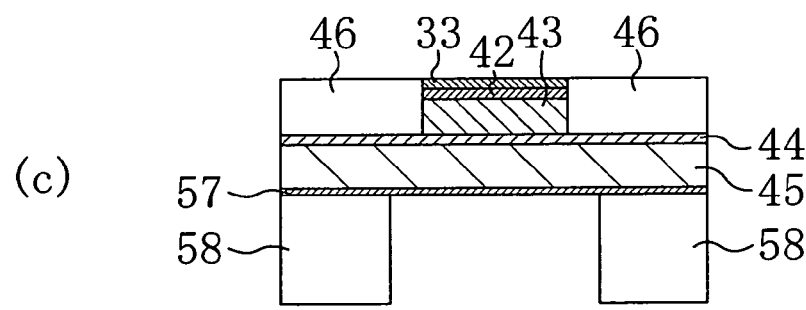
(c)
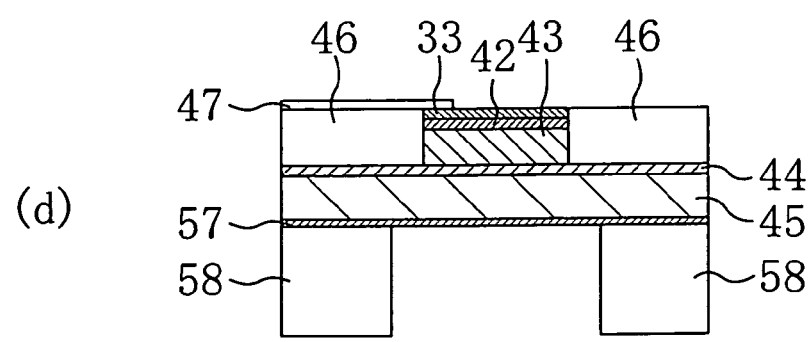
(d)

FIG. 13
(a)
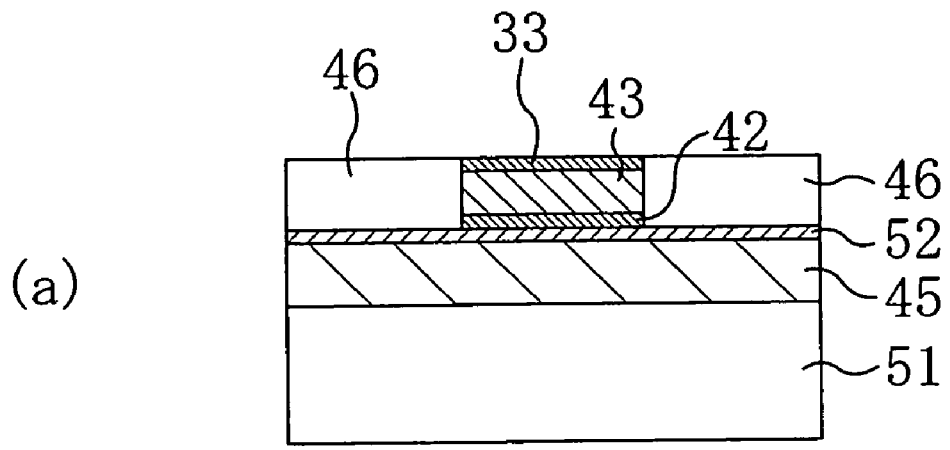
(b)
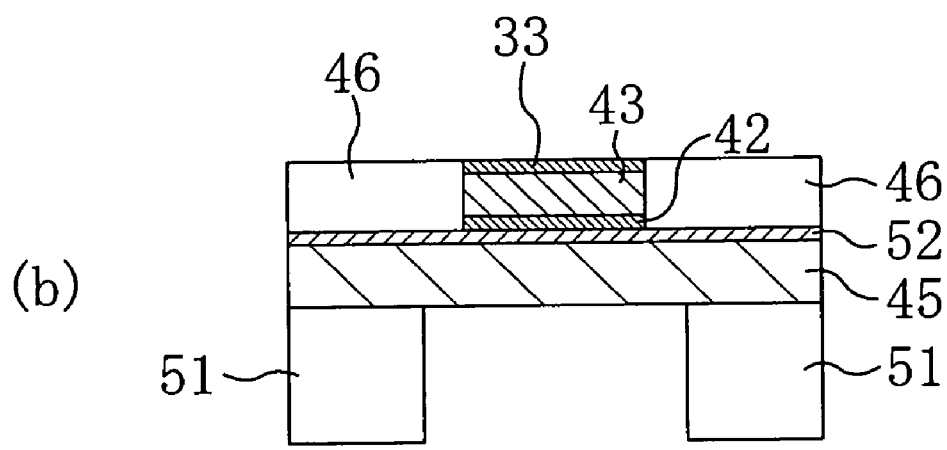
(c)
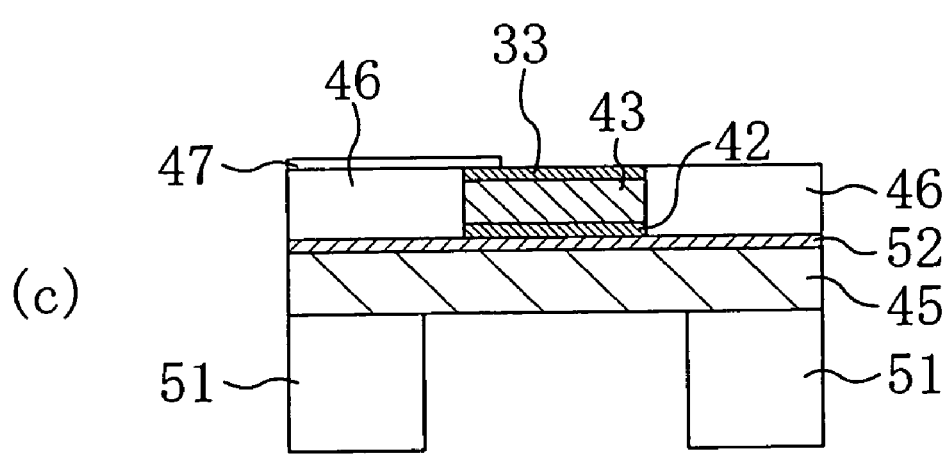

FIG. 17
(a) 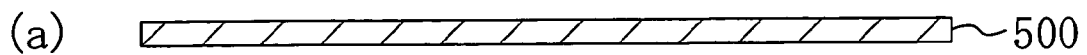
(b) 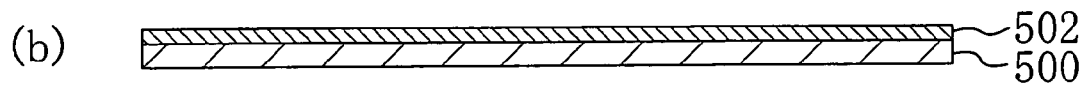
(c) 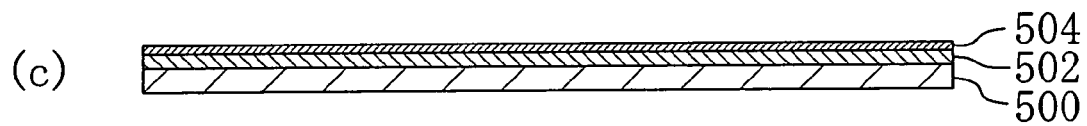
(d) 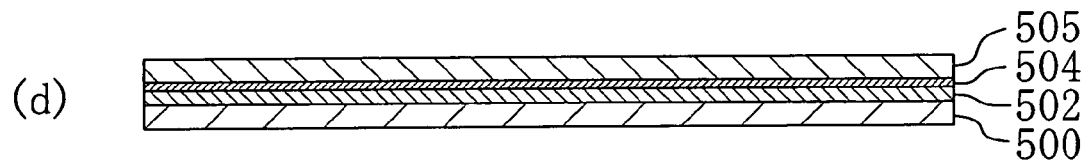
(e) 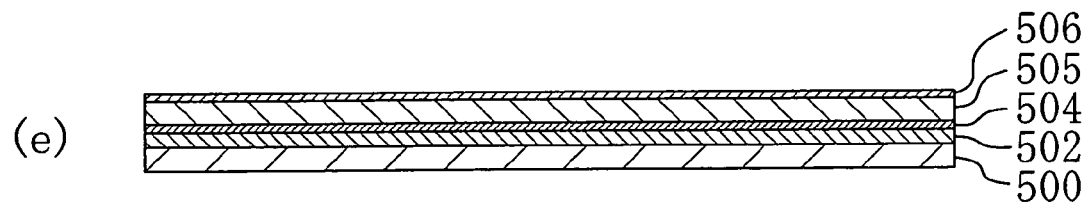
(f) 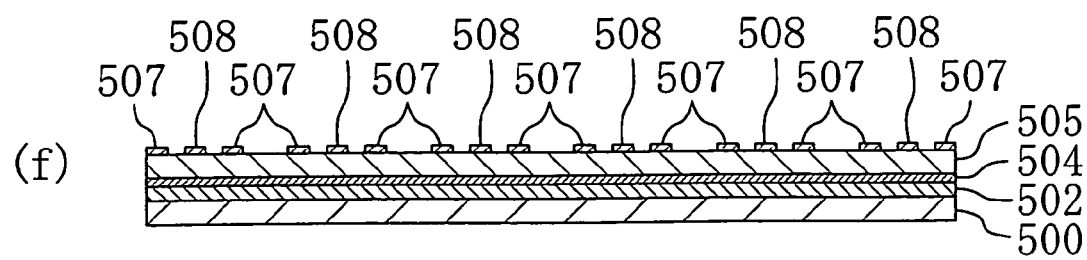

FIG. 21
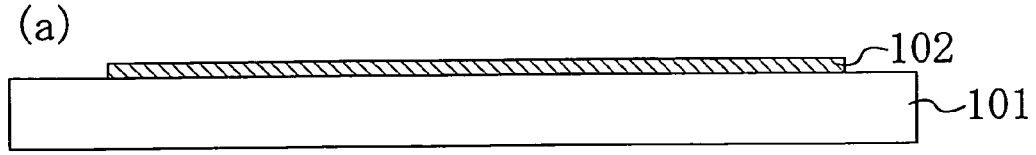
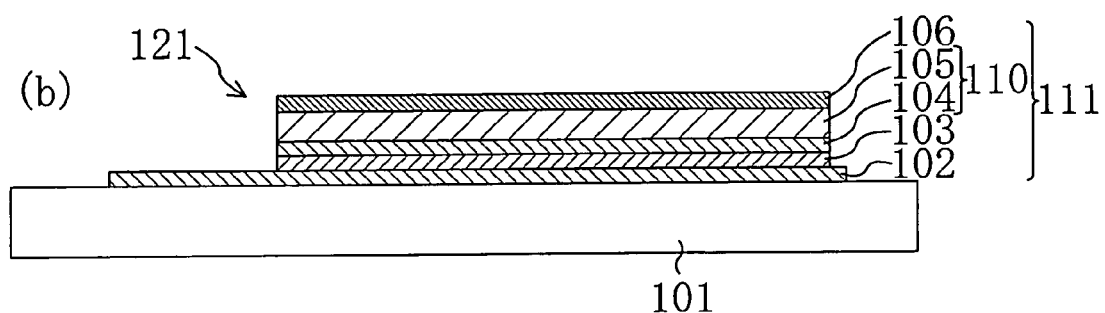
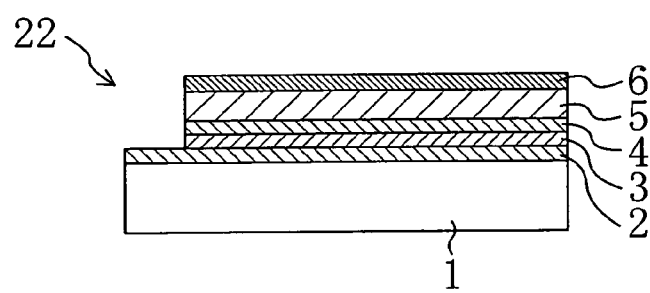
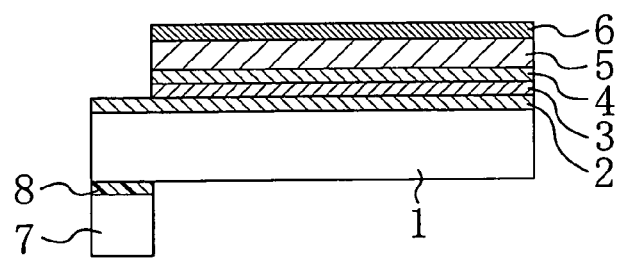
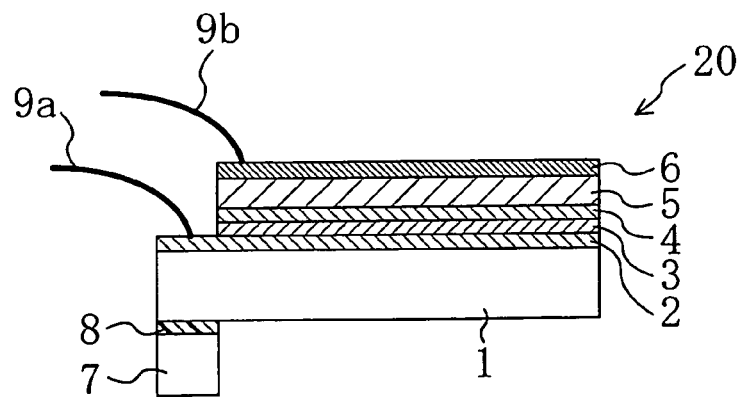

FIG. 23
(a)
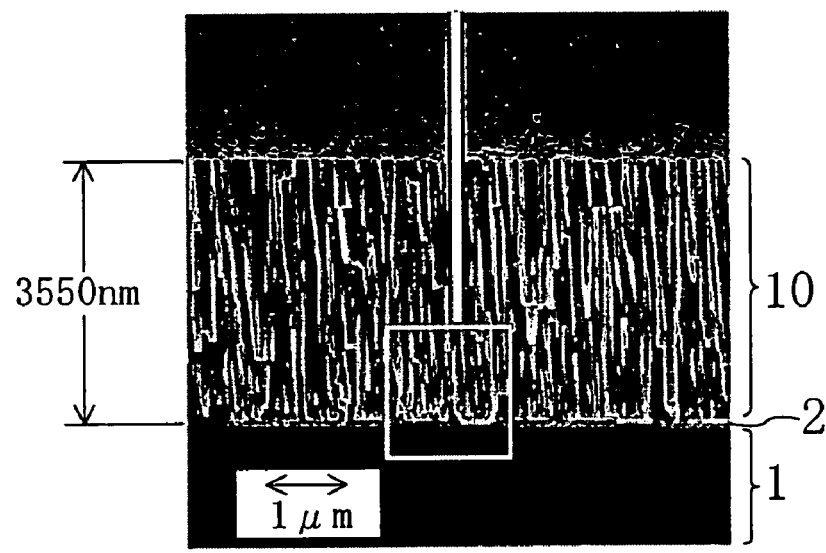
(b)
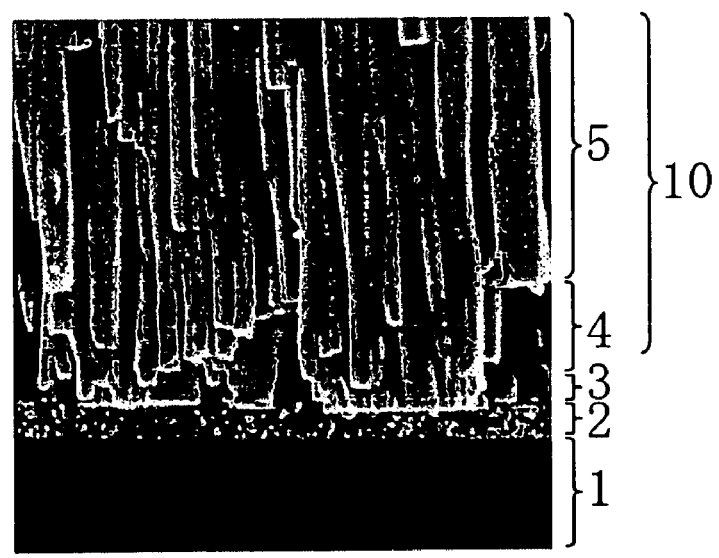

FIG. 26
(a) 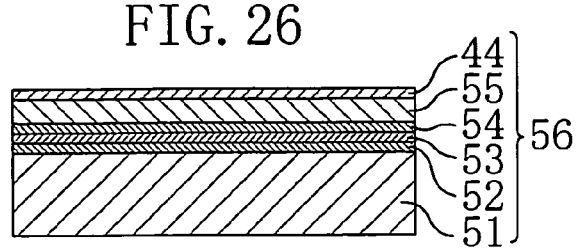
(b) 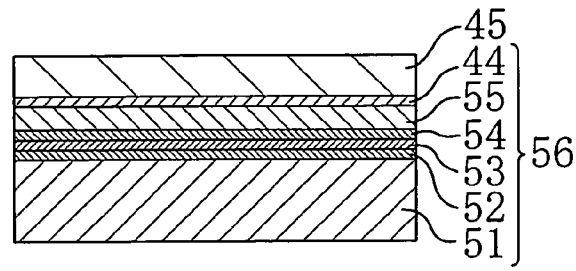
(c) 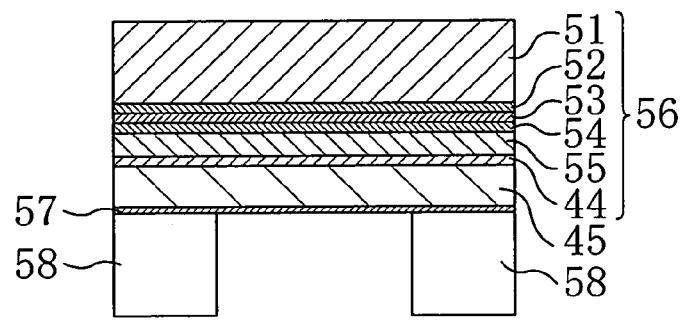
(d) 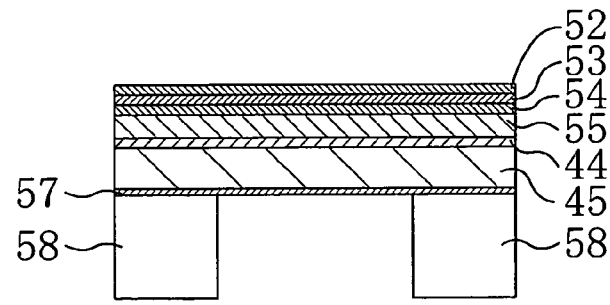
(e) 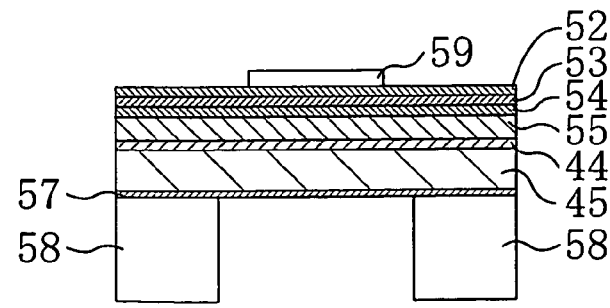

FIG. 29
(a) 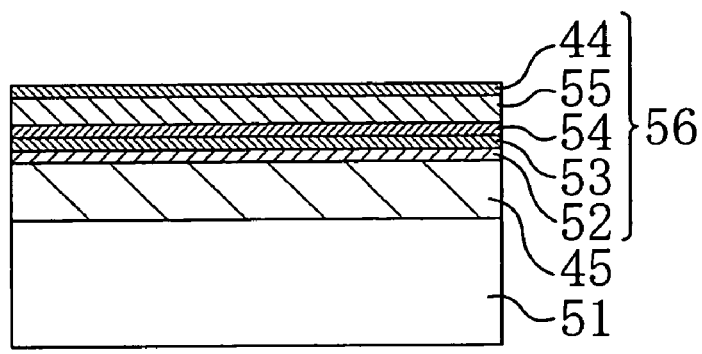
(b) 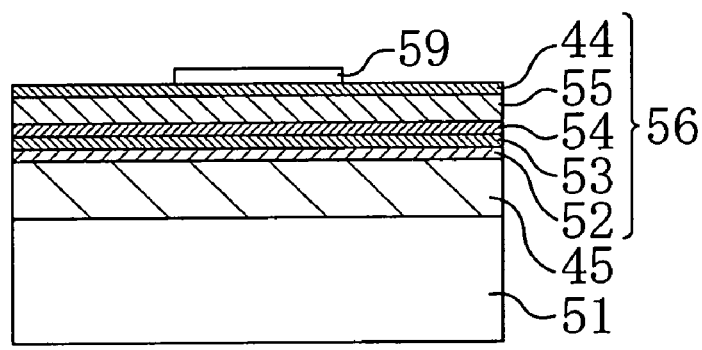
(c) 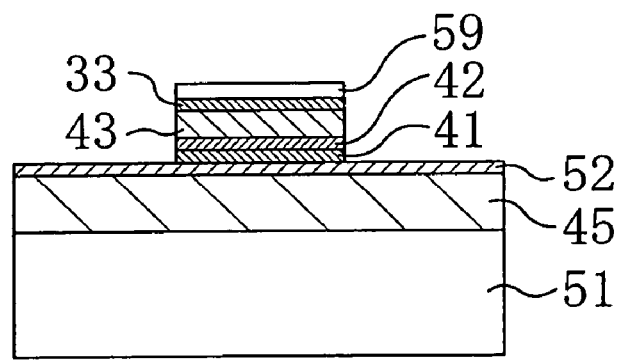
(d) 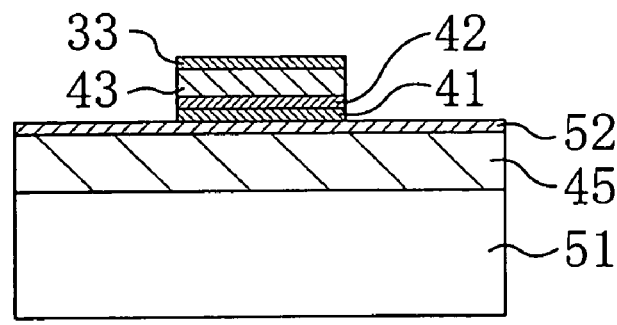

FIG. 33
(a) 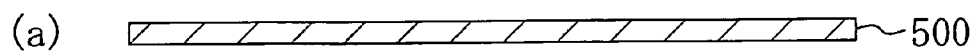
(b) 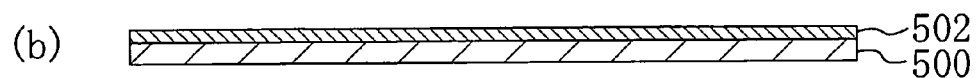
(c) 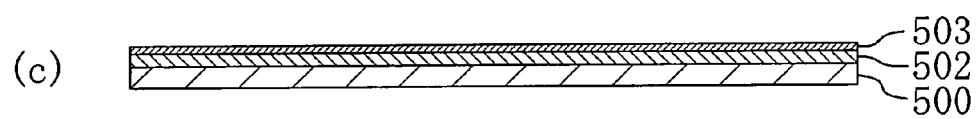
(d) 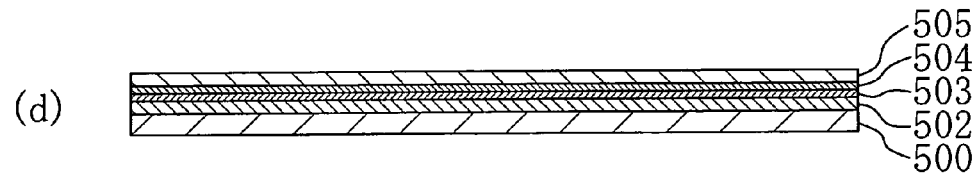
(e) 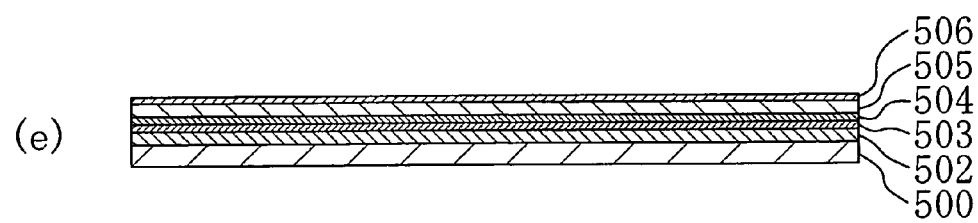
(f) 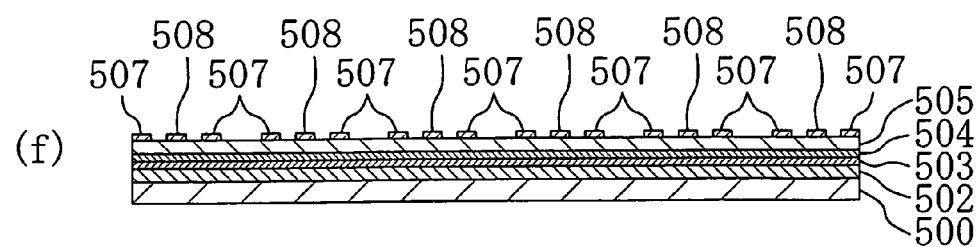

PIEZOELECTRIC ELEMENT, INKJET HEAD, ANGULAR VELOCITY SENSOR, METHODS FOR MANUFACTURING THEM AND INKJET RECORDING DEVICE

TECHNICAL FIELD

The present invention relates to a piezoelectric element which exhibits electromechanical transduction properties, an inkjet head and an angular velocity sensor using the piezoelectric element, methods for manufacturing them and an inkjet recording device using the inkjet head.

BACKGROUND ART

Piezoelectric material is material which converts mechanical or electrical energy to electrical or mechanical energy. A typical example of the piezoelectric material is an oxide having a perovskite crystal structure such as lead zirconate titanate (Pb(Zr, Ti)O$_3$, hereinafter referred to as PZT). Regarding the ratio between Zr and Ti Zr/Ti=53/47 at % as a threshold, perovskite PZT becomes rhombohedral when the ratio of Zr is high, or tetragonal when the ratio of Zr is low. The rhombohedral PZT gives the maximum piezoelectric displacement along the (111) axis, while the tetragonal PZT gives the maximum piezoelectric displacement along the (001) axis (c-axis). However, most of the piezoelectric material are polycrystals constituted of aggregates of crystal grains and the crystallographic axes of the crystal grains are oriented toward various directions. Therefore, the directions of spontaneous polarization Ps are also oriented to different directions.

In accordance with downsizing of electronic devices in recent years, there is a growing demand for downsizing of piezoelectric elements. In order to meet the demand, there is a shift toward the use of thin-film piezoelectric elements having remarkably smaller volume than conventional piezoelectric elements in the form of a sintered body.

Therefore, researches and development have been actively carried out for the purpose of thinning the piezoelectric elements.

In general, a thin piezoelectric film made of PZT-based piezoelectric material is likely to have orientation along the (111) plane. However, orientations along the other surfaces are also recognized because the degree of the (111) orientation is low. Therefore, the thin piezoelectric film does not have enough piezoelectric property to function as a piezoelectric element and the property variations are also remarkable.

For this reason, through refinement of substrates and electrodes, thin piezoelectric films having orientation along the (001) or (100) plane have been manufactured as described below.

For example, rhombohedral PZT shows spontaneous polarization Ps along the (111) axis direction, while tetragonal PZT shows spontaneous polarization Ps along the (001) axis direction. Therefore, in order to achieve high piezoelectric property even when the piezoelectric element is thinned down, the (111) axis of the rhombohedral PZT or the (001) axis of the tetragonal PZT needs to be oriented perpendicular to the surface of the substrate. Conventionally, in order to achieve almost 100% degree of the orientation in tetragonal perovskite PZT, a thin, highly crystalline PZT film is formed directly on a monocrystalline magnesium oxide (MgO) substrate having a rock salt structure sliced to have the (100) crystal orientation plane at the top surface thereof by sputtering using a tetragonal PZT target at a temperature of 600 to 700° C. The thin PZT film has orientation along the (001) axis which is perpendicular to the surface of the substrate. (e.g., see Japanese Unexamined Patent Publication No. H 10-209517 and Journal of Applied Physics, U.S.A., the American Institute of Physics, Feb. 15, 1989, Vol. 65, No. 4, pp. 1666-1670). In this case, a 0.1 μm thick piezoelectric layer which is made of PbTiO$_3$ or (Pb, La)TiO$_3$ and free from Zr is formed on a Pt electrode oriented along the (100) plane as a base layer for the thin PZT film. Then, a thin PZT film of 2.5 μm in thickness is formed thereon by sputtering. By so doing, a low crystalline Zr oxide layer is less likely to be formed in the early stage of the formation of the thin PZT film. As a result, the thin PZT film is obtained with higher crystallinity. Specifically, the thin PZT film is obtained with the degree of orientation along the (001) plane (α(001)) which is almost 100%. The degree of orientation α(001) is defined by $$\alpha(001)=I(001)/\Sigma I(hkl)$$

$\Sigma I(hkl)$ is the sum total of diffraction peak intensities from the crystal planes of perovskite PZT which are obtained by X-ray diffraction using Cu—Kα rays where 2θ is 10 to 70°. The (002) and (200) planes are not included in the value $\Sigma I(hkl)$ because they are equivalent to the planes (001) and (100).

In this case, however, since the monocrystalline MgO substrate is used as a base substrate, the obtained piezoelectric element will be expensive and an inkjet head using the piezoelectric element will also be expensive. Moreover, the substrate material is disadvantageously limited to monocrystalline MgO only.

Therefore, various methods have been developed as described below to form a film having crystal orientation along the (001) or (100) plane using perovskite piezoelectric material such as PZT on an inexpensive substrate made of silicon or other material.

For example, Japanese Patent Gazette No. 3021930 discloses that a PZT film having preferred orientation along the (100) plane can be realized by applying a PZT precursor solution containing PZT or lanthanum-containing PZT on a Pt electrode oriented along the (111) plane, thermally decomposing the precursor solution at 150 to 550° C. and then heating the thermally decomposed precursor solution at 550 to 800° C. for crystallization (sol-gel method).

Further, according to the method disclosed by Japanese Unexamined Patent Publication No. 2001-88294, an ultrathin titanium layer is formed on a bottom electrode made of iridium such that the crystal orientation of a PZT film to be formed thereon is controlled. In this method, a base layer based on zirconium oxide is formed on a substrate made of silicon or other material, a bottom electrode containing iridium is formed on the base layer and an ultrathin titanium layer is formed on the bottom electrode. Then, a thin amorphous film containing a metal element and an oxygen element is formed thereon as a precursor of a thin piezoelectric film and heated at a high temperature for crystallization (sol-gel method). Thus, a thin perovskite piezoelectric film is obtained. According to this method, the crystal orientation of the thin piezoelectric film such as PZT is controlled by the thickness of the titanium layer. If the thickness of the titanium layer is set to 10 to 20 nm, the thin piezoelectric film is oriented along the (111) plane.

According to Japanese Unexamined Patent Publication No. H11-191646, a thin piezoelectric film is formed by a sol-gel method. In this method, a titanium layer of 4 to 6 nm in thickness is formed on a Pt electrode oriented along the (111) plane such that titanium oxide derived from titanium in the titanium layer is used as a crystal seed to obtain a PZT film oriented along the (100) plane.

On the other hand, according to Japanese Unexamined Patent Publication No. 2000-208828 (pp. 3-4), a sol containing Zr and Ti in the concentration ratio of Zr/Ti=75/25 is applied by spin-coating on a $RuO_2$ bottom electrode formed by sputtering on a $SrTiO_3$ substrate and dried by heating to form a precursor film. Then, several precursor films are formed thereon by using a sol containing Zr and Ti in the concentration ratio of Zr/Ti=52/48. Then, the resulting product is annealed at a high temperature of 900° C. to obtain a thin film of PZT-based piezoelectric oxide having a columnar structure and (001) crystal orientation without causing cracks.

All the above-described methods are advantageous in that the expensive monocrystalline MgO substrate is not used. However, unlike the method of forming the thin piezoelectric film on the monocrystalline MgO substrate, it is difficult to obtain a thin, highly crystalline piezoelectric film having crystal orientation defined at the time when the film has been formed because the sol-gel method is used. Therefore, a thin amorphous piezoelectric film is formed first and then a layered film including the thin piezoelectric film is subjected to heating together with the substrate so that the crystallographic axis has preferred orientation along an appropriate direction.

If mass production of the piezoelectric element is carried out by the sol-gel method, a thin amorphous precursor film of the thin piezoelectric film is likely to cause cracks due to a change in volume in a degreasing step for removing organic matters. Further, in the step of heating the thin amorphous precursor film of the thin piezoelectric film at a high temperature for crystallization, cracks are easily generated due to a change in crystallinity and the film is likely to fall off the bottom electrode.

Further, in the sol-gel method, the thickness of the PZT film obtained in a single step (application of a precursor solution and the following heat treatment) is about 100 nm. Therefore, in order to achieve a thickness of 1 μm or more required for achieving the piezoelectric element, the step needs to be carried out 10 or more times. This brings about a problem of reduction of yield.

As a solution of these problems involved in the sol-gel method, Japanese Unexamined Patent Publications Nos. 2000-252544 and H10-81016 disclose an advantage of adding titanium or titanium oxide to the bottom electrode. In particular, Japanese Unexamined Patent Publication No. H10-81016 discloses that a PZT film oriented along the (100) plane is achieved by sputtering.

However, in fact, a perovskite PZT film is not directly formed on the bottom electrode. Instead, an amorphous or pyrochlore PZT film is formed at a low temperature of 200° C. or lower and then the PZT film is heated in an oxygen atmosphere at a high temperature of 500 to 700° C. for crystallization. Therefore, like the sol-gel method, cracks are easily generated or the film is likely to fall off the bottom electrode due to a change in crystallinity in the high-temperature heating step for crystallization. Further, in any of the above-described methods, the degree of (001) or (100) orientation of the PZT film formed by the sol-gel method is 85% or less.

On the other hand, in Japanese Unexamined Patent Publication No. 2001-88294, an attempt has been made to form an orientation-controlled PZT film on an ultrathin titanium layer formed on the surface of a Ir bottom electrode by other methods than the sol-gel method (including MOD method) of forming a thin amorphous film first and then heating the film to turn into a thin crystalline film, i.e., methods which achieve direct formation of a thin crystalline film without heat treatment for crystallization such as sputtering, laser abrasion and CVD. However, the orientation film has not been achieved by the other methods than the sol-gel method. As a reason for the above, it is considered that the sol-gel method achieves the crystallization of the PZT film from the bottom electrode side to the top electrode side, whereas by CVD or sputtering, the crystallization progresses at random without regularity. Therefore, the crystallization is hard to control in these methods.

Further, Japanese Patent Gazette No. 3481235 discloses a method which does not require a post annealing step. According to the method, a thin electrode film made of an alloy of noble metal such as platinum or iridium containing titanium is formed as a bottom electrode by sputtering, a thin oxide film which is made of perovskite lead lanthanum titanate (PLT) free from Zr in its composition and oriented along the (001) plane is formed as an initial layer by sputtering and then a thin PZT film is formed thereon using the PLT film as a base, thereby obtaining a thin PZT film oriented along the (001) plane. Moreover, Japanese Unexamined Patent Publication No. 2004-79991 discloses that use of a thin electrode film made of a noble metal alloy containing cobalt, nickel, manganese, iron or copper makes it possible to form a PZT film oriented along the (001) plane directly on the thin electrode film. As described above, if the PZT film having (001) crystal orientation which exhibits a high piezoelectric constant is achieved, a thin piezoelectric film having high piezoelectric property is obtained. The thin piezoelectric film has (001) preferred orientation perpendicular to the surface of the substrate. If the thin piezoelectric film has a tetragonal perovskite structure, the polarization is oriented along the (001) plane, i.e., the same direction as the preferred crystal orientation. Therefore, high piezoelectric property is exhibited. For these reasons, the thin piezoelectric film described above is expected in various fields as an actuator which achieves large displacement with a small applied voltage.

DISCLOSURE OF THE INVENTION

Problem that the Invention is to Solve

If a substrate having a smaller expansion coefficient than a thin piezoelectric film to be formed thereon, e.g., a monocrystalline silicon substrate, is used, the thin piezoelectric film receives tensile stress from the substrate and the (001) plane having a long crystallographic axis, i.e., the polarization axis, is oriented toward the direction parallel to the substrate surface. If a voltage is applied in the film thickness direction in this state, the polarization axis rotates by 90°. If the applied voltage is low, the polarization axis does not rotate easily and therefore a desired piezoelectric property cannot be obtained. On the other hand, if the applied voltage is high, the polarization axis rotates to be oriented to the direction perpendicular to the substrate surface, thereby exhibiting high piezoelectric property. Thus, the piezoelectric property of the above-described thin piezoelectric film has high dependency on voltage.

When the polarization axis rotates by 90°, large distortion occurs in the crystal and the film may fall off the substrate. Therefore, if the thin piezoelectric film is used as an actuator for obtaining large actuator displacement, a problem of low durability arises.

The present invention has been achieved in view of the above-described problems. An object of the present invention is to provide a highly durable and reliable piezoelectric element which has piezoelectric property less dependent on voltage and prevents films from falling off even when the piezoelectric element is driven at a high voltage to obtain large actuator displacement. Further, the present invention also provides an inkjet head and an angular velocity sensor using the piezoelectric element, methods for manufacturing them, as well as an inkjet recording device using the inkjet head.

Means of Solving the Problem

In order to achieve the above-described object, according to the present invention, a two-layered piezoelectric film is formed on an electrode film made of noble metal. At this time, a first thin piezoelectric film having preferred orientation along the (111) plane is formed first, and then a second thin piezoelectric film whose composition is slightly different from the composition of the first thin piezoelectric film is formed thereon to provide the layered piezoelectric film having a high degree of orientation along the (111) plane.

Specifically, a first embodiment of the present invention is directed to a piezoelectric element including a first electrode film, a layered piezoelectric film including a first thin piezoelectric film formed on the first electrode film and a second thin piezoelectric film formed on the first thin piezoelectric film and a second electrode film formed on the layered piezoelectric film. Specifically, the first embodiment of the present invention is directed to a piezoelectric element including first and second electrode films and a layered piezoelectric film made of first and second thin piezoelectric films sandwiched between the first and second electrode films.

The layered piezoelectric film is made of rhombohedral or tetragonal perovskite oxide having preferred orientation along the (111) plane. The first and second thin piezoelectric films are aggregates of columnar grains, respectively, which are continuously linked to each other. The columnar grains of the second thin piezoelectric film have a larger average cross-sectional diameter than the columnar grains of the first thin piezoelectric film. Further, the ratio of the thickness of the layered piezoelectric film to the average cross-sectional diameter of the columnar grains of the second thin piezoelectric film is 20 to 60 inclusive.

Thus, the layered piezoelectric film which is made of rhombohedral or tetragonal perovskite oxide is formed on the first electrode film and provided with preferred orientation along the (111) plane. Therefore, variations in piezoelectric property are reduced and the piezoelectric element improves in reliability. Specifically, for use of the piezoelectric element, an electric field is applied in the direction perpendicular to the surface of the layered piezoelectric film. Therefore, especially in a PZT film having a rhombohedral perovskite structure, the (111) polarization axis direction becomes parallel to the direction of the electric field due to the (111) orientation, thereby achieving high piezoelectric property. Further, since rotation of the polarization does not occur upon application of the electric field, variations in piezoelectric property are reduced even if the applied voltage is low, and therefore the reliability improves.

On the other hand, in a PZT film having a tetragonal perovskite structure, the polarization axis is oriented along the (001) direction. Therefore, the polarization axis direction and the electric field direction form an angle of about 54° owing to the (111) orientation. If the (111) orientation is enhanced, the polarization axis is maintained at a certain angle with respect to the electric field direction. Therefore, also in this case, rotation of the polarization does not occur upon application of the electric field. As a result, variations in piezoelectric property are reduced and the reliability improves (for example, in an unoriented PZT film, polarization axes which are specific crystallographic axes are oriented toward various directions. Therefore, when an electric field is applied, each of the polarization axes is oriented parallel to the electric field. As a result, the piezoelectric property becomes highly dependent on voltage and variations in piezoelectric property will be significant when the applied voltage is low. Further, if the voltage application is repeated, the reliability may be impaired by change with time.)

Further, since the first and second thin piezoelectric films of the layered piezoelectric film are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive, a piezoelectric constant, which is a performance index of piezoelectric material, of the layered piezoelectric film becomes significantly large. Further, even when the piezoelectric element is driven at a high voltage to obtain large actuator displacement, the film is prevented from falling off.

The layered piezoelectric film having excellent orientation is easily obtained even if an expensive monocrystalline MgO substrate is not used. Therefore, manufacturing cost is reduced by using an inexpensive substrate made of glass, metal, ceramic, Si or other material.

Moreover, even if the intended thickness of the layered piezoelectric film is 1 μm or more, it is not necessary to repeat the same deposition step many times as required in the sol-gel method. The layered piezoelectric film is easily achieved by sputtering and reduction of yield is prevented.

As described above, the piezoelectric element having (111) orientation is easily obtained. Since the PZT film is prone to be oriented along the (111) plane, flexibility in film formation increases, variations in piezoelectric property are reduced and the yield improves easily. Further, since the degree of (111) orientation is high, the piezoelectric element shows high piezoelectric property and low dependence on voltage.

According to a second embodiment of the present invention related to the first embodiment, the columnar grains of the first thin piezoelectric film have an average cross-sectional diameter of 40 nm to 70 nm inclusive and a length of 5 nm to 100 nm inclusive.

According to a third embodiment of the present invention related to the first embodiment, the columnar grains of the second thin piezoelectric film have an average cross-sectional diameter of 60 nm to 200 nm inclusive and a length of 2500 nm to 5000 nm inclusive.

According to the second and third embodiments, the layered piezoelectric film is provided with high piezoelectric property. Even if the piezoelectric element is driven at a high voltage to obtain large actuator displacement, the film is prevented from falling off.

According to a fourth embodiment of the present invention related to the first embodiment, the first and second thin piezoelectric films are made of oxide based on perovskite lead zirconate titanate, the degree of (111) crystal orientation of the first thin piezoelectric film is 50% to 80% inclusive and the degree of (111) crystal orientation of the second thin piezoelectric film is 95% to 100% inclusive.

According to the features, the layered piezoelectric film is provided with high piezoelectric property, while variations in piezoelectric property are reduced and the reliability improves.

According to a fifth embodiment of the present invention related to the first embodiment, the chemical composition ratio of the layered piezoelectric film is represented as [Pb]:[Zr]:[Ti]=(1+a):b:(1−b), the first and second thin piezoelectric films have the same value b of 0.40 to 0.60 inclusive, the first thin piezoelectric film has a larger Pb content than the second thin piezoelectric film, the first thin piezoelectric film has the value a of 0.05 to 0.15 inclusive and the second thin piezoelectric film has the value a of 0 to 0.10 inclusive.

If lead zirconate titanate is used as the layered piezoelectric film and the zirconium content therein is set to 40 mol % to 60 mol % inclusive, the layered piezoelectric film is provided with high piezoelectric property. Further, if the lead content is set to exceed the stoichiometric composition by an amount more than 0 and not more than 15 mol %, the crystallinity of the layered piezoelectric film increases, thereby achieving a large piezoelectric constant. Moreover, if the excess amount of lead is not more than 15 mol %, resistance to voltage improves, thereby achieving a high performance piezoelectric element.

According to a sixth embodiment of the present invention related to the first embodiment, the layered piezoelectric film is made of lead zirconate titanate added with at least one of magnesium and manganese in an amount of more than 0 and not more than 10 mol %.

Therefore, the crystallinity of the layered piezoelectric film increases, thereby improving the piezoelectric property to a higher degree.

According to a seventh embodiment of the present invention related to the first embodiment, the first electrode film is made of noble metal of Pt, Ir, Pd or Ru or an alloy containing the noble metal and is an aggregate of columnar grains having an average cross-sectional diameter of 20 nm to 30 nm inclusive.

According to the features, the first electrode film becomes surely endurable against temperature for sputtering for forming the films of the piezoelectric element. Further, by controlling the average cross-sectional diameter of the first electrode film, adhesion to the substrate improves and the film is surely prevented from falling off during the manufacture of the piezoelectric element.

An eighth embodiment of the present invention is directed to an inkjet head including: a piezoelectric element including a first electrode film, a layered piezoelectric film including a first thin piezoelectric film and a second thin piezoelectric film and a second electrode film stacked in this order; a diaphragm layer disposed on the second electrode film side surface of the piezoelectric element; and a pressure chamber member including a pressure chamber for containing ink which is bonded to the surface of the diaphragm layer opposite to the second electrode film, such that the ink in the pressure chamber is discharged out by displacing the diaphragm layer in the thickness direction by the piezoelectric effect of the layered piezoelectric film.

The piezoelectric element included in the inkjet head is the one according to the first embodiment of the present invention. Specifically, the layered piezoelectric film is made of rhombohedral or tetragonal perovskite oxide having preferred orientation along the (111) plane, the first and second thin piezoelectric films are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive.

According to the above features, the first electrode film, layered piezoelectric film, second electrode film and diaphragm layer are formed in this order on the substrate by sputtering, the pressure chamber member is bonded to the diaphragm layer and then the substrate is removed after the pressure chamber member is bonded to the diaphragm layer. As a result, an inkjet head including the same piezoelectric element as that of the first embodiment is obtained. Further, the degree of (111) orientation of the second thin piezoelectric film of the piezoelectric element reaches 95% or more. Therefore, variations in ink discharge performance are reduced and the inkjet head is provided with excellent durability.

A ninth embodiment of the present invention is directed to an inkjet head including: a piezoelectric element including a first electrode film, a layered piezoelectric film including a first thin piezoelectric film and a second thin piezoelectric film and a second electrode film stacked in this order; a diaphragm layer disposed on the first electrode film side surface of the piezoelectric element; and a pressure chamber member including a pressure chamber for containing ink which is bonded to the surface of the diaphragm layer opposite to the first electrode film, such that the ink in the pressure chamber is discharged out by displacing the diaphragm layer in the thickness direction by the piezoelectric effect of the layered piezoelectric film.

The piezoelectric element included in the inkjet head is the one according to the first embodiment of the present invention. Specifically, the layered piezoelectric film is made of rhombohedral or tetragonal perovskite oxide having preferred orientation along the (111) plane, the first and second thin piezoelectric films are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive.

According to the above features, the diaphragm layer, first electrode film, layered piezoelectric film and second electrode film are formed in this order on the pressure member chamber as a substrate by sputtering. As a result, an inkjet head having the same effect as the inkjet head of the eighth embodiment is obtained.

A tenth embodiment of the present invention is directed to an inkjet recording device including an inkjet head according to the eighth embodiment of the present invention and a relative movement mechanism for relatively moving the inkjet head and a recording medium, wherein recording is carried out by discharging the ink in the pressure chamber from a nozzle hole communicating with the pressure chamber onto the recording medium while the inkjet head and the recording medium are relatively moved by the relative movement mechanism.

An eleventh embodiment of the present invention is directed to an inkjet recording device including an inkjet head according to the ninth embodiment of the present invention and a relative movement mechanism for relatively moving the inkjet head and a recording medium, wherein recording is carried out by discharging the ink in the pressure chamber from a nozzle hole communicating with the pressure chamber onto the recording medium while the inkjet head and the recording medium are relatively moved by the relative movement mechanism.

According to the tenth and eleventh embodiments, an inkjet recording device having excellent printing performance and durability is easily obtained.

A twelfth embodiment of the present invention is directed to an angular velocity sensor including: a substrate including a stationary part and at least a pair of vibrating parts extending in a certain direction from the stationary part; a piezoelectric element including a first electrode film, a layered piezoelectric film including a first thin piezoelectric film and a second thin piezoelectric film and a second electrode film stacked in this order at least on the vibrating parts of the substrate; and the second electrode film on each of the vibrating parts is patterned into at least one drive electrode for vibrating the vibrating parts in the width direction and at least one detection electrode for detecting deformation of the vibrating parts in the thickness direction.

The piezoelectric element included in the angular velocity sensor is the one according to the first embodiment of the present invention. Specifically, the layered piezoelectric film is made of rhombohedral or tetragonal perovskite oxide having preferred orientation along the (111) plane, the first and second thin piezoelectric films are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive.

When a voltage is applied between the drive electrode of the second electrode film and the first electrode film, the vibrating parts of the substrate are vibrated in the width direction thereof. In the vibrating state, when the vibrating parts are deformed in the thickness direction by Coriolis force, a voltage is generated between the detection electrode of the second electrode film and the first electrode film. From the magnitude of the voltage (Coriolis force), the angular velocity is determined. Further, since the parts for detecting the angular velocity (vibrating parts) are provided using the same piezoelectric element as the one according to the first embodiment of the present invention, the piezoelectric constant becomes about 40 times larger than that of a conventional angular velocity sensor using quartz and the size of the angular velocity sensor is significantly reduced.

Even if the angular velocity sensor is put into mass production, angular velocity sensors having excellent resistance to voltage and reliability are obtained with a high degree of property repeatability and reduced property variations.

Further, since the layered piezoelectric film is oriented along the (111) plane which is the polarization axis, the layered piezoelectric film is hardly influenced by the expansion coefficient of the substrate.

According to a thirteenth embodiment of the present invention related to the twelfth embodiment, the columnar grains of the first thin piezoelectric film have an average cross-sectional diameter of 40 nm to 70 nm inclusive and a length of 5 nm to 100 nm inclusive.

According to a fourteenth embodiment of the present invention related to the twelfth embodiment, the columnar grains of the second thin piezoelectric film have an average cross-sectional diameter of 60 nm to 200 nm inclusive and a length of 2500 nm to 5000 nm inclusive.

According to the thirteenth and fourteenth embodiments, the layered piezoelectric film is provided with high piezoelectric property and the sensor is improved in sensitivity and reduced in size.

According to a fifteenth embodiment of the present invention related to the twelfth embodiment, the first and second thin piezoelectric films are made of oxide based on perovskite lead zirconate titanate, the degree of (111) crystal orientation of the first thin piezoelectric film is 50% to 80% inclusive and the degree of (111) crystal orientation of the second thin piezoelectric film is 95% to 100% inclusive.

According to the features, the layered piezoelectric film is provided with high piezoelectric property, while variations in piezoelectric property are reduced and the reliability improves.

According to a sixteenth embodiment of the present invention related to the twelfth embodiment, the chemical composition ratio of the layered piezoelectric film is represented as [Pb]:[Zr]:[Ti]=(1+a):b:(1−b), the first and second thin piezoelectric films have the same value b of 0.40 to 0.60 inclusive, the first thin piezoelectric film has a larger Pb content than the second thin piezoelectric film, the first thin piezoelectric film has the value a of 0.05 to 0.15 inclusive and the second thin piezoelectric film has the value a of 0 to 0.10 inclusive.

If lead zirconate titanate is used as the layered piezoelectric film and the zirconium content therein is set to 40 mol % to 60 mol % inclusive, the layered piezoelectric film is provided with high piezoelectric property. Further, if the lead content is set to exceed the stoichiometric composition by an amount more than 0 and not more than 15 mol %, the crystallinity of the layered piezoelectric film increases, thereby achieving a large piezoelectric constant. Moreover, if the excess amount of lead is not more than 15 mol %, resistance to voltage improves, thereby achieving a high performance piezoelectric element.

According to the seventeenth embodiment of the present invention related to the twelfth embodiment, the layered piezoelectric film is made of lead zirconate titanate added with at least one of magnesium and manganese in an amount of more than 0 and not more than 10 mol %.

Therefore, the crystallinity of the layered piezoelectric film increases, thereby improving the piezoelectric property to a higher degree.

According to an eighteenth embodiment of the present invention related to the twelfth embodiment, the first electrode film is made of noble metal of Pt, Ir, Pd or Ru or an alloy containing the noble metal and is an aggregate of columnar grains having an average cross-sectional diameter of 20 nm to 30 nm inclusive.

According to the features, the first electrode film becomes surely endurable against temperature for sputtering for forming the films of the piezoelectric element. Further, by controlling the average cross-sectional diameter of the first electrode film, adhesion to the substrate improves and the film is surely prevented from falling off during the manufacture of the piezoelectric element.

According to a nineteenth embodiment of the present invention related to the twelfth embodiment, the substrate is made of Si.

This feature achieves reduction in manufacturing cost.

A twentieth embodiment of the present invention is directed to a method for manufacturing a piezoelectric element.

The method includes the steps of: forming a first electrode film on a substrate by sputtering; forming a first thin piezoelectric film and a second thin piezoelectric film made of rhombohedral or tetragonal perovskite oxide successively on the first electrode film by sputtering to provide a layered piezoelectric film; and forming a second electrode film on the layered piezoelectric film, wherein the step of forming the layered piezoelectric film includes the step of providing the layered piezoelectric film with preferred orientation along the (111) plane.

This method makes it possible to easily manufacture a piezoelectric element having the same effect as the one according to the first embodiment of the present invention.

A twenty-first embodiment of the present invention is directed to a method for manufacturing an inkjet head.

The method includes the steps of: forming a first electrode film on a substrate by sputtering; forming a first thin piezoelectric film and a second thin piezoelectric film made of rhombohedral or tetragonal perovskite oxide successively on the first electrode film by sputtering to provide a layered piezoelectric film; forming a second electrode film on the layered piezoelectric film; forming a diaphragm layer on the second electrode film; bonding a pressure chamber member for providing a pressure chamber to the surface of the diaphragm layer opposite to the second electrode film; and removing the substrate after the bonding step, wherein the step of forming the layered piezoelectric film includes the step of providing the layered piezoelectric film with preferred orientation along the (111) plane.

This method makes it possible to easily manufacture an inkjet head having the same effect as the one according to the eighth embodiment of the present invention.

A twenty-second embodiment of the present invention is directed to a method for manufacturing an inkjet head.

The method includes the steps of: forming a diaphragm layer on a pressure chamber substrate for providing a pressure chamber; forming a first electrode film on the diaphragm layer by sputtering; forming a first thin piezoelectric film and a second thin piezoelectric film made of rhombohedral or tetragonal perovskite oxide successively on the first electrode film by sputtering to provide a layered piezoelectric film; forming a second electrode film on the layered piezoelectric film; and forming a pressure chamber in the pressure chamber substrate; wherein the step of forming the layered piezoelectric film includes the step of providing the layered piezoelectric film with preferred orientation along the (111) plane.

This method makes it possible to easily manufacture an inkjet head having the same effect as the one according to the ninth embodiment of the present invention.

A twenty-third embodiment of the present invention is directed to a method for manufacturing an angular velocity sensor.

The method includes the steps of: forming a first electrode film on a substrate by sputtering; forming a first thin piezoelectric film and a second thin piezoelectric film made of rhombohedral or tetragonal perovskite oxide successively on the first electrode film by sputtering to provide a layered piezoelectric film; forming a second electrode film on the layered piezoelectric film; patterning the second electrode film into a drive electrode and a detection electrode; patterning the layered piezoelectric film and the first electrode film; and patterning the substrate to provide a stationary part and a vibrating part, wherein the step of forming the layered piezoelectric film includes the step of providing the layered piezoelectric film with preferred orientation along the (111) plane.

This method makes it possible to easily manufacture an angular velocity sensor having the same effect as the one according to the twelfth embodiment of the present invention.

In order to achieve the above-described object, from another aspect of the present invention, an orientation control film is formed on an electrode film made of noble metal and a two-layered piezoelectric film is formed on the orientation film. At this time, an orientation control film having preferred orientation along the (111) plane is formed first and then a two-layered piezoelectric film is formed thereon to provide a layered piezoelectric film having a high degree of (111) orientation.

Specifically, according to a twenty-fourth embodiment of the present invention related to the first embodiment, a piezoelectric element further includes an orientation control film disposed between the first electrode film and the first thin piezoelectric film, wherein the orientation control film is made of cubic or tetragonal perovskite oxide having preferred orientation along the (111) plane.

That is, the twenty-fourth embodiment is directed to a piezoelectric element including a first electrode film, an orientation control film provided on the first electrode film, a layered piezoelectric film including a first thin piezoelectric film provided on the orientation control film and a second thin piezoelectric film provided on the first thin piezoelectric film and a second electrode film provided on the layered piezoelectric film. The orientation control film is made of cubic or tetragonal perovskite oxide having (111) preferred orientation. The layered piezoelectric film is made of rhombohedral or tetragonal perovskite oxide having preferred orientation along the (111) plane. The first and second thin piezoelectric films are aggregates of columnar grains, respectively, which are continuously linked to each other. The columnar grains of the second thin piezoelectric film have a larger average cross-sectional diameter than the columnar grains of the first thin piezoelectric film. Further, the ratio of the thickness of the layered piezoelectric film to the average cross-sectional diameter of the columnar grains of the second thin piezoelectric film is 20 to 60 inclusive.

Since the orientation control film made of cubic or tetragonal perovskite oxide having (111) preferred orientation is formed on the first electrode, the layered piezoelectric film made of rhombohedral or tetragonal oxide formed on the orientation control film is provided with the same (111) preferred orientation. As a result, variations in piezoelectric property are reduced and the piezoelectric element improves in reliability. Specifically, for use of the piezoelectric element, an electric field is applied in the direction perpendicular to the surface of the layered piezoelectric film. Therefore, especially in a PZT film having a rhombohedral perovskite structure, the (111) polarization axis direction becomes parallel to the direction of the electric field due to the (111) orientation, thereby achieving high piezoelectric property. Further, since rotation of the polarization does not occur upon application of the electric field, variations in piezoelectric property are reduced even if the applied voltage is low, and therefore the reliability improves.

On the other hand, in a PZT film having a tetragonal perovskite structure, the polarization axis is oriented along the (001) direction. Therefore, the polarization axis direction and the electric field direction form an angle of about 54° owing to the (111) orientation. If the (111) orientation is enhanced, the polarization axis is maintained at a certain angle with respect to the electric field direction. Therefore, also in this case, rotation of the polarization does not occur upon application of the electric field. As a result, variations in piezoelectric property are reduced and the reliability improves (for example, in an unoriented PZT film, polarization axes which are specific crystallographic axes are oriented toward various directions. Therefore, when an electric field is applied, each of the polarization axes is oriented parallel to the electric field. As a result, the piezoelectric property becomes highly dependent on voltage and variations in piezoelectric property will be significant when the applied voltage is low. Further, if the voltage application is repeated, the reliability may be impaired by change with time.)

Further, since the first and second thin piezoelectric films of the layered piezoelectric film are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive, the layered piezoelectric film is provided with a significantly large piezoelectric constant. Further, even when the piezoelectric element is driven at a high voltage to obtain large actuator displacement, the film is prevented from falling off.

The layered piezoelectric film having excellent orientation is easily obtained even if an expensive monocrystalline MgO substrate is not used. Therefore, manufacturing cost is reduced by using an inexpensive substrate made of glass, metal, ceramic, Si or other material.

Moreover, even if the intended thickness of the layered piezoelectric film is 1 µm or more, it is not necessary to repeat the same deposition step many times as required in the sol-gel method. The layered piezoelectric film is easily achieved by sputtering and reduction of yield is prevented.

As described above, the piezoelectric element having (111) orientation is easily obtained. Since the PZT film is prone to be oriented along the (111) plane, flexibility in film formation increases, variations in piezoelectric property are reduced and the yield improves easily. Further, since the degree of (111) orientation is high, the piezoelectric element shows high piezoelectric property and low dependence on voltage.

According to a twenty-fifth embodiment of the present invention related to the twenty-fourth embodiment, the columnar grains of the first thin piezoelectric film have an average cross-sectional diameter of 40 nm to 70 nm inclusive and a length of 5 nm to 100 nm inclusive.

According to a twenty-sixth embodiment of the present invention related to the twenty-fourth embodiment, the columnar grains of the second piezoelectric film have an average cross-sectional diameter of 60 nm to 200 nm inclusive and a length of 2500 nm to 5000 nm inclusive.

According to the twenty-fifth and twenty-sixth embodiments, the layered piezoelectric film is provided with high piezoelectric property. Even if the piezoelectric element is driven at a high voltage to obtain large actuator displacement, the film is prevented from falling off.

According to a twenty-seventh embodiment of the present invention related to the twenty-fourth embodiment, the first and second thin piezoelectric films are made of oxide based on perovskite lead zirconate titanate, the degree of (111) crystal orientation of the first thin piezoelectric film is 50% to 80% inclusive and the degree of (111) crystal orientation of the second thin piezoelectric film is 95% to 100% inclusive.

According to the features, the layered piezoelectric film is provided with high piezoelectric property, while variations in piezoelectric property are reduced and the reliability improves.

According to a twenty-eighth embodiment of the present invention related to the twenty-fourth embodiment, the chemical composition ratio of the layered piezoelectric film is represented as $[Pb]:[Zr]:[Ti]=(1+a):b:(1-b)$, the first and second thin piezoelectric films have the same value b of 0.40 to 0.60 inclusive, the first thin piezoelectric film has a larger Pb content than the second thin piezoelectric film, the first thin piezoelectric film has the value a of 0.05 to 0.15 inclusive and the second thin piezoelectric film has the value a of 0 to 0.10 inclusive.

If lead zirconate titanate is used as the layered piezoelectric film and the zirconium content therein is set to 40 mol % to 60 mol % inclusive, the layered piezoelectric film is provided with high piezoelectric property. Further, if the lead content is set to exceed the stoichiometric composition by an amount more than 0 and not more than 15 mol %, the crystallinity of the layered piezoelectric film increases, thereby achieving a large piezoelectric constant. Moreover, if the excess amount of lead is not more than 15 mol %, resistance to voltage improves, thereby achieving a high performance piezoelectric element.

According to a twenty-ninth embodiment of the present invention related to the twenty-fourth embodiment, the orientation control film is made of oxide based on perovskite lead lanthanum zirconate titanate and the degree of (111) crystal orientation of the orientation control film is 50% or more.

According to a thirtieth embodiment of the present invention related to the twenty-fourth embodiment, the chemical composition ratio of the orientation control film is represented as $[Pb]:[La]:[Zr]:[Ti]=x\times(1-z):z:y:(1-y)$, the value x is 1.0 to 1.20 inclusive, the value y is 0 to 0.20 inclusive and the value z is more than 0 and not more than 0.30.

With use of lead lanthanum zirconate titanate (PLZT, including the one free from zirconium, i.e., lead lanthanum titanate (PLT)) as the orientation control film, the orientation control film is more easily oriented along the (111) plane, thereby improving the orientation of the layered piezoelectric film. If the zirconium content is set to 20 mol % or less, a low crystalline Zr oxide layer is less likely to be formed in the early stage of the crystal growth. Further, if the lead content is set to exceed the stoichiometric composition by an amount more than 0 and not more than 20 mol %, the crystallinity of the orientation control film is surely prevented from decreasing, thereby improving the crystallinity of the layered piezoelectric film to be formed thereon. Thus, the crystallinity and the orientation of the layered piezoelectric film are surely improved, thereby improving the piezoelectric property to a higher degree.

According to a thirty-first embodiment of the present invention related to the twenty-fourth embodiment, the orientation control film is made of lead lanthanum zirconate titanate added with at least one of magnesium and manganese in an amount of more than 0 and not more than 10 mol %.

According to a thirty-second embodiment of the present invention related to the twenty-fourth embodiment, the layered piezoelectric film is made of lead zirconate titanate added with at least one of magnesium and manganese in an amount of more than 0 and not more than 10 mol %.

According to the thirty-first and thirty-second embodiments, both the orientation control film and the layered piezoelectric film increase in crystallinity, thereby improving the piezoelectric property to a higher degree.

According to a thirty-third embodiment according to the present invention related to the twenty-fourth embodiment, the first electrode film is made of noble metal of Pt, Ir, Pd or Ru or an alloy containing the noble metal and is an aggregate of columnar grains having an average cross-sectional diameter of 20 nm to 30 nm inclusive.

According to the features, the first electrode film becomes surely endurable against temperature for sputtering for forming the films of the piezoelectric element. Further, by controlling the average cross-sectional diameter of the first electrode film, adhesion to the substrate improves and the film is surely prevented from falling off during the manufacture of the piezoelectric element.

A thirty-fourth embodiment of the present invention is directed to an inkjet head including: a piezoelectric element including a first electrode film, an orientation control film, a layered piezoelectric film including a first thin piezoelectric film and a second thin piezoelectric film and a second electrode film stacked in this order; a diaphragm layer disposed on the second electrode film side surface of the piezoelectric element; and a pressure chamber member including a pressure chamber for containing ink which is bonded to the surface of the diaphragm layer opposite to the second electrode film, such that the ink in the pressure chamber is discharged out by displacing the diaphragm layer in the thickness direction by the piezoelectric effect of the layered piezoelectric film.

The piezoelectric element used in the inkjet head is the one according to the twenty-fourth embodiment of the present invention. Specifically, the orientation control film is made of cubic or tetragonal perovskite oxide having (111) preferred orientation, the layered piezoelectric film is made of rhombohedral or tetragonal perovskite oxide having preferred orientation along the (111) plane, the first and second thin piezoelectric films are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive.

According to the above features, the first electrode film, orientation control film, layered piezoelectric film, second electrode film and diaphragm layer are formed in this order on the substrate by sputtering and then the substrate is removed after the pressure chamber member is bonded to the diaphragm layer. As a result, an inkjet head including the same piezoelectric element as that of the twenty-fourth embodiment is obtained. Further, the degree of (111) orientation of the second thin piezoelectric film of the piezoelectric element reaches 95% or more. Therefore, variations in ink discharge performance are reduced and the inkjet head is provided with excellent durability.

A thirty-fifth embodiment of the present invention is directed to an inkjet head including a piezoelectric element including a first electrode film, an orientation control film, a layered piezoelectric film including a first thin piezoelectric film and a second thin piezoelectric film and a second electrode film stacked in this order; a diaphragm layer disposed on the first electrode film side surface of the piezoelectric element; and a pressure chamber member including a pressure chamber for containing ink which is bonded to the surface of the diaphragm layer opposite to the first electrode film, such that the ink in the pressure chamber is discharged out by displacing the diaphragm layer in the thickness direction by the piezoelectric effect of the layered piezoelectric film.

The piezoelectric element is the one according to the twenty-fourth embodiment of the present invention. Specifically, the orientation control film is made of cubic or tetragonal perovskite oxide having (111) preferred orientation, the layered piezoelectric film is made of rhombohedral or tetragonal perovskite oxide having preferred orientation along the (111) plane, the first and second thin piezoelectric films are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive.

According to the above features, the diaphragm layer, first electrode film, orientation control film, layered piezoelectric film and second electrode film are formed in this order on the pressure chamber member as the substrate by sputtering. Thus, an inkjet head having the same effect as the inkjet head of the thirty-fourth embodiment is obtained.

A thirty-sixth embodiment of the present invention is directed to an inkjet recording device including an inkjet head and a relative movement mechanism for relatively moving the inkjet head and a recording medium, wherein recording is carried out by discharging the ink in the pressure chamber from a nozzle hole communicating with the pressure chamber onto the recording medium while the inkjet head and the recording medium are relatively moved by the relative movement mechanism.

The inkjet head is the one according to the thirty-fourth embodiment of the present invention.

A thirty-seventh embodiment of the present invention is directed to an inkjet recording device including an inkjet head and a relative movement mechanism for relatively moving the inkjet head and a recording medium, wherein recording is carried out by discharging the ink in the pressure chamber from a nozzle hole communicating with the pressure chamber onto the recording medium while the inkjet head and the recording medium are relatively moved by the relative movement mechanism.

The inkjet head is the one according to the thirty-fifth embodiment of the present invention.

According to the thirty-six and thirty-seventh embodiments, an inkjet recording device having excellent printing performance and durability is easily obtained.

A thirty-eighth embodiment of the present invention is directed to an angular velocity sensor including: a substrate including a stationary part and at least a pair of vibrating parts extending in a certain direction from the stationary part; a piezoelectric element including a first electrode film, an orientation control film, a layered piezoelectric film including a first thin piezoelectric film and a second thin piezoelectric film and a second electrode film stacked in this order at least on the vibrating parts of the substrate; and the second electrode film on each of the vibrating parts is patterned into at least one drive electrode for vibrating the vibrating parts in the width direction and at least one detection electrode for detecting deformation of the vibrating parts in the thickness direction.

The piezoelectric element is the one according to the twenty-fourth embodiment of the present invention. Specifically, the orientation control film is made of cubic or tetragonal perovskite oxide having (111) preferred orientation, the layered piezoelectric film is made of rhombohedral or tetragonal perovskite oxide having preferred orientation along the (111) plane, the first and second thin piezoelectric films are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive.

When a voltage is applied between the drive electrode of the second electrode film and the first electrode film, the vibrating parts of the substrate are vibrated in the width direction thereof. In the vibrating state, when the vibrating parts are deformed in the thickness direction by Coriolis force, a voltage is generated between the detection electrode of the second electrode film and the first electrode film. From the magnitude of the voltage (Coriolis force), the angular velocity is determined. Further, since the parts for detecting the angular velocity (vibrating parts) are provided using the same piezoelectric element as the one according to the first embodiment of the present invention, the piezoelectric constant becomes about 40 times larger than that of a conventional angular velocity sensor using quartz and the size of the angular velocity sensor is significantly reduced.

Even if the angular velocity sensor is put into mass production, angular velocity sensors having excellent resistance to voltage and reliability are obtained with a high degree of property repeatability and reduced property variations.

Further, since the layered piezoelectric film is oriented along the (111) plane which is the polarization axis, the layered piezoelectric film is hardly influenced by the expansion coefficient of the substrate.

According to a thirty-ninth embodiment of the present invention related to the thirty-eighth embodiment, the columnar grains of the first thin piezoelectric film have an average cross-sectional diameter of 40 nm to 70 nm inclusive and a length of 5 nm to 100 nm inclusive.

According to a fortieth embodiment of the present invention related to the thirty-eighth embodiment, the columnar grains of the second piezoelectric film have an average cross-sectional diameter of 60 nm to 200 nm inclusive and a length of 2500 nm to 5000 nm inclusive.

According to the thirty-ninth and fortieth embodiments of the present invention, the layered piezoelectric film is provided with high piezoelectric property. Further, the sensor improves in sensitivity and reduced in size.

According to a forty-first embodiment of the present invention related to the thirty-eighth embodiment, the first and second thin piezoelectric films are made of oxide based on perovskite lead zirconate titanate, the degree of (111) crystal orientation of the first thin piezoelectric film is 50% to 80% inclusive and the degree of (111) crystal orientation of the second thin piezoelectric film is 95% to 100% inclusive.

According to the features, the layered piezoelectric film is provided with high piezoelectric property. Further, variations in piezoelectric property are reduced and the reliability improves.

According to a forty-second embodiment of the present invention related to the thirty-eighth embodiment, the chemical composition ratio of the layered piezoelectric film is represented as $[Pb]:[Zr]:[Ti]=(1+a):b:(1-b)$, the first and second thin piezoelectric films have the same value b of 0.40 to 0.60 inclusive, the first thin piezoelectric film has a larger Pb content than the second thin piezoelectric film, the first thin piezoelectric film has the value a of 0.05 to 0.15 inclusive and the second thin piezoelectric film has the value a of 0 to 0.10 inclusive.

If lead zirconate titanate is used as the layered piezoelectric film and the zirconium content therein is set to 40 mol % to 60 mol % inclusive, the layered piezoelectric film is provided with high piezoelectric property. Further, if the lead content is set to exceed the stoichiometric composition by an amount more than 0 and not more than 15 mol %, the crystallinity of the layered piezoelectric film increases, thereby achieving a large piezoelectric constant. Moreover, if the excess amount of lead is not more than 15 mol %, resistance to voltage improves, thereby achieving a high performance piezoelectric element.

According to a forty-third embodiment of the present invention related to the thirty-eighth embodiment, the orientation control film is made of oxide based on perovskite lead lanthanum zirconate titanate and the degree of (111) crystal orientation of the orientation control film is 50% or more.

According to a forty-fourth embodiment of the present invention related to the thirty-eighth embodiment, the chemical composition ratio of the orientation control film is represented as $[Pb]:[La]:[Zr]:[Ti]=x\times(1-z):z:y:(1-y)$, the value x is 1.0 to 1.20 inclusive, the value y is 0 to 0.20 inclusive and the value z is more than 0 and not more than 0.30.

According to the forty-third and forty-fourth embodiments, with use of lead lanthanum zirconate titanate (PLZT, including the one free from zirconium, i.e., lead lanthanum titanate (PLT)) as the orientation control film, the same effect as that of the twenty-ninth and thirtieth embodiments is obtained.

According to a forty-fifth embodiment of the present invention related to the thirty-eighth embodiment, the orientation control film is made of lead lanthanum zirconate titanate added with at least one of magnesium and manganese in an amount of more than 0 and not more than 10 mol %.

According to a forty-sixth embodiment of the present invention related to the thirty-eighth embodiment, the layered piezoelectric film is made of lead zirconate titanate added with at least one of magnesium and manganese in an amount of more than 0 and not more than 10 mol %.

According to the forty-fifth and forty-sixth embodiments, the orientation control film and the layered piezoelectric film increase in crystallinity, thereby improving the piezoelectric property to a higher degree.

According to a forty-seventh embodiment of the present invention related to the thirty-eighth embodiment, the first electrode film is made of noble metal of Pt, Ir, Pd or Ru or an alloy containing the noble metal and is an aggregate of columnar grains having an average cross-sectional diameter of 20 nm to 30 nm inclusive.

According to the features, the first electrode film becomes surely endurable against temperature for sputtering for forming the films of the piezoelectric element. Further, by controlling the average cross-sectional diameter of the first electrode film, adhesion to the substrate improves and the film is surely prevented from falling off during the manufacture of the piezoelectric element.

According to a forty-eighth embodiment of the present invention related to the thirty-eighth embodiment, the substrate is made of Si.

This feature achieves reduction in manufacturing cost.

A forty-ninth embodiment of the present invention is directed to a method for manufacturing a piezoelectric element.

The method includes the steps of: forming a first electrode film on a substrate by sputtering; forming an orientation control film made of cubic or tetragonal perovskite oxide on the first electrode film by sputtering; forming a first thin piezoelectric film and a second thin piezoelectric film made of rhombohedral or tetragonal perovskite oxide successively on the orientation control film by sputtering to provide a layered piezoelectric film; forming a second electrode film on the layered piezoelectric film, wherein the step of forming the orientation control film includes the step of providing the orientation control film with preferred orientation along the (111) plane and the step of forming the layered piezoelectric film includes the step of providing the layered piezoelectric film with preferred orientation along the (111) plane by the orientation control film.

This method makes it possible to easily manufacture a piezoelectric element having the same effect as the one according to the twenty-fourth embodiment of the present invention.

A fiftieth embodiment of the present invention is directed to a method for manufacturing an inkjet head.

The method includes the steps of: forming a first electrode film on a substrate by sputtering; forming an orientation control film made of cubic or tetragonal perovskite oxide on the first electrode film by sputtering; forming a first thin piezoelectric film and a second thin piezoelectric film made of rhombohedral or tetragonal perovskite oxide successively on the orientation control film by sputtering to provide a layered piezoelectric film; forming a second electrode film on the layered piezoelectric film; forming a diaphragm layer on the second electrode film; bonding a pressure chamber member for providing a pressure chamber to the surface of the diaphragm layer opposite to the second electrode film; and removing the substrate after the bonding step, wherein the step of forming the orientation control film includes the step of providing the orientation control film with preferred orientation along the (111) plane and the step of forming the layered piezoelectric film includes the step of providing the layered piezoelectric film with preferred orientation along the (111) plane by the orientation control film.

This method makes it possible to easily manufacture an inkjet head having the same effect as the one according to the thirty-fourth embodiment.

A fifty-first embodiment of the present invention is directed to a method for manufacturing an inkjet head. The method includes the steps of: forming a diaphragm layer on a pressure chamber substrate for providing a pressure chamber; forming a first electrode film on the diaphragm layer by sputtering; forming an orientation control film made of cubic or tetragonal perovskite oxide on the first electrode film by sputtering; forming a first thin piezoelectric film and a second thin piezoelectric film made of rhombohedral or tetragonal perovskite oxide successively on the orientation control film by sputtering to provide a layered piezoelectric film; forming a second electrode film on the layered piezoelectric film; and forming a pressure chamber in the pressure chamber substrate; wherein the step of forming the orientation control film includes the step of providing the orientation control film with preferred orientation along the (111) plane and the step of forming the layered piezoelectric film includes the step of providing the layered piezoelectric film with preferred orientation along the (111) plane by the orientation control film.

This method makes it possible to easily manufacture an inkjet head having the same effect as the one according to the thirty-fifth embodiment.

A fifty-second embodiment of the present invention is directed to a method for manufacturing an angular velocity sensor.

The method includes the steps of: forming a first electrode film on a substrate by sputtering; forming an orientation control film made of cubic or tetragonal perovskite oxide on the first electrode film by sputtering; forming a first thin piezoelectric film and a second thin piezoelectric film made of rhombohedral or tetragonal perovskite oxide successively on the orientation control film by sputtering to provide a layered piezoelectric film; forming a second electrode film on the layered piezoelectric film; patterning the second electrode film into a drive electrode and a detection electrode; patterning the layered piezoelectric film, the orientation control film and the first electrode film; and patterning the substrate to provide a stationary part and a vibrating part, wherein the step of forming the orientation control film includes the step of providing the orientation control film with preferred orientation along the (111) plane and the step of forming the layered piezoelectric film includes the step of providing the layered piezoelectric film with preferred orientation along the (111) plane by the orientation control film.

This method makes it possible to easily manufacture an angular velocity sensor having the same effect as the one according to the thirty-eighth embodiment.

Effect of the Invention

The piezoelectric element according to the present invention achieves high piezoelectric displacement property and high durability.

The method for manufacturing the piezoelectric element according to the present invention makes it possible to easily mass-produce the piezoelectric element having high piezoelectric displacement property and high durability. Therefore, even through mass production, piezoelectric elements having excellent resistance to voltage and durability are obtained with excellent repeatability of the piezoelectric property and less variations in piezoelectric property.

The inkjet head and the inkjet recording device according to the present invention reduce variations in ink discharge performance and achieve high durability.

The angular velocity sensor according to the present invention achieves downsizing and high dimensional precision. Even if the angular velocity sensor is put into mass production, angular velocity sensors having excellent resistance to voltage and durability are achieved with excellent repeatability of the property and less variations in property.

BRIEF DESCRIPTION OF DRAWINGS

FIGS. 2A to 2E are views illustrating the steps of a method for manufacturing the piezoelectric element according to Embodiment 1.

FIGS. 4A and 4B are electron micrographs showing an enlargement of the broken-out section of the layered piezoelectric film according to Example 1 of Embodiment 1.

FIGS. 9A to 9E are views illustrating some of the steps of a method for manufacturing an actuator component according to Example 6 of Embodiment 2.

FIGS. 10A to 10D are views illustrating some of the steps of a method for manufacturing the actuator component according to Example 6 of Embodiment 2.

FIGS. 13A to 13C are views illustrating some of the steps of a method for manufacturing the actuator component according to Example 7 of Embodiment 2.

FIGS. 17A to 17F are views illustrating the steps of a method for manufacturing the angular velocity sensor according to Embodiment 4.

FIGS. 21A to 21E are views illustrating the steps of a method for manufacturing a piezoelectric element according to Embodiment 5.

FIGS. 23A and 23B are electron micrographs of an enlargement of the broken-out section of a layered piezoelectric film according to Example 8 of Embodiment 5.

FIGS. 26A to 26E are views illustrating some of the steps of a method for manufacturing the actuator component according to Example 13 of Embodiment 6.

FIGS. 29A to 29D are views illustrating some of the steps of a method for manufacturing the actuator component according to Example 14 of Embodiment 6.

FIGS. 33A to 33F are views illustrating the steps of a method for manufacturing the angular velocity sensor according to Embodiment 8.

BEST MODE FOR CARRYING OUT THE INVENTION

Hereinafter, with reference to the drawings, preferred embodiments of the present invention will be explained in detail.

Embodiment 1

Figure 1:
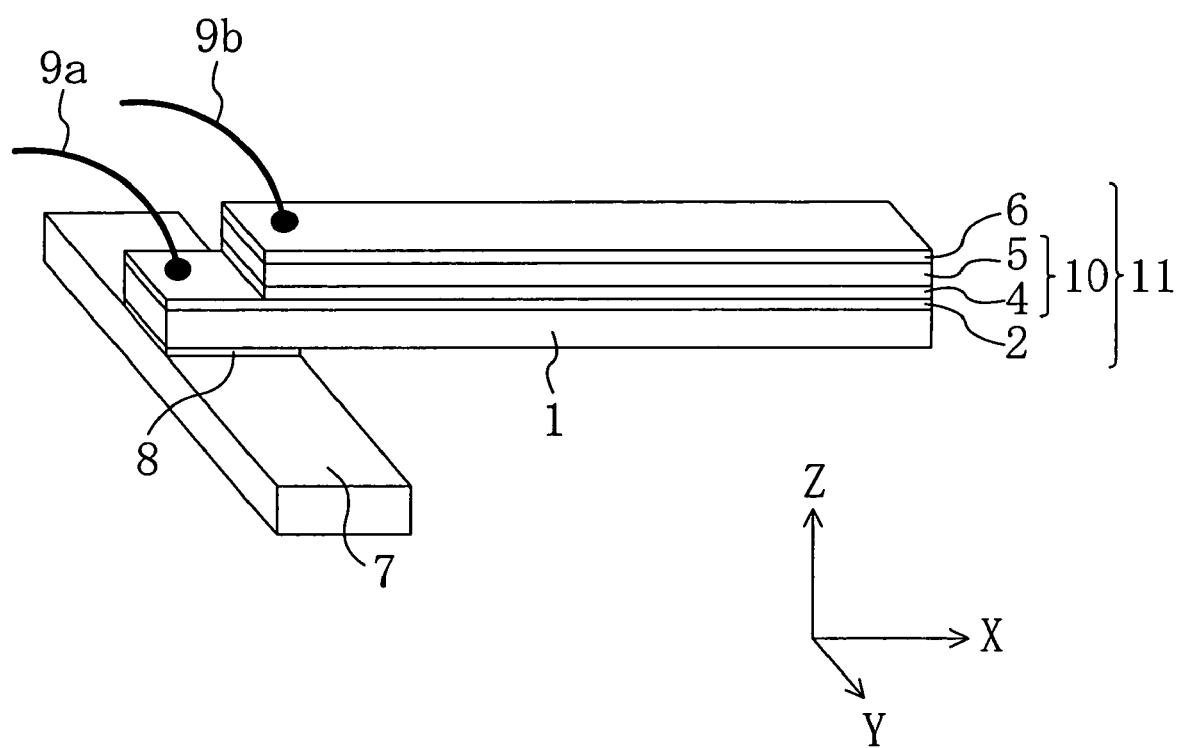
FIG. 1 is an oblique view illustrating a piezoelectric element according to Embodiment 1 of the present invention.

FIG. 1 is an oblique view illustrating a piezoelectric element 20 according to Embodiment 1 of the present invention. As shown in FIG. 1, the piezoelectric element 20 includes a substrate 1 which is in the form of a flat strip of 15.0 mm in length, 0.40 mm in thickness and 3.0 mm in width and a layered body 11 disposed on the substrate 1. The substrate 1 functions as a diaphragm which hinders expansion and contraction of the layered body 11 caused by the piezoelectric effect. The piezoelectric element 20 is 3.0 mm in width. An end portion of the piezoelectric element 20 having a width of 3.0 mm and a length of 3.0 mm (a left end portion in FIG. 1) is fixed onto a 1.0 mm thick support substrate 7 made of stainless steel (3.0 mm in width and 10.0 mm in length) with an epoxy-based adhesive 8. Thus, the piezoelectric element 20 is provided in the form of a cantilever.

A first electrode film 2 is provided on the substrate 1. On the surface of the first electrode film 2 except for an end portion thereof (a left end portion in FIG. 1), i.e., on part of the surface having a width of 3.0 mm and a length of 12.0 mm, a layered piezoelectric film 10 which is made of a thin oxide film based on perovskite lead zirconate titanate (hereinafter referred to as PZT) having (111) preferred crystal orientation is provided. The layered piezoelectric film 10 includes a first thin piezoelectric film 4 and a second thin piezoelectric film 5 formed on the first thin piezoelectric film 4. The crystal orientation of the second thin piezoelectric film 5 is controlled by the first thin piezoelectric film 4. A 100 nm thick second electrode film 6 is provided on the layered piezoelectric film 10. Gold leads 9a and 9b of 0.1 mm in thickness are connected to the first and second electrode films 2 and 6, respectively. As shown in FIG. 1, the layered body 11 includes the first electrode film 2, layered piezoelectric film 10 and second electrode film 6.

Hereinafter, an explanation of features of the present embodiment will be provided.

Figure 3:
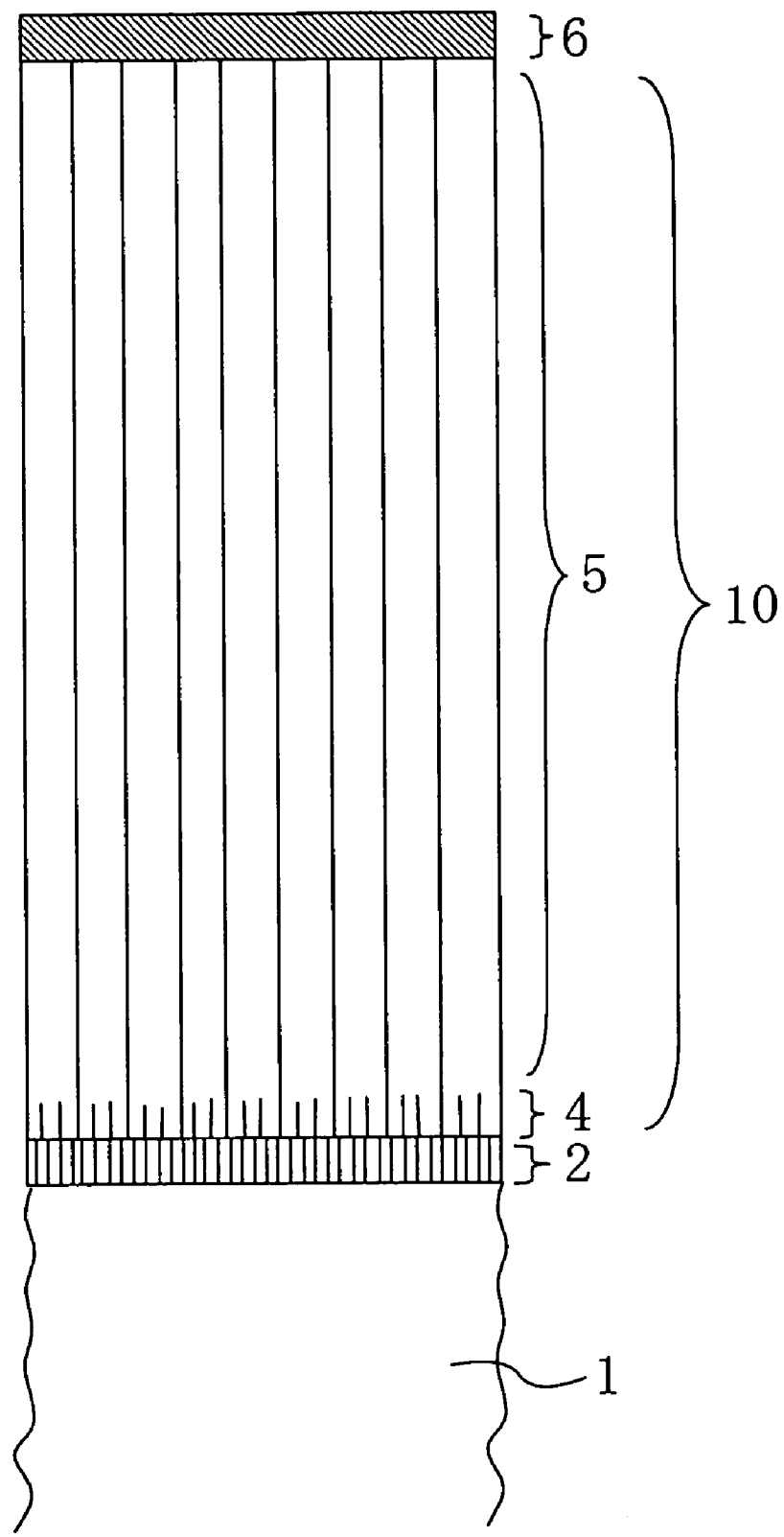
FIG. 3 is a view schematically illustrating the layered structure of a layered piezoelectric film according to Embodiment 1.

The layered piezoelectric film 10 is made of rhombohedral or tetragonal perovskite oxide having preferred orientation along the (111) plane. The first and second thin piezoelectric films 4 and 5 are aggregates of columnar grains, respectively, which are continuously linked to each other. (see FIG. 3). The columnar grains of the second thin piezoelectric film 5 have a larger average cross-sectional diameter (average grain size or average diameter) than the average cross-sectional diameter of the columnar grains of the first thin piezoelectric film 4. The ratio of the thickness of the layered piezoelectric film 10 with respect to the average cross-sectional diameter of the columnar grains of the second thin piezoelectric film 5 is 20 to 60 inclusive.

The columnar grains of the first thin piezoelectric film 4 preferably have an average cross-sectional diameter of 40 nm to 70 nm inclusive and a length of 5 nm to 100 m inclusive. The columnar grains of the second thin piezoelectric film 5 preferably have an average cross-sectional diameter of 60 nm to 200 nm inclusive and a length of 2500 nm to 5000 nm inclusive.

The first and second thin piezoelectric films 4 and 5 are preferably made of oxide based on perovskite lead zirconate titanate. The first thin piezoelectric film 4 preferably has the degree of (111) crystal orientation of 50% to 80% inclusive. The second thin piezoelectric film 5 preferably has the degree of (111) crystal orientation of 95% to 100% inclusive.

The chemical composition ratio of the layered piezoelectric film 10 is preferably represented as [Pb]:[Zr]:[Ti]=(1+a):b:(1−b). The first and second thin piezoelectric films 4 and 5 preferably have the same value b of 0.40 to 0.60 inclusive. The first thin piezoelectric film 4 preferably has a larger Pb content than the second thin piezoelectric film 5. The value a of the first thin piezoelectric film 4 is preferably 0.05 to 0.15 inclusive and the value a of the second thin piezoelectric film 5 is preferably 0 to 0.10 inclusive. The layered piezoelectric film 10 is preferably made of lead zirconate titanate added with at least one of magnesium and manganese. The addition amount is preferably more than 0 and not more than 10 mol %.

The first electrode film 2 is preferably made of noble metal such as Pt, Ir, Pd or Ru or an alloy containing the noble metal.

The first electrode film 2 is preferably an aggregate of columnar grains having an average cross-sectional diameter of 20 nm to 30 nm inclusive.

When a voltage is applied between the first and second electrode films 2 and 6 via the leads 9a and 9b, the layered piezoelectric film 10 elongates along the direction of X indicated in FIG. 1. Assuming that the applied voltage is E (V), the thickness of the layered piezoelectric film 10 is t (m), the length of the layered piezoelectric film 10 is L (m) and a piezoelectric constant of the layered piezoelectric film 10 is $d_{31}$ (pm/V), the amount of elongation ΔL (m) of the layered piezoelectric film 10 is obtained from the following formula:

$$\Delta L = d_{31} \times L \times E / t$$

Now, part of the layered piezoelectric film 10 closer to the second electrode film 6 (a top portion of the layered piezoelectric film 10 in FIG. 1) elongates in the X direction. On the other hand, part of the layered piezoelectric film 10 closer to the first electrode film 2 (a bottom portion of the layered piezoelectric film 10 in FIG. 1) is hindered from elongating in that direction by the substrate 1. As a result, the tip of the piezoelectric element 20 (the right end in FIG. 1) is displaced to the minus side in the direction of Z (toward the bottom in FIG. 1). Therefore, if the voltage application is carried out intermittently at a certain frequency, the tip of the piezoelectric element 20 makes up-and-down movement in the Z direction with a certain amount of displacement. The displacement property of the piezoelectric element 20 is evaluated by examining a relationship between the applied voltage and the amount of displacement of the up-and-down movement of the tip of the piezoelectric element 20 in the Z direction.

Hereinafter, referring to FIGS. 2A to 2E, a method for manufacturing the piezoelectric element 20 is described.

FIGS. 2A to 2E are views illustrating the steps of a method for manufacturing the piezoelectric element. First, as shown in FIG. 2A, a first electrode film 102 is formed on a substrate 101 of 20 mm in length, 20 mm in width and 0.30 mm in thickness by RF magnetron sputtering described below using a 0.2 mm thick stainless steel mask having a rectangular opening of 5.0 mm in width and 18.0 mm in length.

Then, a layered piezoelectric film 110 is formed precisely on the first electrode film 102 by RF magnetron sputtering using a 0.2 mm thick stainless steel mask having a rectangular opening of 5.0 mm in width and 12.0 mm in length. The layered piezoelectric film 110 is provided by forming a first thin piezoelectric film 104 on the first electrode film 102 by RF magnetron sputtering using a sintered PZT-based oxide target and forming a second thin piezoelectric film 105 on the first thin piezoelectric film 104 by RF magnetron sputtering in the same manner using the same target under different sputtering conditions. The structure of the layered piezoelectric film 110 is the same as the schematic structure of the layered piezoelectric film 110 shown in FIG. 3. The step of forming the layered piezoelectric film 110 includes the step of providing the layered piezoelectric film 110 with (111) preferred orientation.

Then, a second electrode film 106 is formed precisely on the layered piezoelectric film 110 by RF sputtering in the same manner as described above using the same stainless steel mask. Thus, a structure 121 including the substrate 101 and a layered body 111 is obtained as shown in FIG. 2B.

Then, as shown in FIG. 2C, the structure 121 is precisely cut into a strip of 3.0 mm in width and 15.0 mm in length with a dicing saw such that an end portion of the first electrode film 2 (a left end portion in FIG. 2C) is left exposed. As a result, a piezoelectric element component 22 including a substrate 1, a first electrode film 2, a first thin piezoelectric film 4, a second thin piezoelectric film 5 and a second electrode film 6 as shown in FIG. 1 is provided. Then, an end portion of the substrate 1 (a left end portion in FIG. 2D) is adhered onto a stainless steel support substrate 7 with an epoxy-based adhesive 8 as shown in FIG. 2D.

Subsequently, a lead 9a is connected to an end portion of the first electrode film 2 using a conductive adhesive made of silver paste and a lead 9b is connected to an end portion of the second electrode film 6 with wire bonding. Thus, the piezoelectric element 20 shown in FIG. 1 is provided.

Hereinafter, more specific embodiments of the present invention will be described.

EXAMPLE 1

Silicon was used as the substrate. A thin iridium (Ir) film having a thickness of 100 nm was used as the first electrode film. In order to form the thin iridium film, the substrate was preheated at 400° C. in a ternary RF magnetron sputtering apparatus. Then, sputtering was carried out using a gas mixture of argon and oxygen (gas volume ratio $Ar:O_2=15:1$) as sputtering gas at a total gas pressure maintained at 0.25 Pa and a 4-inch diameter iridium target as a first target under a high frequency power of 200 W for 960 seconds.

A layered piezoelectric film was provided by forming a first thin piezoelectric film which is made of a 50 nm thick PZT film having (111) preferred orientation and a second thin piezoelectric film which is formed on the first piezoelectric film and made of a 3400 nm thick PZT film having (111) orientation. That is, the thickness of the layered piezoelectric film was 3450 nm.

The first and second thin piezoelectric films were formed using a RF magnetron sputtering apparatus. As a target, a 6-inch diameter sintered PZT target having a stoichiometric composition prepared by excessively adding about 20 mol % of PbO was used (molar composition ratio Pb:Zr:Ti=1.20: 0.53:0.47). Conditions for the deposition were as follows. First, in a deposition chamber with the PZT target placed therein, the substrate on which the first electrode film had been formed was preheated at 580° C. Then, sputtering was carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 50 seconds to form a first thin piezoelectric film 104. Subsequently, the deposition was stopped and the mixing ratio of the sputtering gas was immediately changed to $Ar:O_2=79:1$. With the other conditions unchanged, a second thin piezoelectric film was formed by sputtering for 2900 seconds.

A thin platinum (Pt) film was used as the second electrode film. The thin platinum film was formed on the second thin piezoelectric film by RF sputtering.

In order to check the thickness, degree of (111) crystal orientation, composition and sectional structure of the first thin piezoelectric film shown in FIG. 2B with accuracy, a sample on which the deposition was terminated after the first thin piezoelectric film had been formed was also prepared. The surface of the sample was subjected to observation with a scanning electron microscope, X-ray diffraction analysis and composition analysis with an X-ray microanalyzer. After that, the sample was broken to observe the broken-out section with the scanning electron microscope.

Likewise, in order to check the thickness, degree of (111) crystal orientation, composition and sectional structure of the second thin piezoelectric film shown in FIG. 2B with accuracy, a sample on which the deposition was terminated after the second thin piezoelectric film had been formed was also prepared. The surface of the sample was subjected to observation with a scanning electron microscope, X-ray diffraction analysis and composition analysis with an X-ray microanalyzer. After that, the sample was broken to observe the broken-out section with the scanning electron microscope.

Further, using the structure shown in FIG. 2B as a sample, composition analysis of the layered piezoelectric film was carried out in the depth direction from the surface by Auger spectroscopic analysis. Moreover, the broken-out section of the layered piezoelectric film was also observed with the scanning electron microscope. FIG. 4A shows an enlargement of an electron micrograph of the broken-out section of the layered piezoelectric film and FIG. 4B shows a partially enlarged view of FIG. 4A.

As a result of the analyses and observations described above, the iridium electrode was found to be an aggregate of columnar grains having an average cross-sectional diameter of 30 nm. The first and second thin piezoelectric films were present as aggregates of columnar grains, respectively, and continuously linked to each other. The thickness of the first thin piezoelectric film (the length of the columnar grains) was 50 nm and the columnar grains had an average cross-sectional diameter of 40 nm. The thickness of the second thin piezoelectric film (the length of the columnar grains) was 3400 nm and the columnar grains had an average cross-sectional diameter of 100 nm. The ratio of the thickness of the layered piezoelectric film (the length of the columnar grains of the layered piezoelectric film) to the average cross-sectional diameter of the columnar grains of the second thin piezoelectric film was 34.5.

As a result of the X-ray diffraction analysis, both the first and second thin piezoelectric films were found to have the perovskite crystal structure. The degree of (111) crystal orientation on the surface of the first thin piezoelectric film was 60%, while the degree of (111) crystal orientation on the surface of the second thin piezoelectric film was 95%. The degree of (111) crystal orientation of a thin PZT-based piezoelectric film obtained from the reflection intensities at the crystal planes in an X-ray diffraction pattern is defined as a percentage of a (111) peak intensity to the sum of every peak intensity attributed to the thin film when the scope of the X-ray diffraction is an interstitial spacing of 4.2 Å to 1.5 Å. Specifically, the degree of crystal orientation is a percentage of a peak intensity attributed to the (111) plane to the sum of peak intensities at the (001), (100), (010), (110), (011), (101) and (111) planes appeared in the X-ray diffraction pattern of a thin lead lanthanum zirconate titanate (hereinafter referred to as PLZT) or a thin PZT film.

Further, as a result of composition analysis on cation using the X-ray microanalyzer, the first and second thin piezoelectric films were found to have the composition ratios of Pb:Zr:Ti=1.15:0.53:0.47 and Pb:Zr:Ti=1.10:0.53:0.47, respectively. Specifically, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film. In other words, the first and second thin piezoelectric films were aggregates of columnar grains which had grown along the thickness direction of the layered piezoelectric film.

Figure 5:
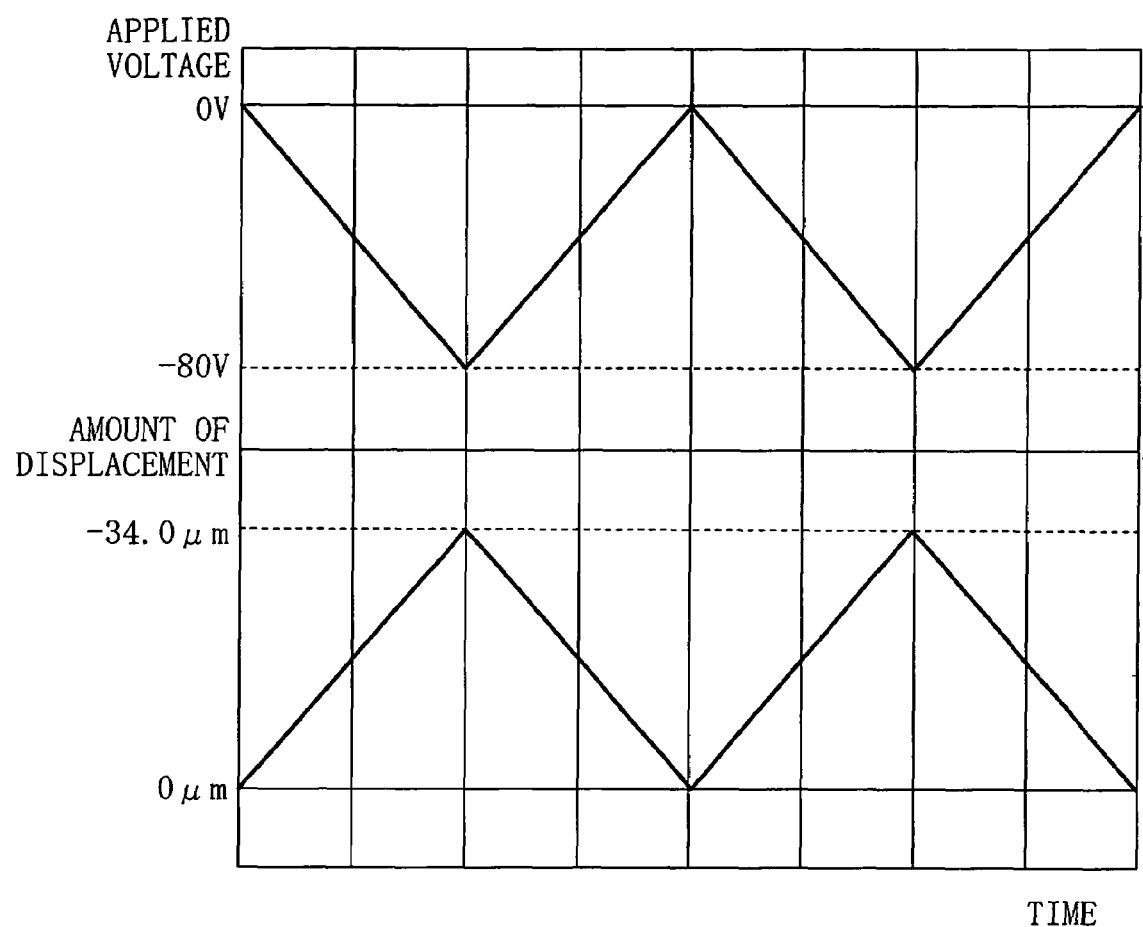
FIG. 5 is a graph illustrating the amount of displacement of up-and-down movement of the tip of the piezoelectric element of Example 1 of Embodiment 1 in the Z direction when a voltage at a frequency of 2 kHz is applied.

In order to measure the amount of displacement of the up-and-down movement of the tip of the piezoelectric element 20 in the Z direction using a laser Doppler vibrometer, a triangle wave voltage of 0 to −80 V was applied between the first and second electrode films 2 and 6 of the piezoelectric element 20 via the leads 9a and 9b. FIG. 5 is a graph illustrating the amount of displacement of the up-and-down movement of the tip of the piezoelectric element 20 in the Z direction upon application of a voltage at a frequency of 2 kHz. As shown in FIG. 5, when a voltage of 0 to −80 V was applied, the tip of the piezoelectric element 20 was displaced by 34.0 μm at the maximum. Subsequently, the piezoelectric element 20 was driven by the triangle wave voltage to make up-and-down movement one hundred million times (driven for 13.9 hours) and one billion times (driven for 138.9 hours) to examine change of the movement of the piezoelectric element 20, and then the appearance of the piezoelectric element 20 was observed using an optical microscope. Even after the one billion time movements, the maximum displacement was 34.0 μm. The films of the piezoelectric element 20 did not come off and cracks were not caused.

EXAMPLE 2

High-temperature resistant Pyrex (registered trademark) glass was used as the substrate. A 150 nm thick platinum (Pt) film was used as the first electrode film. In order to form the thin platinum film, the substrate was preheated at 400° C. in a ternary RF magnetron sputtering apparatus. Then, sputtering was carried out using a gas mixture of argon and oxygen (gas volume ratio Ar:$O_2$=15:1) as sputtering gas at a total gas pressure maintained at 0.25 Pa and a platinum target as a first target under a high frequency power of 200 W for 1080 seconds.

A layered piezoelectric film was provided by forming a first thin piezoelectric film made of a 100 nm thick PZT film having (111) preferred orientation and a second thin piezoelectric film made of a 4000 nm thick PZT film having (111) crystal orientation. That is, the thickness of the layered piezoelectric film was 4100 nm.

In the same manner as Example 1, the first and second thin piezoelectric films were formed using a RF magnetron sputtering apparatus. As a target, a 6-inch diameter sintered PZT target having a stoichiometric composition prepared by excessively adding about 10 mol % of PbO was used (molar composition ratio Pb:Zr:Ti=1.10:0.50:0.50). Conditions for the film deposition were as follows. First, in a deposition chamber with the PZT target placed therein, the substrate on which the first electrode film had been formed was preheated at 550° C. Then, sputtering was carried out using a gas mixture of argon and oxygen in the mixing ratio of Ar:$O_2$=79:1 as sputtering gas at a gas pressure of 0.2 Pa, a flow rate of 40 ml per minute and plasma generating power of 2 kW for 60 seconds to form the first thin piezoelectric film. Subsequently, the deposition was stopped and the temperature of the substrate was changed to 590° C. and the plasma generating power was changed to 3 kW. With the other conditions unchanged, the second thin piezoelectric film was formed by sputtering for 3800 seconds.

As a result of the analyses and observations carried out in the same manner as in Example 1, the platinum electrode was found to be an aggregate of columnar grains having an average cross-sectional diameter of 30 nm. The first and second thin piezoelectric films were present as aggregates of columnar grains, respectively, and continuously linked to each other. The thickness of the first thin piezoelectric film was 100 nm and the columnar grains had an average cross-sectional diameter of 50 nm. The thickness of the second thin piezoelectric film was 4000 nm and the columnar grains had an average cross-sectional diameter of 200 nm. The ratio of the thickness of the layered piezoelectric film to the average cross-sectional diameter of the columnar grains of the second thin piezoelectric film was 20.5.

As a result of the X-ray diffraction analysis, both the first and second thin piezoelectric films were found to have the perovskite crystal structure. The degree of (111) crystal orientation on the surface of the first thin piezoelectric film was 70%, while the degree of (111) crystal orientation on the surface of the second thin piezoelectric film was 98%.

Further, as a result of composition analysis on cation using the X-ray microanalyzer, the first and second thin piezoelectric films were found to have the composition ratios of Pb:Zr:Ti=1.15:0.51:0.49 and Pb:Zr:Ti=1.00:0.51:0.49, respectively. That is, similarly to Example 1, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 1, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 37.0 μm at the maximum. Even after one billion time movements, the maximum displacement was unchanged. The films of the piezoelectric element 20 did not come off and cracks were not caused.

EXAMPLE 3

A mirror-polished, heat-resistant stainless steel plate was used as the substrate. A 110 nm thick iridium (Ir) alloy film containing titanium (Ti) was used as the first electrode film. In order to form the thin alloy film, the substrate was preheated at 400° C. in a ternary RF magnetron sputtering apparatus. Then, sputtering was carried out for 960 seconds using a gas mixture of argon and oxygen (gas volume ratio $Ar:O_2=16:1$) as sputtering gas at a total gas pressure maintained at 0.25 Pa, an iridium target as a first target under a high frequency power of 200 W and a titanium target as a second target under a high frequency power of 60 W. The purpose of adding titanium to iridium is to improve adhesion of the electrode film to the substrate. Even if titanium is not added, there is no effect on the property of the piezoelectric element.

A layered piezoelectric film was provided by forming a first thin piezoelectric film made of a 10 nm thick PZT film having (111) preferred orientation and added with 10 mol % of Mg and a second thin piezoelectric film made of a 4990 nm thick (PZT+Mg) film having (111) crystal orientation. That is, the thickness of the layered piezoelectric film was 5000 nm.

In the same manner as Example 1, the first and second thin piezoelectric films were formed using a RF magnetron sputtering apparatus. As a target, a 6-inch diameter sintered lead zirconate titanate (PZT+Mg) target having a stoichiometric composition prepared by excessively adding about 10 mol % of PbO and further adding 10 mol % of Mg was used (molar composition ratio Pb:Zr:Ti:Mg=1.10:0.60:0.40:0.10). Conditions for the film deposition were as follows. First, in a deposition chamber with the PZT target placed therein, the substrate on which the first electrode film had been formed was preheated at 570° C. Then, sputtering was carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 100 seconds to form the first thin piezoelectric film. Subsequently, the deposition was stopped and the mixing ratio of the sputtering gas was immediately changed to $Ar:O_2=79:1$. With the other conditions unchanged, the second thin piezoelectric film was formed by sputtering for 2500 seconds.

As a result of the analyses and observations carried out in the same manner as in Example 1, the first electrode film was found to be a thin iridium film containing 1 mol % of titanium constituted of an aggregate of columnar grains having an average cross-sectional diameter of 20 nm. The first and second thin piezoelectric films were present as aggregates of columnar grains, respectively, and continuously linked each other. The thickness of the first thin piezoelectric film was 10 nm and the columnar grains had an average cross-sectional diameter of 40 nm. The thickness of the second thin piezoelectric film was 4990 nm and the columnar grains thereof had an average cross-sectional diameter of 100 nm. The ratio of the thickness of the layered piezoelectric film to the average cross-sectional diameter of the columnar grains of the second thin piezoelectric film was 50.0.

As a result of the X-ray diffraction analysis, both the first and second thin piezoelectric films were found to have the perovskite crystal structure. The degree of (111) crystal orientation on the surface of the first thin piezoelectric film was 50%, while the degree of (111) crystal orientation on the surface of the second thin piezoelectric film was 95%.

Further, as a result of composition analysis on cation using the X-ray microanalyzer, the first and second thin piezoelectric films were found to have the composition ratios of Pb:Zr:Ti:Mg=1.05:0.60:0.40:0.09 and Pb:Zr:Ti:Mg=1.00:0.60:0.40:0.10, respectively. Specifically, similarly to Example 1, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 1, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 36.0 μm at the maximum. Even after one billion time movements, the maximum displacement was unchanged. The films of the piezoelectric element 20 did not come off and cracks were not caused.

EXAMPLE 4

Mirror-polished ceramic material (alumina) was used for the substrate. A 120 nm thick ruthenium (Ru) alloy film containing nickel (Ni) was used as the first electrode film. In order to form the thin alloy film, the substrate was preheated at 400° C. in a ternary RF magnetron sputtering apparatus. Then, sputtering was carried out for 960 seconds using a gas mixture of argon and oxygen (gas volume ratio $Ar:O_2=16:1$) as sputtering gas at a total gas pressure maintained at 0.25 Pa, a ruthenium target as a first target under a high frequency power of 200 W and a nickel target as a second target under a high frequency power of 60 W. The purpose of adding nickel to ruthenium is to improve adhesion of the electrode film to the substrate. Even if nickel is not added, there is no effect on the property of the resulting piezoelectric element.

A layered piezoelectric film was provided by forming a first thin piezoelectric film made of a 50 nm thick PZT film having (111) preferred orientation and added with 5 mol % of Mn and a second thin piezoelectric film made of a 2500 nm thick (PZT+Mn) film having (111) crystal orientation. That is, the thickness of the layered piezoelectric film was 2550 nm.

In the same manner as Example 1, the first and second thin piezoelectric films were formed using a RF magnetron sputtering apparatus. As a target, a 6-inch diameter sintered PZT target having a stoichiometric composition prepared by excessively adding about 20 mol % of PbO and further adding 5 mol % of Mn was used (molar composition ratio Pb:Zr:Ti:Mn=1.20:0.40:0.60:0.05). Conditions for the film deposition were as follows. First, in a deposition chamber with the (PZT+Mn) target placed therein, the substrate on which the first electrode film had been formed was preheated at 550° C. Then, sputtering was carried out using a gas mixture of argon and oxygen in the mixing ratio of $Ar:O_2=79:1$ as sputtering gas at a gas pressure of 0.2 Pa, a flow rate of 40 ml per minute and plasma generating power of 2 kW for 5 seconds to form the first thin piezoelectric film. Subsequently, the deposition was stopped and the temperature of the substrate was changed to 580° C. and the plasma generating power was changed to 3 kW. With the other conditions unchanged, the second thin piezoelectric film was formed by sputtering for 2000 seconds.

As a result of the analyses and observations carried out in the same manner as in Example 1, the first electrode film was found to be a thin ruthenium film containing 4 mol % of nickel and constituted of an aggregate of columnar grains having an average cross-sectional diameter of 25 nm. The first and second thin piezoelectric films were present as aggregates of columnar grains, respectively, and continuously linked to each other. The thickness of the first thin piezoelectric film was 50 nm and the columnar grains had an average cross-sectional diameter of 30 nm. The thickness of the second thin piezoelectric film was 2500 nm and the columnar grains had an average cross-sectional diameter of 60 nm. The ratio of the thickness of the layered piezoelectric film to the average cross-sectional diameter of the columnar grains of the second thin piezoelectric film was 42.5.

As a result of the X-ray diffraction analysis, both the first and second thin piezoelectric films were found to have the perovskite crystal structure. The degree of (111) crystal orientation on the surface of the first thin piezoelectric film was 70%, while the degree of (111) crystal orientation on the surface of the second thin piezoelectric film was 97%.

Further, as a result of composition analysis on cation using the X-ray microanalyzer, the first and second thin piezoelectric films were found to have the composition ratios of Pb:Zr:Ti:Mn=1.10:0.40:0.60:0.05 and Pb:Zr:Ti:Mn=1.05:0.40:0.60:0.05, respectively. That is, similarly to Example 1, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 1, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 38.7 μm at the maximum. Even after one billion time movements, the maximum displacement was unchanged. The films of the piezoelectric element 20 did not come off and cracks were not caused.

EXAMPLE 5

Silicon was used as the substrate. A 120 nm thick palladium Pd) film was used as the first electrode film. In order to form the thin palladium film, the substrate was preheated at 500° C. in a ternary RF magnetron sputtering apparatus. Then, sputtering was carried out using a gas mixture of argon and oxygen (gas volume ratio $Ar:O_2=16:1$) as sputtering gas at a total gas pressure maintained at 0.25 Pa and a palladium target as a first target under a high frequency power of 200 W for 960 seconds.

A layered piezoelectric film 10 was provided by forming a first thin piezoelectric film made of a 100 nm thick PZT film having (111) preferred orientation and a second thin piezoelectric film made of a 4900 nm thick PZT film having (111) crystal orientation. That is, the thickness of the layered piezoelectric film was 5000 nm.

In the same manner as Example 1, the first and second thin piezoelectric films were formed using a RF magnetron sputtering apparatus. As a target, a 6-inch diameter sintered PZT target having a stoichiometric composition prepared by excessively adding about 20 mol % of PbO was used (molar composition ratio Pb:Zr:Ti=1.20:0.58:0.42). Conditions for the film deposition were as follows. First, in a deposition chamber with the PZT target placed therein, the substrate on which the first electrode film had been formed was preheated at 580° C. Then, sputtering was carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 75 seconds to form the first thin piezoelectric film. Subsequently, the deposition was stopped and the mixing ratio of the sputtering gas was immediately changed to $ArO_2=79:1$. With the other conditions unchanged, the second thin piezoelectric film was formed by sputtering for 3700 seconds.

As a result of the analyses and observations carried out in the same manner as in Example 1, the palladium electrode was found to be an aggregate of columnar grains having an average cross-sectional diameter of 20 nm. The first and second thin piezoelectric films were present as aggregates of columnar grains, respectively, and continuously linked to each other. The thickness of the first thin piezoelectric film was 100 nm and the columnar grains had an average cross-sectional diameter of 50 nm. The thickness of the second thin piezoelectric film was 4900 nm and the columnar grains had an average cross-sectional diameter of 90 nm. The ratio of the thickness of the layered piezoelectric film to the average cross-sectional diameter of the columnar grains of the second thin piezoelectric film was 55.5.

As a result of the X-ray diffraction analysis, both the first and second thin piezoelectric films were found to have the perovskite crystal structure. The degree of (111) crystal orientation on the surface of the first thin piezoelectric film was 75%, while the degree of (111) crystal orientation on the surface of the second thin piezoelectric film was 100%.

Further, as a result of composition analysis on cation using the X-ray microanalyzer, the first and second thin piezoelectric films were found to have the composition ratios of Pb:Zr:Ti=1.10:0.58:0.42 and Pb:Zr:Ti=1.05:0.58:0.42, respectively. That is, similarly to Example 1, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 1, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 41.5 μm at the maximum. Even after one billion time movements, the maximum displacement was unchanged. The films of the piezoelectric element 20 did not come off and cracks were not caused.

In Examples 1 to 5, a thin PZT film made of ternary oxide of Pb, Zr and Ti or the ternary oxide added with Mg or Mn is used as the layered piezoelectric film. However, a PZT film containing La (i.e., a PLZT film) or a PZT film containing Nb or Mg ions may also be used. As long as a thin perovskite oxide film is used, the layered piezoelectric film as described in Examples 1 to 5 is obtained.

COMPARATIVE EXAMPLE 1

For comparison with Examples 1 to 5, a piezoelectric element was fabricated as described below.

A piezoelectric element was formed in the same manner as Example 1 except that only the second thin piezoelectric film was formed on the first electrode film made of a thin iridium film in place of the layered piezoelectric film.

The surface of the comparative sample was subjected to observation with a scanning electron microscope, X-ray diffraction analysis and composition analysis with an X-ray microanalyzer as described above. After that, the sample was broken to observe the broken-out section with the scanning electron microscope.

As a result of the above-described analyses and observations, the thin piezoelectric film of the present comparative example was present as an aggregate of columnar grains. The thickness of the thin piezoelectric film was 3500 nm and the columnar grains had an average cross-sectional diameter of 200 nm. The ratio of the thickness of the thin piezoelectric film (the length of the columnar grains of the thin piezoelectric film) to the average cross-sectional diameter of the columnar grains of the thin piezoelectric film was 17.5.

As a result of the X-ray diffraction analysis, the thin piezoelectric film of the present comparative example was found to have the perovskite crystal structure. The degree of (111) crystal orientation on the surface of the thin piezoelectric film was 55%.

Further, as a result of composition analysis on cation using the X-ray microanalyzer, the composition ratio of the thin piezoelectric film of the present comparative example was Pb:Zr:Ti=1.05:0.53:0.47.

As a result of composition analysis of the thin piezoelectric film in the depth direction from the surface thereof by Auger spectroscopic analysis, Zr and Ti were distributed uniformly from the interface with the second electrode film to the interface with the first electrode film.

Specifically, the present comparative example is the same as Example 1 in that the thin piezoelectric film was a perovskite PZT film which had grown as an aggregate of columnar grains in the direction perpendicular to the substrate surface. However, the average cross-sectional diameter of the columnar grains of the comparative thin piezoelectric film was larger than that of Example 1 and the degree of (111) crystal orientation was lower than that of Example 1.

In the same manner as Example 1, a triangle wave voltage of 0V to −80V was applied to the piezoelectric element of the present comparative example at a frequency of 2 kHz to measure the amount of displacement of the up-and-down movement of the tip of the piezoelectric element in the Z direction. The tip of the piezoelectric element was displaced by 20.0 μm at the maximum. Further, the piezoelectric element was driven by the triangle wave voltage to make the up-and-down movement one hundred million times to examine change of the movement of the piezoelectric element, and then the appearance of the piezoelectric element was observed through an optical microscope. As a result, the maximum displacement was reduced to 3.5 μm and the thin piezoelectric film partially came off the first electrode film.

COMPARATIVE EXAMPLE 2

For comparison with Examples 1 to 5, a piezoelectric element was fabricated as described below.

A piezoelectric element was formed in the same manner as Example 5 except that only the second thin piezoelectric film was formed on the first electrode film made of a thin palladium film in place of the layered piezoelectric film.

The surface of the comparative sample was subjected to observation with a scanning electron microscope, X-ray diffraction analysis and composition analysis with an X-ray microanalyzer as described above. After that, the sample was broken to observe the broken-out section with the scanning electron microscope.

As a result of the above-described analyses and observations, the thin piezoelectric film of the present comparative example was present as an aggregate of columnar grains. The thickness of the thin piezoelectric film was 4800 nm and the columnar grains had an average cross-sectional diameter of 300 nm. The ratio of the thickness of the thin piezoelectric film to the average cross-sectional diameter of the columnar grains of the thin piezoelectric film was 16.0.

As a result of the X-ray diffraction analysis, the thin piezoelectric film of the present comparative example had the perovskite crystal structure. The degree of (111) crystal orientation of the thin piezoelectric film was 70%.

Further, as a result of composition analysis on cation using the X-ray microanalyzer, the composition ratio of the thin piezoelectric film of the present comparative example was Pb:Zr:Ti=1.05:0.53:0.47.

As a result of composition analysis of the thin piezoelectric film in the depth direction from the surface thereof by Auger spectroscopic analysis, Zr and Ti were distributed uniformly from the interface with the second electrode film to the interface with the first electrode film. In a portion of the thin piezoelectric film having a length of 10 nm from the interface with the first electrode film, the amount of Pb was slightly reduced (about 1/20 of the overall Pb distribution in the thin piezoelectric film). It is presumed that this phenomenon was caused by a trace amount of Pb which was diffused into the first electrode film, though it is impossible to confirm with the precision of the Auger spectroscopic analysis.

Specifically, the present comparative example is the same as Example 5 in that the thin piezoelectric film was a perovskite PZT film which had grown as an aggregate of columnar grains in the direction perpendicular to the substrate surface. However, the comparative example was different from Example 5 in that the average cross-sectional diameter of the columnar grains of the comparative thin piezoelectric film was larger than that of Example 5, the degree of (111) crystal orientation of the thin piezoelectric film was lower than that of Example 5 and the Pb distribution in the neighborhood of the interface with the first electrode film was the same as that in the overall Pb distribution, while the Pb distribution at the interface with the first electrode film was slightly lowered.

In the same manner as Example 5, a triangle wave voltage of 0V to −80V was applied to the piezoelectric element of the present comparative example at a frequency of 2 kHz to measure the amount of displacement of the up-and-down movement of the tip of the piezoelectric element in the Z direction. The tip of the piezoelectric element was displaced by 22.0 μm at the maximum. Further, the piezoelectric element was driven by the triangle wave voltage to make the up-and-down movement one billion times to examine change of the movement of the piezoelectric element, and then the appearance of the piezoelectric element was observed through an optical microscope. After that, the movement was stopped and the thin piezoelectric film came off the first electrode film.

Embodiment 2

The present embodiment is an inkjet head including the piezoelectric element of Embodiment 1 of the present invention. Hereinafter, an explanation of the inkjet head will be provided.

Figure 6:
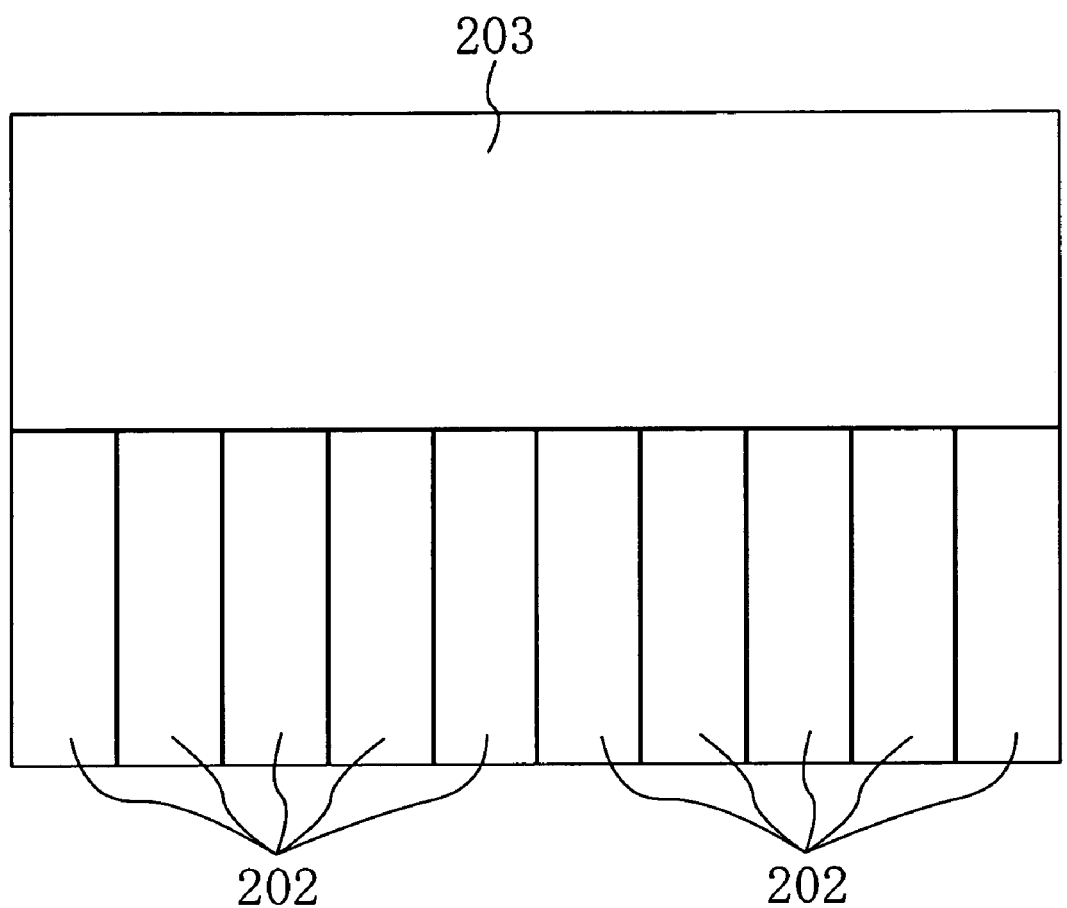
FIG. 6 is a view illustrating the schematic structure of an inkjet head according to Embodiment 2.

FIG. 6 is a view schematically illustrating the structure of the inkjet head 201 according to Embodiment 2 of the present invention. As shown in FIG. 6, the inkjet head 201 includes 10 ink dischargers 202 which are in the same shape and arranged in line and a driving power source 203 which is connected to individual electrodes 33 for the ink dischargers 201 to drive the ink dischargers 201. The driving power source 203 supplies voltage to the individual electrodes 33 for the ink dischargers 201 through bonding wires.

Figure 7:
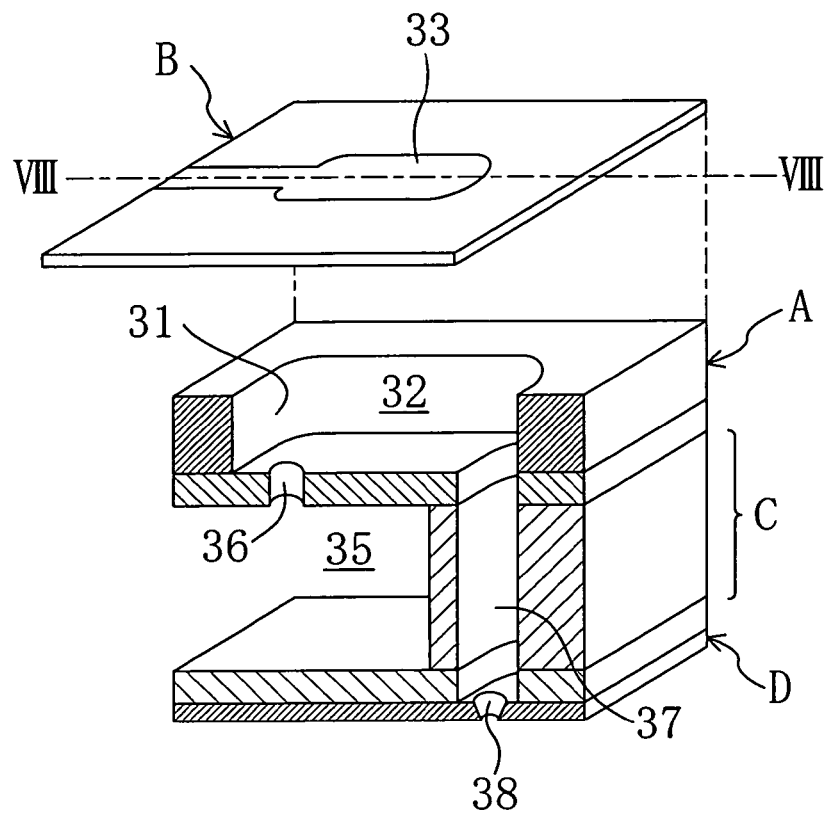
FIG. 7 is an oblique view, partially broken away, of part of an ink discharger according to Embodiment 2.

FIG. 7 is an oblique view, partially broken away, illustrating part of the ink dischargers 202. As shown in FIG. 7, a pressure chamber component A (a pressure chamber member) is provided with oval holes 31 for forming pressure chambers having a shorter axis of 200 μm and a longer axis of 400 μm. An actuator component B is arranged to cover the top openings of the holes 31. An ink passage component C is arranged to cover the bottom openings of the holes 31. Specifically, the holes 31 of the pressure chamber component A are defined by the actuator component B arranged at the top thereof and the ink passage component C arranged at the bottom thereof, thereby providing pressure chambers 32 each having a thickness of 0.2 mm. The actuator component B includes individual electrodes 33 located above the pressure chambers 32, respectively. The ink passage component C includes a common ink chamber 35 shared by the pressure chambers 32 of the ink dischargers 202, supply ports 36 which communicates with the common ink chamber 35 and the pressure chambers 32 and an ink passages 37 for discharging the ink in the pressure chambers 32 therethrough. A nozzle plate D is provided with a 30 μm diameter nozzle holes 38 which communicates with the ink passages 37. The components A to D are bonded together with an adhesive to achieve the ink dischargers 202.

Hereinafter, a more specific explanation of the actuator component B will be provided.

EXAMPLE 6

Figure 8:
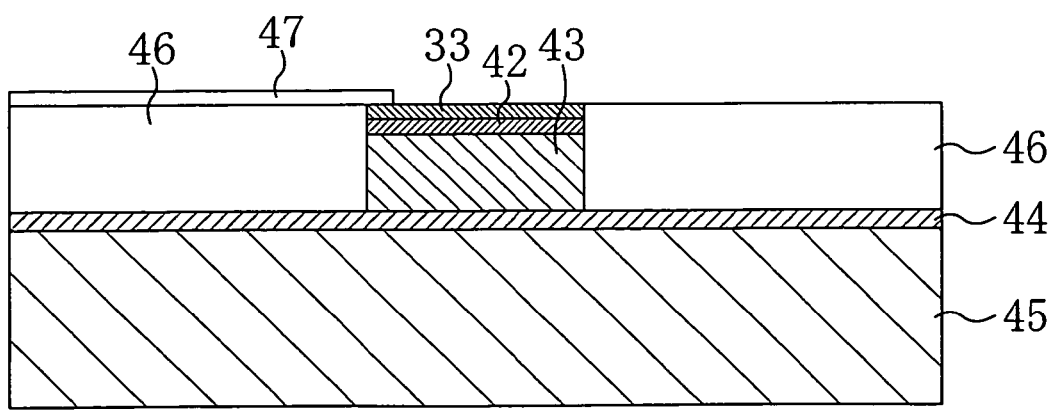
FIG. 8 is a sectional view taken along the line VIII-VIII of FIG. 7.

An explanation of the actuator component B is provided with reference to FIG. 8. FIG. 8 is a sectional view cut along the line VIII-VIII of FIG. 7. As shown in FIG. 8, the actuator component B includes an individual electrode (first electrode film) 33 made of a 100 nm thick iridium (Ir) film, a first thin piezoelectric film 42 which is positioned immediately below the individual electrode 33 and made of a 50 nm thick PZT film represented as $Pb_{1.15}Zr_{0.53}Ti_{0.48}O_3$, a second thin piezoelectric film 43 which is positioned immediately below the first thin piezoelectric film 42 and made of a 3500 nm thick PZT film represented as $Pb_{1.10}Zr_{0.53}Ti_{0.47}O_3$, a second electrode film 44 which is positioned immediately below the second thin piezoelectric film 43 and made of a 100 nm thick platinum film and a diaphragm layer (diaphragm plate) 45 which is positioned immediately below the second electrode film 44 and made of a 3500 nm thick chromium (Cr) film. The diaphragm layer 45 is displaced by the piezoelectric effect of the first and second thin piezoelectric films 42 and 43 to cause vibration. The second electrode film 44 and the diaphragm layer 45 are shared by the pressure chambers 32 of the ink dischargers 202. The first and second thin piezoelectric films 42 and 43 are in the same shape as the individual electrode 33. A layered film formed of the individual electrode 33 and the first and second thin piezoelectric films 42 and 43 on the second electrode film 44 is surrounded by an electrically insulating organic film 46 made of a polyimide resin and has the same thickness as the layered film. On the electrically insulating organic film 46, a lead electrode film 47 which is made of a 100 nm thick gold film in the form of a lead wire is formed and connected to the individual electrode 33. A piezoelectric element is achieved by the individual electrode 33, the layered piezoelectric film including the first and second thin piezoelectric films 42 and 43 and the second electrode film 44. The piezoelectric element is the same as the piezoelectric element 20 of Embodiment 1. Thus, the actuator component B is obtained with high performance.

Hereinafter, a method for manufacturing the actuator component B will be described.

FIGS. 9A to 9E and 10A to 10D illustrate the steps of the method for manufacturing the actuator component B. First, on a silicon substrate 51 of 20 mm in length, 20 mm in width and 0.3 mm in thickness, a first electrode film 52, a first thin piezoelectric film 54, a second thin piezoelectric film 55 and a second electrode film 44 are stacked in this order in the same manner as Example 1 of Embodiment 1. Thus, a structure 56 shown in FIG. 9A is achieved.

Then, as shown in FIG. 9B, a diaphragm layer 45 made of a 3500 nm thick chromium (Cr) film is formed on the structure 56 by RF sputtering at room temperature.

Then, the diaphragm layer 45 is adhered to a pressure chamber component 58 made of glass using an acrylic resin adhesive 57 as shown in FIG. 9C. The pressure chamber component 58 is arranged to face the diaphragm layer 45 with the adhesive 57 interposed therebetween.

Then, the silicon substrate 51 is removed by dry etching using $SF_6$ gas as shown in FIG. 9D using a plasma etching apparatus.

Subsequently, as shown in FIG. 9E, a resin photoresist film 59 is formed and patterned with accuracy such that the layered film including the first electrode film 52 and the first and second thin piezoelectric films 54 and 55 is shaped into an oval having a shorter axis of 180 μm and a longer axis of 380 μm. Then, etching is carried out by dry etching using Ar gas and wet etching using weak hydrogen fluoride. Thus, an actuator structure having a layered film including the individual electrode 33, first thin piezoelectric film 42 and second thin piezoelectric film 43 as shown in FIG. 10A is obtained. Subsequently, the resin photoresist film 59 is removed by treatment with a resist remover as shown in FIG. 10B.

Then, as shown in FIG. 10C, an electrically insulating organic film 46 is formed on the second thin piezoelectric film 42 by printing. Further, a lead electrode film 47 is formed on the electrically insulating organic film 46 by DC sputtering as shown in FIG. 10D. Thus, an actuator component B as shown in FIG. 8 is obtained.

30 ink dischargers 202 were fabricated by the method of the present example. A sine wave voltage of 0V to −60V was applied between the two electrode films 33 and 44 of each of the ink dischargers 202 at a frequency of 200 Hz to examine change of the up-and-down movement. Even after one billion time movements, no failure was occurred in all the ink dischargers 202.

Using 10 of the ink dischargers 202, inkjet heads 201 as shown in FIG. 6 were fabricated. In each of the inkjet heads 201, voltage is applied to the individual electrode 33 from the driving power source 203 via the bonding wire. Then, the diaphragm layer 45 is displaced in the thickness direction by the piezoelectric effect of the first and second thin piezoelectric films 42 and 43 to cause vibration. As a result, the ink in the common ink chamber 35 passes through the supply port 36, pressure chamber 32 and ink passage 37 and is discharged from the nozzle hole 38.

As to the inkjet head 201, the surfaces of the first and second thin piezoelectric films 42 and 43 in the actuator component B of the ink discharger 202 are both oriented along the (111) plane to keep their piezoelectric displacement properties high. Therefore, large piezoelectric displacement is obtained. Further, since the individual electrode 33 and the first piezoelectric film 54 are adhered tightly, failure caused by peeling of the film is less likely to occur even if a high voltage is applied to obtain large displacement. Therefore, the inkjet head is driven with stability and reliability. Since the piezoelectric displacement is large, ink discharge performance becomes high and the source voltage can be adjusted with a large margin. Therefore, ink discharge by the ink dischargers 202 is easily controlled such that variations in amount of discharged ink are reduced.

EXAMPLE 7

Figure 11:
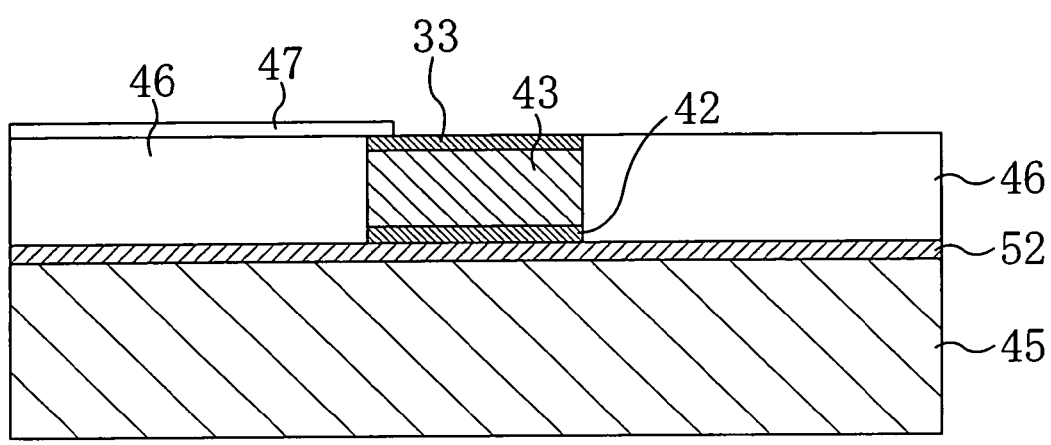
FIG. 11 is a sectional view corresponding to the sectional view taken along the line VIII-VIII of FIG. 7 illustrating an actuator component according to Example 7 of Embodiment 2.

Referring to FIG. 11, another actuator component B having a different structure from Example 6 is described. FIG. 11 corresponds to the cross sectional view taken along the line VIII-VIII of FIG. 7 and illustrates the actuator component B according to Example 7 of Embodiment 2. As shown in FIG. 11, the actuator component B includes an individual electrode (second electrode film) 33 made of a 100 nm thick platinum (Pt) film, a second thin piezoelectric film 43 which is positioned immediately below the individual electrode 33 and made of a 4500 nm thick PZT film represented as $Pb_{1.05}Zr_{0.58}Ti_{0.42}O_3$, a first thin piezoelectric film 42 which is positioned immediately below the second thin piezoelectric film 43 and made of a 80 nm thick PZT film represented as $Pb_{1.10}Zr_{0.58}Ti_{0.42}O_3$, a first electrode film 52 which is positioned immediately below the first thin piezoelectric film 42 and made of a 200 nm thick palladium film and a diaphragm layer 45 which is positioned immediately below the first electrode film 52 and made of a 5000 nm thick silicon oxide ($SiO_2$) film. The diaphragm layer 45 is displaced by the piezoelectric effect of the first and second thin piezoelectric films 42 and 43 to cause vibration. The first electrode film 52 and the diaphragm layer 45 are shared by the pressure chambers 32 of the ink dischargers 202. The first and second thin piezoelectric films 42 and 43 are in the same shape as the individual electrode 33. A layered film formed of the individual electrode 33 and the first and second thin piezoelectric films 54 and 55 on the first electrode film 52 is surrounded by an electrically insulating organic film 46 made of a polyimide resin and has the same thickness as the layered film. On the electrically insulating organic film 46, a lead electrode film 47 which is made of a 100 nm thick gold film in the form of a lead wire is formed and connected to the individual electrode 33. A piezoelectric element is achieved by the individual electrode 33, the layered piezoelectric film including the first and second thin piezoelectric films 54 and 55 and the first electrode film 52. The piezoelectric element is the same as the piezoelectric element 20 of Embodiment 1. Thus, the actuator component B is obtained with high performance.

Hereinafter, a method for manufacturing the actuator component B will be described.

Figure 12:
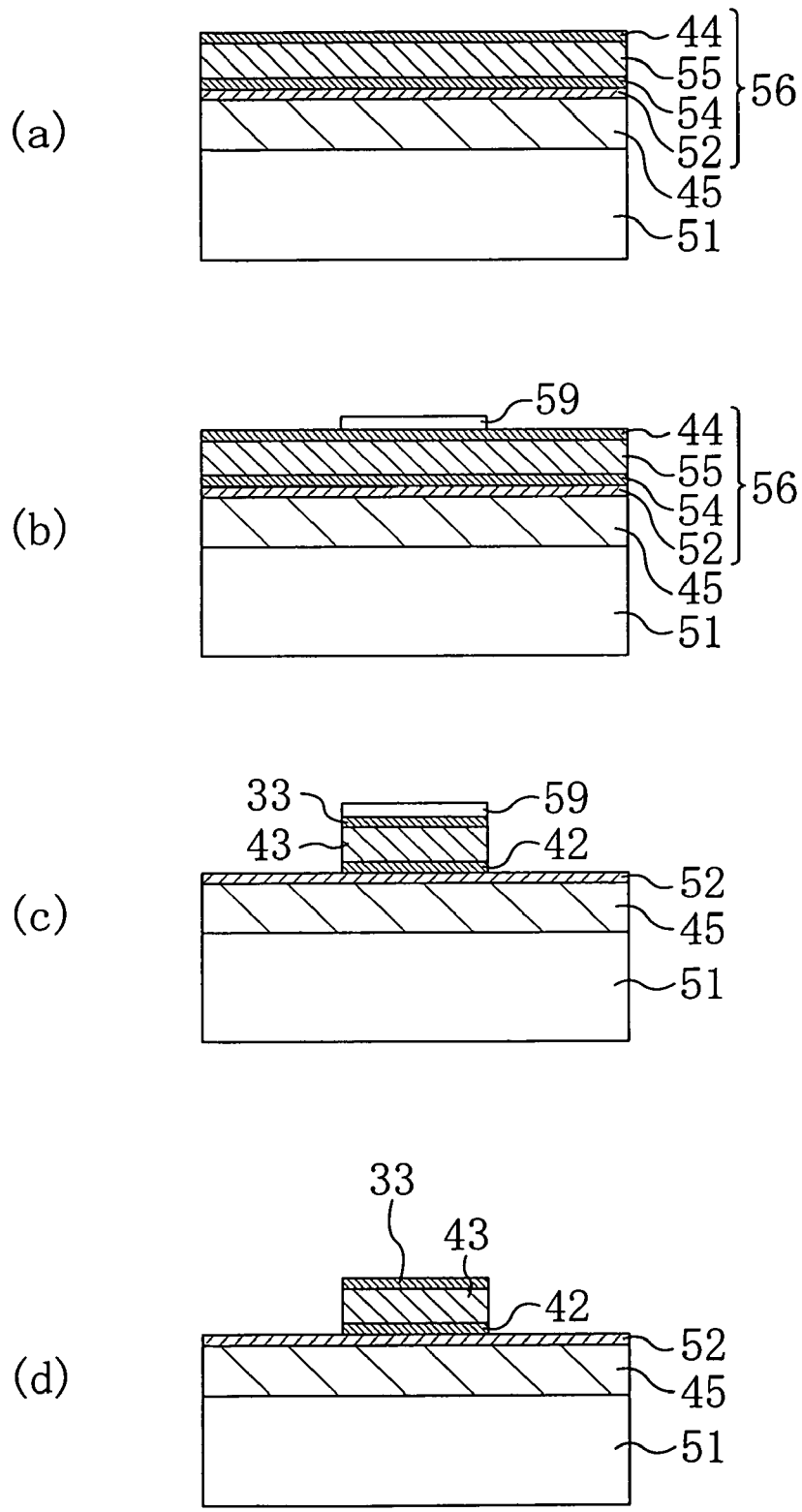
FIGS. 12A to 12D are views illustrating some of the steps of a method for manufacturing the actuator component according to Example 7 of Embodiment 2.

FIGS. 12A to 12D and 13A to 13C illustrate the steps of the method for manufacturing the actuator component B. First, on a silicon substrate 51 (pressure chamber substrate) of 20 mm in length, 20 mm in width and 0.3 mm in thickness, a diaphragm layer 45 is formed. Then, on the diaphragm layer 45, a first electrode film 52, a first thin piezoelectric film 54, a second thin piezoelectric film 55 and a second electrode film 44 are stacked in this order in the same manner as Example 5 of Embodiment 1. Thus, a structure 56 as shown in FIG. 12A is obtained.

Then, as shown in FIG. 12B, a resin photoresist film 59 is formed and patterned with accuracy such that the layered film including the second electrode film 44 and the first and second thin piezoelectric films 54 and 55 is shaped into an oval having a shorter axis of 180 μm and a longer axis of 380 μm.

Then, etching is carried out by dry etching using Ar gas and wet etching using weak hydrogen fluoride. As a result, an actuator structure having the layered film including the individual electrode 33 and the second and first thin piezoelectric films 43 and 42 is obtained as shown in FIG. 12C. Subsequently, the resin photoresist film 59 is removed by treatment with a resist remover as shown in FIG. 13D. Then, as shown in FIG. 13A, an electrically insulating organic film 46 is formed on the first electrode film 52 by printing.

Then, as shown in FIG. 13B, part of the silicon substrate 51s removed by dry etching using $SF_6$ gas in a plasma etching apparatus to provide a pressure chamber 32.

Then, a lead electrode film 47 is formed on the electrically insulating organic film 46 by DC sputtering as shown in FIG. 13C. Thus, an actuator component B shown in FIG. 11 is obtained.

30 ink dischargers 202 were fabricated by the method of the present example. A sine wave voltage of 0V to −60V was applied between the two electrode films 33 and 52 of each of the ink dischargers 202 at a frequency of 200 Hz to examine change of the up-and-down movement as described above. Even after one billion time movements, no failure was occurred in all the ink dischargers 202.

Using 10 of the ink dischargers 202, inkjet heads 201 as shown in FIG. 6 were fabricated. The inkjet heads 201 offered the same effect as described in Example 6.

Embodiment 3

The present embodiment is directed to an inkjet recording device including the inkjet head of Embodiment 2 of the present invention. Hereinafter, an explanation of the inkjet recording device will be provided.

Figure 14:
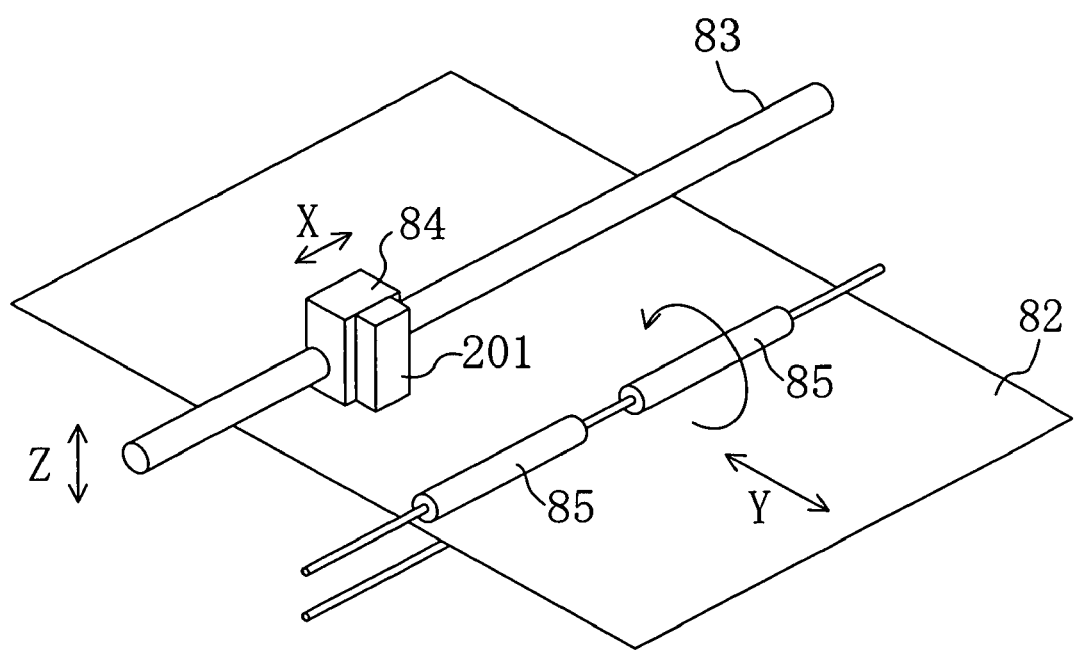
FIG. 14 is an oblique view schematically illustrating an inkjet recording device according to Embodiment 3.

FIG. 14 is an oblique view schematically illustrating the inkjet recording device according to Embodiment 3 of the present invention. As shown in FIG. 14, the inkjet recording device 81 includes the inkjet head 201 of Embodiment 2 which makes use of the piezoelectric effect by the first and second thin piezoelectric films 42 and 43. Ink droplets discharged from the inkjet head 201 are dropped onto a recording medium such as paper to perform recording on the recording medium 82. The inkjet head 201 is mounted on a carriage 84 (relative movement mechanism) which is slidably attached to a carriage shaft 83 (relative movement mechanism) disposed along a primary scanning direction (X direction in FIG. 14). When the carriage 84 reciprocates along the carriage shaft 83, the inkjet head 201 reciprocates along the primary scanning direction X. The inkjet recording device 81 further includes a plurality of rollers 85 (relative movement mechanism) for moving the recording medium 82 along a secondary scanning direction Y which is substantially perpendicular to the primary scanning direction X. For recording by the inkjet recording medium 81, the ink in the pressure chamber 32 is discharged from the nozzle hole 38 onto the recording medium 82 while the inkjet head 201 reciprocates on the carriage shaft 83 along the primary scanning direction X.

As described above, according to the present embodiment, the inkjet recording medium 81 is provided using the inkjet head 201 of Embodiment 2 which makes it possible to easily control the variations in amount of ink discharged by the ink dischargers 202. Therefore, variations in recording onto the recording medium 82 are reduced, thereby providing the inkjet recording device 81 with high reliability.

Embodiment 4

The present embodiment is directed to an angular velocity sensor including the piezoelectric element of Embodiment 1 of the present invention. Hereinafter, an explanation of the angular velocity sensor will be provided.

Figure 15:
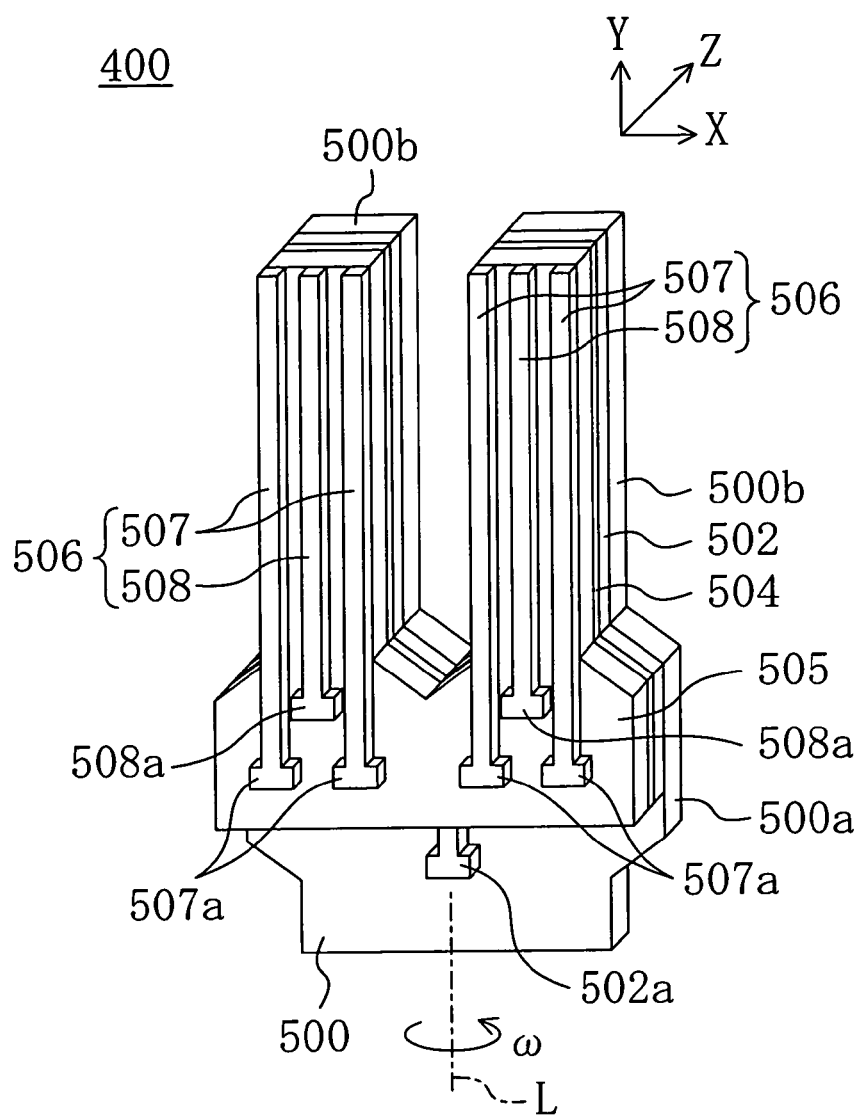
FIG. 15 is a view schematically illustrating an angular velocity sensor according to Embodiment 4.
Figure 16:
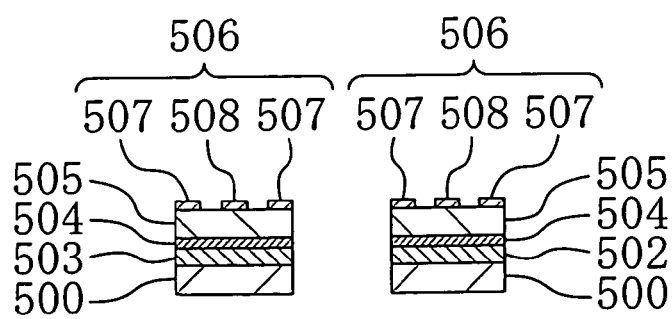
FIG. 16 is a sectional view illustrating the angular velocity sensor according to Embodiment 4.

FIGS. 15 and 16 are a schematic view and a sectional view illustrating the angular velocity sensor 400 according to Embodiment 4 of the present invention, respectively. The angular velocity sensor 400 is in the form of a tuning fork and suitably used for vehicular navigation systems or others.

The angular velocity sensor 400 includes a substrate 500 made of a 0.3 mm thick silicon wafer. The substrate 500 includes a stationary part 500a and a pair of vibrating parts 500b extending from the stationary part 500a in a certain direction (the direction of extension of the center axis of rotation of angular velocity to be detected; in the present embodiment, a direction corresponding to the direction of Y shown in FIG. 15). The stationary part 500a and the pair of vibrating parts 500b provide the form of a tuning fork as viewed from the thickness direction of the substrate 500 (the Z direction in FIG. 15). The paired vibrating parts 500b corresponding to arms of the tuning fork are arranged side by side along the width direction of the vibrating parts 500b and extend parallel to each other. The substrate 500 may be a glass substrate, a metal substrate or a ceramic substrate.

On each of the vibrating parts 500b and a portion of the stationary part 500a closer to the vibrating parts 500b of the substrate 500, a first electrode film 502, a first thin piezoelectric film 504, a second thin piezoelectric film 505 and a second electrode film 506 are stacked in this order. The first electrode film 502, a piezoelectric film including the first and second thin piezoelectric films 504 and 505 and the second electrode film 506 constitute a piezoelectric element. The piezoelectric element is the same as the piezoelectric element 20 of Embodiment 1. Specifically, the first electrode film 502, first thin piezoelectric film 504, second thin piezoelectric film 505 and second electrode film 506 are the same as the first electrode film 2, first thin piezoelectric film 4, second thin piezoelectric film 5 and second electrode film 6 of Embodiment 1, respectively.

The second electrode film 506 on each of the vibrating parts 500b is shaped into two drive electrodes 507 for vibrating the vibrating part 500b in the width direction thereof (the X direction in FIG. 15) and a detection electrode 508 for detecting deformation (flexure) of the vibrating part 500b in the thickness direction thereof (the Z direction in FIG. 15).

The two drive electrodes 507 are provided at the edge portions of each vibrating part 500b in the width direction of the vibrating part 500b (the X direction) over the full length of the vibrating part 500b (the Y direction in FIG. 15). Each of the drive electrodes 507 has a connection terminal 507a at an end thereof positioned on the stationary part 500a. Only a single drive electrode 507 may be provided on one of the edge portions of the vibrating part 500b in the width direction thereof.

The detection electrode 508 is provided at the center portion in the width direction of the vibrating part 500b over the full length of the vibrating part 500b. An end of the vibrating part 500b closer to the stationary part 500a is positioned on the stationary part 500a and constitutes a connection terminal 508a like the ends of the drive electrodes 507. A plurality of detection electrodes 508 may be provided on each of the vibrating parts 500b.

The first electrode film 502 has a connection terminal 502a which is positioned at the center between the paired vibrating parts 500b on the stationary part 500a and protrudes in the direction opposite to the vibrating parts 500b.

In order to vibrate the vibrating parts 500b in the width direction thereof, a voltage having a frequency that resonates with the natural vibration of the vibrating parts 500b is applied between the first electrode film 502 and the two drive electrodes 507. Specifically, a ground voltage is applied to the first electrode film 502, while negative and positive voltages are applied to the two drive electrodes 507, respectively. As a result, when one of the edge portions in the width direction of the vibrating part 500b expands, the other edge portion contracts, thereby deforming the vibrating part 500b toward the latter edge portion. Conversely, when one of the edge portions in the width direction of each vibrating part 500b contracts, the other edge portion expands, thereby deforming the vibrating part 500b toward the former edge portion. By alternately repeating these operations, the vibrating parts 500b vibrate in the width direction. If voltage is applied to only one of the two drive electrodes 507 on the vibrating parts 500b, the vibrating parts 500b can be vibrated in the width direction thereof. The pair of vibrating parts 500b are deformed toward the opposite directions in the width direction thereof. That is, the vibrating parts 500b vibrate symmetrically with respect to a center line L extending along the center of the vibrating parts 500b in the length direction of the vibrating parts 500b.

When the pair of vibrating parts 500b are vibrated in the width direction (the X direction) symmetrically with respect to the center line L, if angular velocity ω is applied around the center line L, the two vibrating parts 500b are warped in the thickness direction thereof (the Z direction) by Coriolis force (the paired vibrating parts 500b are warped by the same amount in the directions opposite to each other). In response to this, the thin piezoelectric film is also warped. As a result, a voltage corresponding to the magnitude of the Coriolis force is generated between the first electrode film 502 and the detection electrode 508. The angular velocity ω is determined from the magnitude of the voltage (Coriolis force). Specifically, where the velocity of the vibration of the vibrating parts 500b in the width direction is defined as v and the mass of the vibrating parts 500b as m, the Coriolis force Fc is represented as $$Fc = 2mv\omega$$

Therefore, the angular velocity ω is obtained from the Coriolis force Fc.

Hereinafter, referring to FIGS. 17A to 17F and 18, an explanation of a method for manufacturing the angular velocity sensor 400 will be provided. First, as shown in FIG. 17A, a substrate 500 made of a silicon wafer of 0.3 mm in thickness and 4 inch in diameter is prepared (see also FIG. 18). Then, a first electrode film 502 made of a 100 nm thick iridium (Ir) film is formed on the substrate 500 by sputtering as shown in FIG. 17B. The first electrode film 502 is obtained by sputtering on the substrate 500 heated at 400° C. using an Ir target and argon gas at 1 Pa and a high frequency power of 200 W in a sputtering apparatus for 10 minutes.

Then, a first thin piezoelectric film 504 is formed on the first electrode film 502 by sputtering as shown in FIG. 17C. Subsequently, as shown in FIG. 17D, a second thin piezoelectric film 505 is formed on the first thin piezoelectric film 504 by sputtering to achieve a layered piezoelectric film. The first thin piezoelectric film 504 is made of a 100 nm thick PZT film having (111) preferred orientation and the second thin piezoelectric film 505 is made of a 2900 nm thick PZT film having (111) crystal orientation. To form the layered piezoelectric film, a 6-inch diameter sintered PZT target having a stoichiometric composition prepared by excessively adding about 20 mol % of PbO (molar composition ratio Pb:Zr:Ti=1.20:0.53: 0.47) is used as a target. The substrate 500 on which the first electrode film 502 has been formed is preheated at 580° C. Then, sputtering is carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 50 seconds to form the first thin piezoelectric film 504. Subsequently, the deposition was stopped and the mixing ratio of the sputtering gas is immediately changed to $Ar:O_2=79:1$. With the other conditions unchanged, the second thin piezoelectric film 505 is formed by sputtering for 2500 seconds. The step of forming the layered piezoelectric film includes the step of providing the layered piezoelectric film with (111) preferred orientation.

Then, a 100 nm thick second electrode film 506 is formed on the second thin piezoelectric film 505 by sputtering as shown in FIG. 17E. The second electrode film 506 is obtained by sputtering using a Pt target in argon gas at 1 Pa under a room temperature and high frequency power of 200 W for 10 minutes.

Figure 18:
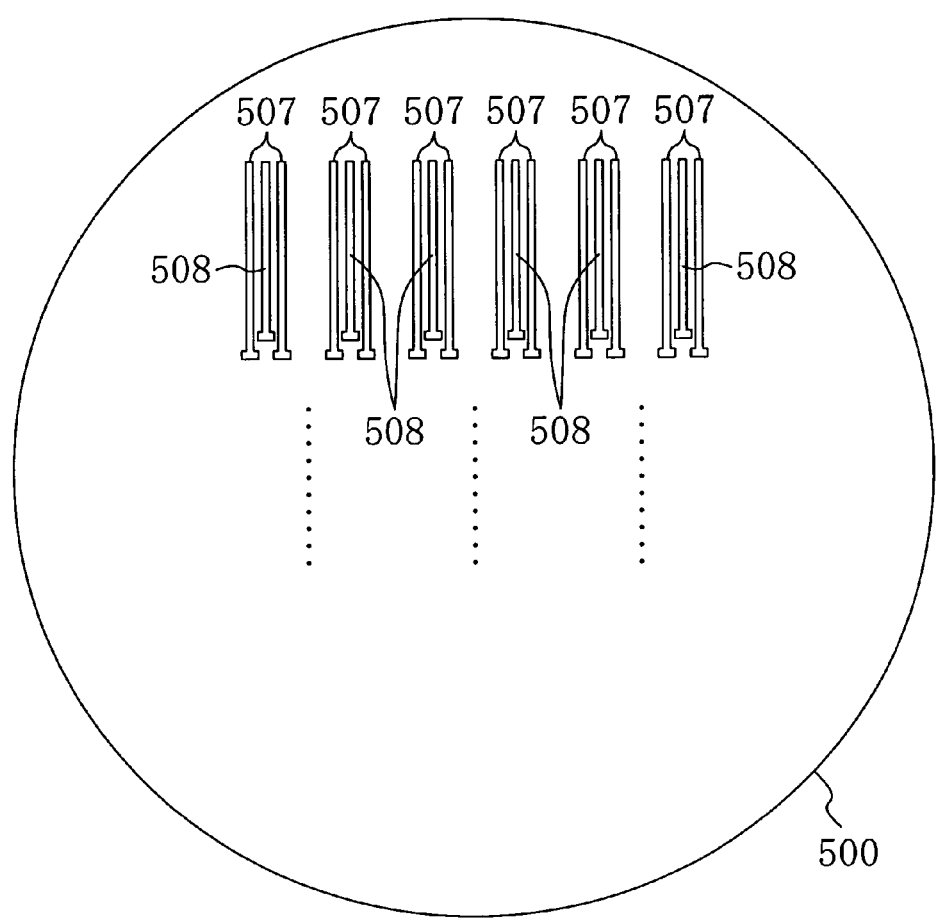
FIG. 18 is a schematic view illustrating the method for manufacturing the angular velocity sensor according to Embodiment 4.

Then, as shown in FIGS. 17F and 18, the second electrode film 506 is shaped into drive electrodes 507 and a detection electrode 508 by patterning. Specifically, a photosensitive resin is applied onto the second electrode film 506 and exposed to light to provide patterns of the drive electrodes 507 and the detection electrode 508. Then, part of the photosensitive resin which has not been exposed to light is removed and part of the second electrode film 506 from the surface of which the photosensitive resin has been removed is removed by etching. Then, the photosensitive resin remaining on the drive electrodes 507 and the detection electrode 508 is removed.

Subsequently, patterning is carried out on the second thin piezoelectric film 505, the first thin piezoelectric film 504 and the first electrode film 502. Then, patterning is further carried out on the substrate 500 to achieve a stationary part 500a and vibrating parts 500b. Then, the substrate 500 is shaped in the form of a tuning fork as shown in FIG. 15. Thus, the angular velocity sensor 400 is obtained.

Figure 19:
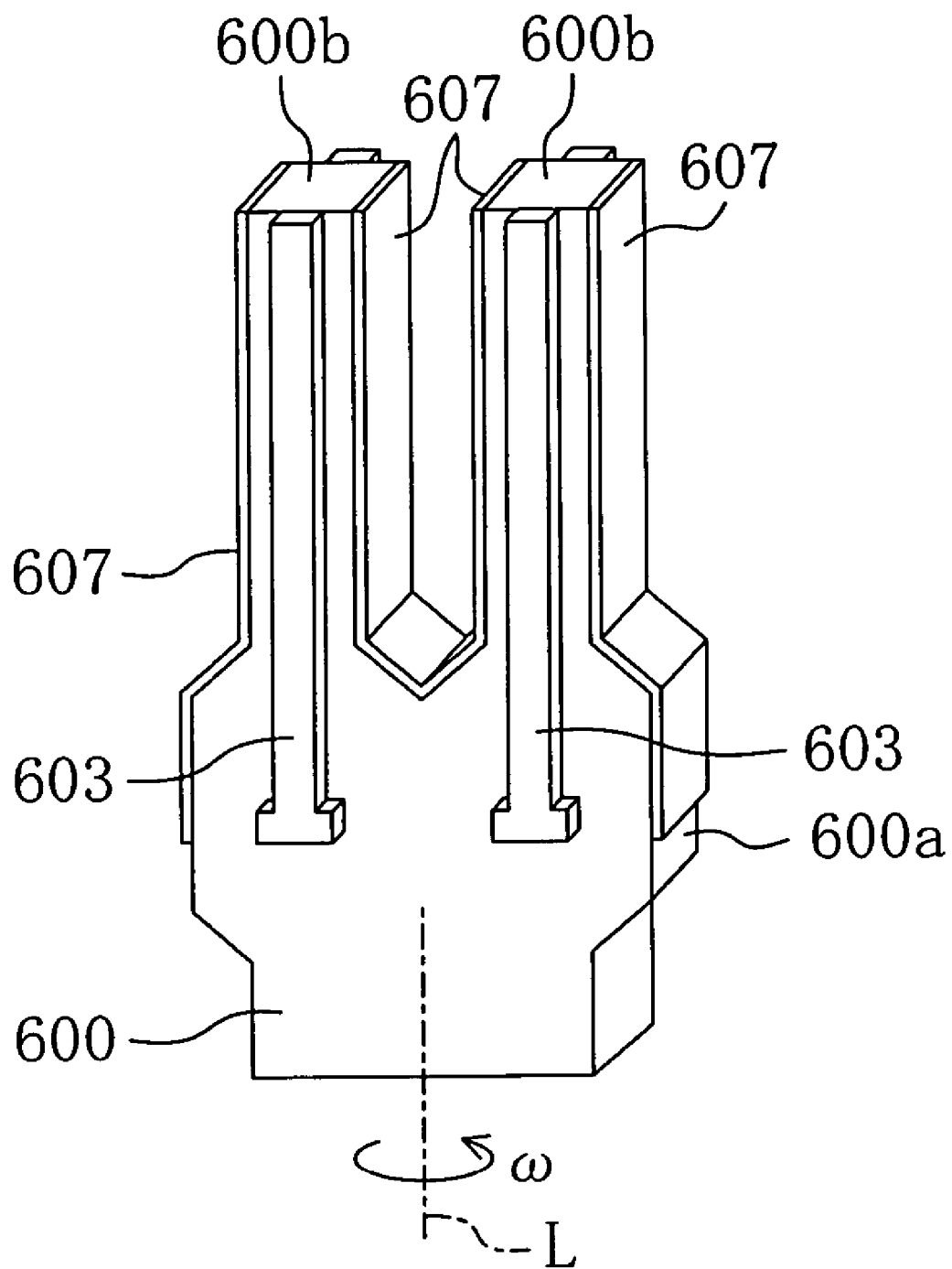
FIG. 19 is a view schematically illustrating a conventional angular velocity sensor.

Hereinafter, referring to FIG. 19, an explanation of a conventional angular velocity sensor 401 is provided in comparison with the angular velocity sensor 400 of the present embodiment.

The conventional angular velocity sensor 401 includes a 0.3 mm thick piezoelectric element 600 made of quartz. The piezoelectric element 600 includes, like the substrate 500 of the angular velocity sensor 400 of the present embodiment, a stationary part 600a and a pair of vibrating parts 600b extending parallel to each other in a certain direction (the Y direction in FIG. 19) from the stationary part 600a. Each of the vibrating parts 600b is provided with drive electrodes 603 disposed on the surfaces thereof facing each other in the thickness direction (the Z direction in FIG. 19) such that the vibrating parts 600b are vibrated in the width direction thereof (the X direction in FIG. 19). Further, detection electrodes 607 are disposed on the side surfaces of each of the vibrating parts 600b to detect the deformation of the vibrating parts 600b in the thickness direction.

In the conventional angular velocity sensor 401, a voltage having a frequency that resonates with the natural vibration of the vibrating parts 600b is applied between the two drive electrodes 603 of each vibration part 600b. As a result, in the same manner as in the angular velocity sensor 400 of the present embodiment, the pair of vibrating parts 600b are vibrated in the width direction (the X direction) symmetrically with respect to a center line L extending along the center of the vibrating parts 600b. At this time, when angular velocity ω is applied around the center line L, the pair of vibrating parts 600b are warped in the thickness direction thereof (the Z direction) by Coriolis force. As a result, a voltage corresponding to the magnitude of the Coriolis force is generated between the two detection electrodes 607. The angular velocity ω is determined from the magnitude of the voltage (Coriolis force).

Since the conventional angular velocity sensor 401 uses the quartz piezoelectric element 600, the piezoelectric constant thereof is as significantly low as −3 pC/N. Further, as the stationary part 600a and the vibrating parts 600b are formed by mechanical processing, downsizing of the angular velocity sensor is difficult and dimensional accuracy is low.

In contrast, in the angular velocity sensor 400 of the present embodiment, the parts for detecting the angular velocity (vibrating parts 500b) are made of the same piezoelectric element as the piezoelectric element 20 of Embodiment 1. Therefore, the angular velocity sensor 400 shows a piezoelectric constant which is about 40 times larger than that of the conventional angular velocity sensor 401 and significant downsizing is achieved. Further, microprocessing is achieved by thin-film formation technology, thereby improving the dimensional accuracy remarkably. Moreover, even if the angular velocity sensor is put into industrial mass production, the angular velocity sensors 400 which are voltage-resistant and highly reliable are obtained with high property repeatability and reduced variations.

In the present embodiment, only a single pair of the vibrating parts 500b is provided on the substrate 500. However, multiple pairs of the vibrating parts 500b may be provided such that the angular velocities along the multiple axes extending in different directions can be detected.

Further, in the present embodiment, the first electrode 502, the first thin piezoelectric film 504, the second thin piezoelectric film 505 and the second electrode film 506 are stacked in this order on the vibrating parts 500b and a portion of the stationary part 500a closer to the vibrating parts 500b. However, these films may be formed only on the vibrating parts 500b.

Embodiment 5

Figure 20:
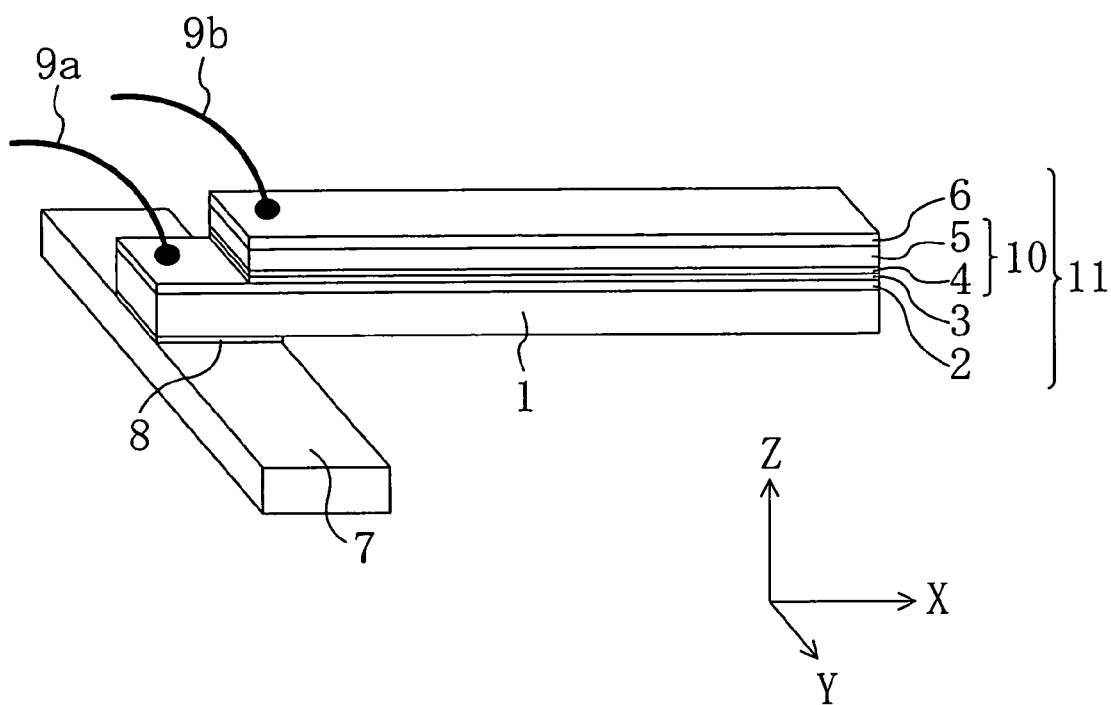
FIG. 20 is an oblique view illustrating a piezoelectric element of Embodiment 5.

FIG. 20 is an oblique view illustrating a piezoelectric element 20 according to Embodiment 5 of the present invention. As shown in FIG. 20, the piezoelectric element 20 includes a substrate 1 which is in the form of a flat strip of 15.0 mm in length, 0.40 mm in thickness and 3.0 mm in width and a layered body 11 disposed on the substrate 1. The substrate 1 functions as a diaphragm which hinders expansion and contraction of the layered body 11 caused by the piezoelectric effect. The piezoelectric element 20 is 3.0 mm in width. An end portion of the piezoelectric element 20 having a width of 3.0 mm and a length of 3.0 mm (a left end portion in FIG. 20) is fixed onto a 1.0 mm thick support substrate 7 made of stainless steel (3.0 mm in width and 10.0 mm in length) with an epoxy-based adhesive 8. Thus, the piezoelectric element 20 is provided in the form of a cantilever.

A first electrode film 2 is provided on the substrate 1. On the surface of the first electrode film 2 except for an end portion thereof (a left end portion in FIG. 1), i.e., on part of the surface having a width of 3.0 mm and a length of 12.0 mm, an orientation control film 3 made of a thin oxide film based on perovskite lead lanthanum zirconate titanate (hereinafter referred to as PLZT) having (111) preferred crystal orientation is provided. On the orientation control film 3, a layered piezoelectric film 10 which is made of a thin oxide film based on perovskite PZT having (111) preferred crystal orientation and the same size as the orientation control film 3 is provided. The layered piezoelectric film 10 includes a first thin piezoelectric film 4 and a second thin piezoelectric film 5 formed on the first thin piezoelectric film 4. The crystal orientation of the layered piezoelectric film 10 is controlled by the orientation control film 3. A 250 nm thick second electrode film 6 is provided on the layered piezoelectric film 10. Gold leads 9a and 9b of 0.1 mm in thickness are connected to the first and second electrode films 2 and 6, respectively. As shown in FIG. 20, the layered body 11 includes the first electrode film 2, orientation control film 3, layered piezoelectric film 10 and second electrode film 6.

Hereinafter, an explanation of features of the present embodiment will be provided.

Figure 22:
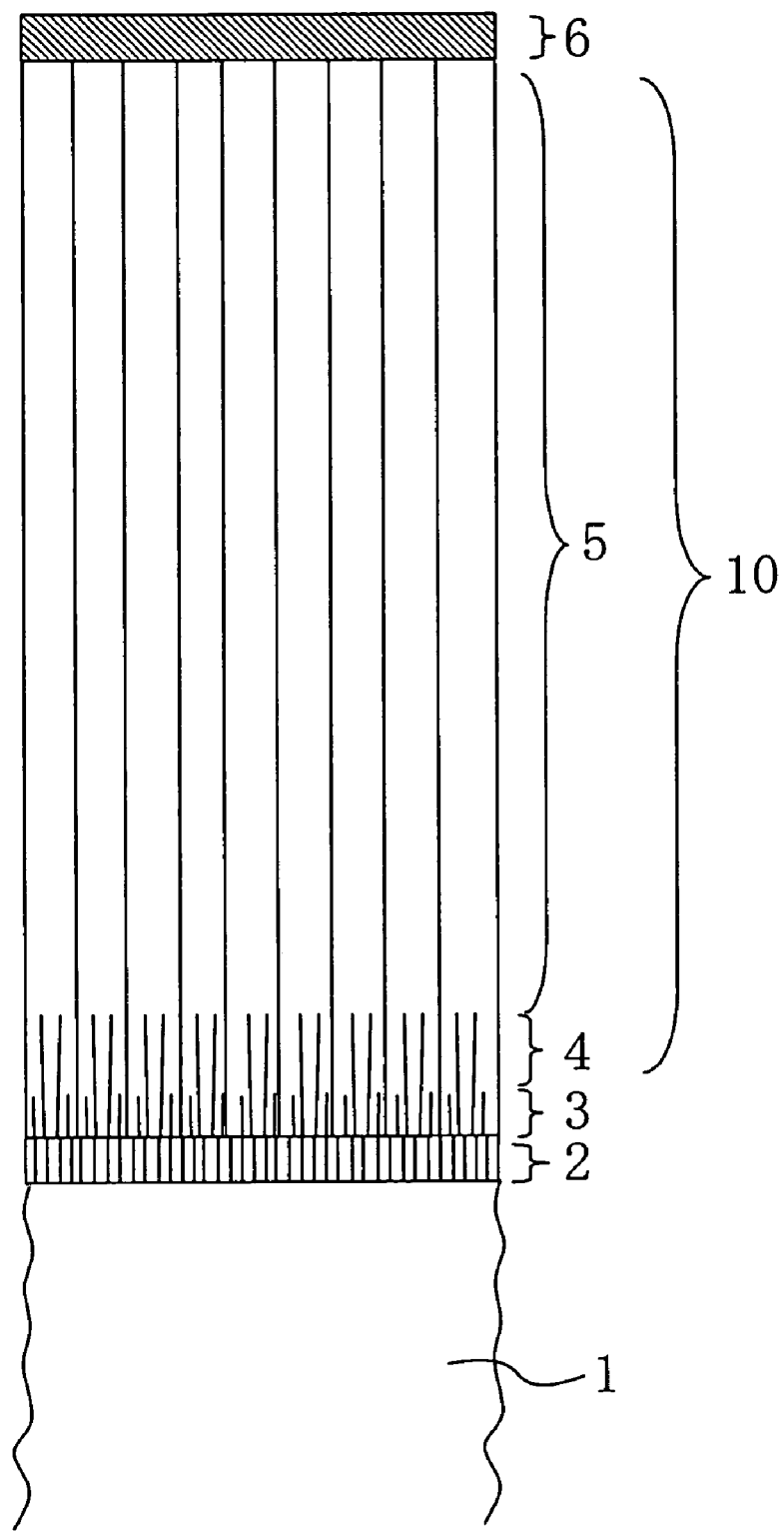
FIG. 22 is a schematic view illustrating the layered structure of a layered piezoelectric film according to Embodiment 5.

The orientation control film 3 is made of cubic or tetragonal perovskite oxide having preferred orientation along the (111) plane. The layered piezoelectric film 10 is made of rhombohedral or tetragonal perovskite oxide having preferred orientation along the (111) plane. The first and second thin piezoelectric films 4 and 5 are aggregates of columnar grains, respectively, which are continuously linked to each other (see FIG. 22). The columnar grains of the second thin piezoelectric film 5 have a larger average cross-sectional diameter than the average cross-sectional diameter of the columnar grains of the first thin piezoelectric film 4. The ratio of the thickness of the layered piezoelectric film 10 with respect to the average cross-sectional diameter of the columnar grains of the second thin piezoelectric film 5 is 20 to 60 inclusive.

The columnar grains of the first thin piezoelectric film 4 preferably have an average cross-sectional diameter of 40 nm to 70 nm inclusive and a length of 5 nm to 100nm inclusive. The columnar grains of the second thin piezoelectric film 5 preferably have an average cross-sectional diameter of 60 nm to 200 nm inclusive and a length of 2500 nm to 5000 nm inclusive.

The first and second thin piezoelectric films 4 and 5 are preferably made of oxide based on perovskite lead zirconate titanate. The first thin piezoelectric film 4 preferably has the degree of (111) crystal orientation of 50% to 80% inclusive.

The second thin piezoelectric film 5 preferably has the degree of (111) crystal orientation of 95% to 100% inclusive.

The chemical composition ratio of the layered piezoelectric film 10 is preferably represented as [Pb]:[Zr]:[Ti]=(1+a):b:(1−b). The first and second thin piezoelectric films 4 and 5 preferably have the same value b of 0.40 to 0.60 inclusive. The first thin piezoelectric film 4 preferably has a larger Pb content than the second thin piezoelectric film 5. The value a of the first thin piezoelectric film 4 is preferably 0.05 to 0.15 inclusive and the value a of the second thin piezoelectric film 5 is preferably 0 to 0.10 inclusive. The layered piezoelectric film 10 is preferably made of lead zirconate titanate added with at least one of magnesium and manganese. The addition amount is preferably more than 0 and not more than 10 mol %.

The orientation control film 3 is preferably made of oxide based on perovskite lead lanthanum zirconate titanate and the degree of (111) crystal orientation thereof is preferably 50% or more.

The chemical composition ratio of the orientation control film 3 is preferably represented as [Pb]:[La]:[Zr]:[Ti]=x×(1−z):z:y:(1−y). It is preferred that the value x is 1.0 to 1.20 inclusive, the value y is 0 to 0.20 inclusive and the value z is more than 0 and not more than 0.30. Alternatively, the orientation control film 3 is preferably made of lead lanthanum zirconate titanate added with at least one of magnesium and manganese. The addition amount is preferably more than 0 and not more than 10 mol %.

The first electrode film is preferably made of noble metal such as Pt, Ir, Pd or Ru or an alloy containing the noble metal. The first electrode film is preferably an aggregate of columnar grains having an average cross-sectional diameter of 20 nm to 30 nm inclusive.

When a voltage is applied between the first and second electrode films 2 and 6 via the leads 9a and 9b in the same manner as in Embodiment 1, the layered piezoelectric film 10 elongates along the direction of X indicated in FIG. 20 and the tip of the piezoelectric element 20 (the right end in FIG. 20) is displaced to the minus side in the direction of Z (toward the bottom in FIG. 20).

Hereinafter, referring to FIGS. 21A to 21E, a method for manufacturing the piezoelectric element 20 is described.

FIGS. 21A to 21E are views illustrating the steps of the method for manufacturing a piezoelectric element 20. First, as shown in FIG. 21A, a first electrode film 102 is formed on a substrate 101 of 20 mm in length, 20 mm in width and 0.30 mm in thickness by RF magnetron sputtering using a 0.2 mm thick stainless steel mask having a rectangular opening of 5.0 mm in width and 18.0 mm in length.

Then, an orientation control film 103 is formed precisely on the first electrode film 102 by RF magnetron sputtering using a 0.2 mm thick stainless steel mask having a rectangular opening of 5.0 mm in width and 12.0 mm in length. The step of forming the orientation control film 103 includes the step of providing the orientation control film 103 with (111) preferred orientation.

Then, a layered piezoelectric film 110 is formed precisely on the orientation control film 103 by RF magnetron sputtering using a 0.2 mm thick stainless steel mask having a rectangular opening of 5.0 mm in width and 12.0 mm in length. The layered piezoelectric film 110 is provided by forming a first thin piezoelectric film 104 on the orientation control film 103 by RF magnetron sputtering using a sintered PZT-based oxide target and forming a second thin piezoelectric film 105 on the first thin piezoelectric film 104 by RF magnetron sputtering in the same manner using the same target under different sputtering conditions. The structure of the layered piezoelectric film 110 is the same as the schematic structure of the layered piezoelectric film shown in FIG. 22. The step of forming the layered piezoelectric film 110 includes the step of providing the layered piezoelectric film 110 with (111) preferred orientation by the orientation control film 103.

Then, a second electrode film 106 is formed precisely on the layered piezoelectric film 110 by RF sputtering in the same manner as described above using the same stainless steel mask. Thus, a structure 121 including the substrate 101 and a layered body 111 is obtained as shown in FIG. 21B.

Then, as shown in FIG. 21C, the structure 121 is precisely cut into a strip of 3.0 mm in width and 15.0 mm in length with a dicing saw such that an end portion of the first electrode film 2 (a left end portion in FIG. 21C) is left exposed. As a result, a piezoelectric element component 22 including a substrate 1, a first electrode film 2, an orientation control film 3, a first thin piezoelectric film 4, a second thin piezoelectric film 5 and a second electrode film 6 as shown in FIG. 20 is provided. Then, an end portion of the substrate 1 (a left end portion in FIG. 21D) is adhered onto a stainless steel support substrate 7 with an epoxy-based adhesive 8 as shown in FIG. 21D.

Subsequently, a lead 9a is connected to an end portion of the first electrode film 2 (a left end portion in FIG. 21E) using a conductive adhesive made of silver paste and a lead 9b is connected to an end portion of the second electrode film 6 (a left end portion in FIG. 21E) with wire bonding. Thus, the piezoelectric element 20 shown in FIG. 20 is provided.

Hereinafter, more specific embodiments of the present invention will be described.

EXAMPLE 8

Silicon was used as the substrate. A thin iridium (Ir) film having a thickness of 100 nm was used as the first electrode film. In order to form the thin iridium film, the substrate was preheated at 400° C. in a ternary RF magnetron sputtering apparatus. Then, sputtering was carried out using a gas mixture of argon and oxygen (gas volume ratio $Ar:O_2=15:1$) as sputtering gas at a total gas pressure maintained at 0.25 Pa and a 4-inch diameter iridium target as a first target under a high frequency power of 200 W for 960 seconds.

A 40 nm thick lead lanthanum titanate (hereinafter referred to as PLT) film having (111) preferred orientation was used as the orientation control film. In order to form the thin PLT film, the substrate on which the first electrode film had been formed was preheated at 550° C. in the same ternary RF magnetron sputtering apparatus. Then, sputtering was carried out using a gas mixture of argon and oxygen (gas volume ratio $Ar:O_2=25:1$) as sputtering gas at a total gas pressure maintained at 0.5 Pa and a 4-inch diameter sintered PLT target having a stoichiometric composition prepared by excessively adding about 20 mol % of PbO (molar composition ratio Pb:La:Ti=1.10:0.10:1.0) as a second target under a high frequency power of 250 W for 3000 seconds.

A layered piezoelectric film was provided by forming a first thin piezoelectric film which is made of a 50 nm thick PZT film having (111) preferred orientation and a second thin piezoelectric film which is formed on the first piezoelectric film and made of a 3500 nm thick PZT film having (111) orientation. That is, the thickness of the layered piezoelectric film was 3550 mm.

The first and second thin piezoelectric films were formed using a RF magnetron sputtering apparatus. As a target, a 6-inch diameter sintered PZT target having a stoichiometric composition and prepared by excessively adding about 20 mol % of PbO was used (molar composition ratio Pb:Zr:Ti=1.20:0.53:0.47). Conditions for the film formation were as follows. First, in a deposition chamber with the PZT target placed therein, the substrate on which the first electrode film and the orientation control film had been formed was preheated at 580° C. Then, sputtering was carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 50 seconds to form a first thin piezoelectric film. Subsequently, the deposition was stopped and the mixing ratio of the sputtering gas was immediately changed to $Ar:O_2=79:1$. With the other conditions unchanged, a second thin piezoelectric film was formed by sputtering for 2900 seconds.

A thin platinum (Pt) film was used as the second electrode film. The thin platinum film was formed on the second thin piezoelectric film by RF sputtering.

In order to check the thickness, degree of (111) crystal orientation, composition and sectional structure of the orientation control film and the first thin piezoelectric film shown in FIG. 21B with accuracy, a sample on which the deposition was terminated after the orientation control film and the first thin piezoelectric film had been formed was also prepared. The surface of the sample was subjected to observation with a scanning electron microscope, X-ray diffraction analysis and composition analysis with an X-ray microanalyzer. After that, the sample was broken to observe the broken-out section with the scanning electron microscope.

Likewise, in order to check the thickness, degree of (111) crystal orientation, composition and sectional structure of the second thin piezoelectric film shown in FIG. 21B with accuracy, a sample on which the deposition was terminated after the second thin piezoelectric film had been formed was also prepared. The surface of the sample was subjected to observation with a scanning electron microscope, X-ray diffraction analysis and composition analysis with an X-ray microanalyzer. After that, the sample was broken to observe the broken-out section with the scanning electron microscope.

Further, using the structure shown in FIG. 21B as a sample, composition analysis of the layered piezoelectric film was carried out in the depth direction from the surface by Auger spectroscopic analysis. Moreover, the broken-out section of the layered piezoelectric film was also observed with the scanning electron microscope. FIG. 23A shows an enlargement of an electron micrograph of the broken-out section of the layered piezoelectric film and FIG. 23B shows a partially enlarged view of FIG. 23A.

As a result of the analyses and observations described above, the iridium electrode was found to be an aggregate of columnar grains having an average cross-sectional diameter of 20 nm. The orientation control film and the first and second thin piezoelectric films were present as aggregates of columnar grains, respectively, and continuously linked. The thickness of the orientation control film was 40 nm. The thickness of the first thin piezoelectric film was 50 nm and the columnar grains had an average cross-sectional diameter of 40 nm. The thickness of the second thin piezoelectric film was 3500 m and the columnar grains had an average cross-sectional diameter of 160 nm. The ratio of the thickness of the layered piezoelectric film to the average cross-sectional diameter of the columnar grains of the second thin piezoelectric film was 22.2.

As a result of the X-ray diffraction analysis, the orientation control film and the first and second thin piezoelectric films were found to have the perovskite crystal structures, respectively. The degree of (111) crystal orientation on the surface of the orientation control film was 50%, the degree of (111) crystal orientation on the surface of the first thin piezoelectric film was 70% and the degree of (111) crystal orientation on the surface of the second thin piezoelectric film was 98%. The degree of (111) crystal orientation of a PLT-based orientation control film and a thin PZT-based piezoelectric film obtained from the reflection intensities at the crystal planes in an X-ray diffraction pattern is defined as a percentage of a (111) peak intensity to the sum of every peak intensity attributed to the thin film when the scope of the X-ray diffraction is an interstitial spacing of 4.2 Å to 1.5 Å. Specifically, the degree of orientation is a percentage of a peak intensity attributed to the (111) plane to the sum of peak intensities at the (001), (100), (010), (110), (011), (101) and (111) planes appeared in the X-ray diffraction pattern of a thin PLT film, a thin PLZT film or a thin PZT film.

Further, as a result of composition analysis on cation using the X-ray microanalyzer, the orientation control film was found to have the composition ratio of Pb:La:Ti=1.05:0.10:0.98, while the first and second thin piezoelectric films were found to have the composition ratios of Pb:Zr:Ti=1.15:0.53:0.47 and Pb:Zr:Ti=1.10:0.53:0.47, respectively. Specifically, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film. In other words, the first and second thin piezoelectric films were aggregates of columnar grains which had grown along the thickness direction of the layered piezoelectric film.

Figure 24:
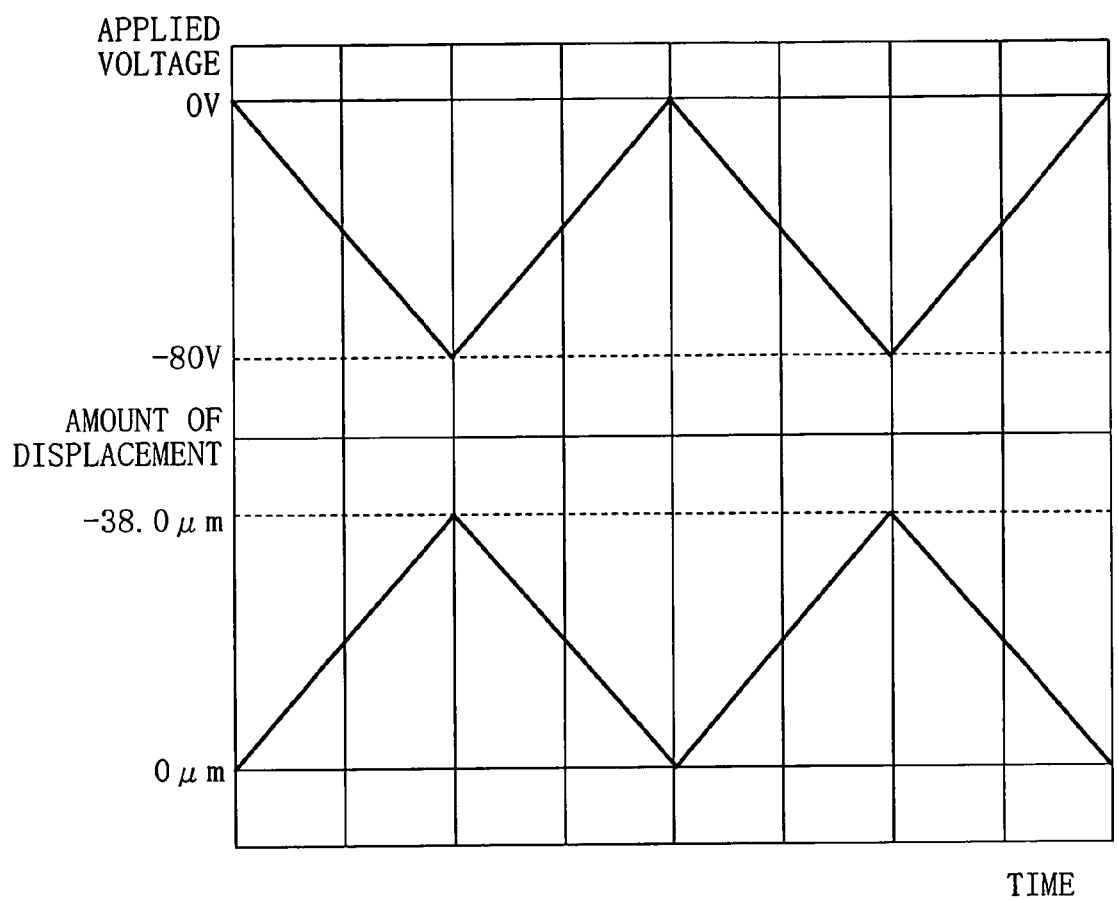
FIG. 24 is a graph illustrating the amount of displacement of up-and-down movement of the tip of a piezoelectric element according to Example 8 of Embodiment 5 in the Z direction when a voltage at a frequency of 2 kHz is applied.

In order to measure the amount of displacement of the up-and-down movement of the tip of the piezoelectric element 20 in the Z direction using a laser Doppler vibrometer, a triangle wave voltage of 0 to −80 V was applied between the first and second electrode films 2 and 6 of the piezoelectric element 20 via the leads 9a and 9b. FIG. 24 is a graph illustrating the amount of displacement of the up-and-down movement of the tip of the piezoelectric element 20 in the Z direction upon application of a voltage at a frequency of 2 kHz. As shown in FIG. 24, when a voltage of 0 to −80 V was applied, the tip of the piezoelectric element 20 was displaced by 38.0 μm at the maximum. Subsequently, the piezoelectric element 20 was driven by the triangle wave voltage to make up-and-down movement one hundred million times (driven for 13.9 hours) and one billion times (driven for 138.9 hours) to examine change of the movement of the piezoelectric element 20, and then the appearance of the piezoelectric element 20 was observed using an optical microscope. Even after the one billion time movements, the maximum displacement was 38.0 μm. The films of the piezoelectric element 20 did not come off and cracks were not caused.

EXAMPLE 9

High-temperature resistant Pyrex (registered trademark) glass was used as the substrate. A 150 nm thick platinum (Pt) film was used as the first electrode film. In order to form the thin platinum film, the substrate was preheated at 400° C. in a ternary RF magnetron sputtering apparatus. Then, sputtering was carried out using a gas mixture of argon and oxygen (gas volume ratio Ar:O$_2$=15:1) as sputtering gas at a total gas pressure maintained at 0.25 Pa and a platinum target as a first target under a high frequency power of 200 W for 1080 seconds.

A 50 nm thick PLZT film having (111) preferred orientation was used as the orientation control film. In order to form the thin PLZT film, the substrate on which the first electrode film had been formed was preheated at 550° C. in the same ternary RF magnetron sputtering apparatus. Then, sputtering was carried out using a gas mixture of argon and oxygen (gas volume ratio Ar:O$_2$=25:0.5) as sputtering gas at a total gas pressure maintained at 1.0 Pa and a 4-inch diameter sintered PLZT target having a stoichiometric composition prepared by excessively adding about 20 mol % of PbO (molar composition ratio Pb:La:Zr:Ti=1.15:0.05:0.10:0.90) as a second target under a high frequency power of 250 W for 3600 seconds.

A layered piezoelectric film was provided by forming a first thin piezoelectric film made of a 100 nm thick PZT film having (111) preferred orientation and a second thin piezoelectric film made of a 5000 nm thick PZT film having (111) crystal orientation. That is, the thickness of the layered piezoelectric film was 5100 nm.

In the same manner as Example 8, the first and second thin piezoelectric films were formed using a RF magnetron sputtering apparatus. As a target, a 6-inch diameter sintered PZT target having a stoichiometric composition prepared by excessively adding about 10 mol % of PbO was used (molar composition ratio Pb:Zr:Ti=1.10:0.50:0.50). Conditions for the film deposition were as follows. First, in a deposition chamber with the PZT target placed therein, the substrate on which the first electrode film and the orientation control film had been formed was preheated at 550° C. Then, sputtering was carried out using a gas mixture of argon and oxygen in the mixing ratio of Ar:O$_2$=79:1 as sputtering gas at a gas pressure of 0.2 Pa, a flow rate of 40 ml per minute and plasma generating power of 2 kW for 60 seconds to form the first thin piezoelectric film. Subsequently, the deposition was stopped and the temperature of the substrate was changed to 590° C. and the plasma generating power was changed to 3 kW. With the other conditions unchanged, the second thin piezoelectric film was formed by sputtering for 3800 seconds.

As a result of the analyses and observations carried out in the same manner as in Example 8, the platinum electrode was found to be an aggregate of columnar grains having an average cross-sectional diameter of 30 nm. The orientation control film and the first and second thin piezoelectric films were present as aggregates of columnar grains, respectively, and continuously linked. The thickness of the orientation control film was 50 nm. The thickness of the first thin piezoelectric film was 100 nm and the columnar grains had an average cross-sectional diameter of 40 nm. The thickness of the second thin piezoelectric film was 5000 nm and the columnar grains had an average cross-sectional diameter of 85 nm. The ratio of the thickness of the layered piezoelectric film to the average cross-sectional diameter of the columnar grains of the second thin piezoelectric film was 60.0.

As a result of the X-ray diffraction analysis, the orientation control film and the first and second thin piezoelectric films were found to have the perovskite crystal structure. The degree of (111) crystal orientation on the surface of the orientation control film was 60%, the degree of (111) crystal orientation on the surface of the first thin piezoelectric film was 70% and the degree of (111) crystal orientation on the surface of the second thin piezoelectric film was 95%.

Further, as a result of composition analysis on cation using the X-ray microanalyzer, the orientation control film was found to have the composition ratio of Pb:La:Zr:Ti=1.08:0.05:0.12:0.88. The first and second thin piezoelectric films were found to have the composition ratios of Pb:Zr:Ti=1.15:0.51:0.49 and Pb:Zr:Ti=1.00:0.51:0.49, respectively. Specifically, similarly to Example 8, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 8, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 35.2 µm at the maximum. Even after one billion time movements, the maximum displacement was unchanged. The films of the piezoelectric element 20 did not come off and cracks were not caused.

EXAMPLE 10

A mirror-polished, heat-resistant stainless steel plate was used as the substrate. A 110 nm thick iridium (Ir) alloy film containing titanium (Ti) was used as the first electrode film. In order to form the thin alloy film, the substrate was preheated at 400° C. in a ternary RF magnetron sputtering apparatus. Then, sputtering was carried out for 960 seconds using a gas mixture of argon and oxygen (gas volume ratio $Ar:O_2=16:1$) as sputtering gas at a total gas pressure maintained at 0.25 Pa, an iridium target as a first target under a high frequency power of 200 W and a titanium target as a second target under a high frequency power of 60 W. The purpose of adding titanium to iridium is to improve adhesion of the electrode film to the substrate. Even if titanium is not added, there is no effect on the property of the piezoelectric element.

A 20 nm thick PLT film having (111) preferred orientation was used as the orientation control film. In order to form the thin PLT film, the substrate on which the first electrode film had been formed was preheated at 600° C. in the same ternary RF magnetron sputtering apparatus. Then, sputtering was carried out using a gas mixture of argon and oxygen (gas volume ratio $Ar:O_2=25:0.2$) as sputtering gas at a total gas pressure maintained at 1.0 Pa and a 4-inch diameter sintered PLT target having a stoichiometric composition prepared by excessively adding about 10 mol % of PbO (molar composition ratio Pb:La:Ti=0.90:0.20:1.0) as a third target under a high frequency power of 250 W for 1200 seconds.

A layered piezoelectric film was provided by forming a first thin piezoelectric film made of a 100 nm thick PZT film having (111) preferred orientation and added with 10 mol % of Mg and a second thin piezoelectric film made of a 3900 nm thick (PZT+Mg) film having (111) crystal orientation. That is, the thickness of the layered piezoelectric film was 4000 nm.

In the same manner as Example 8, the first and second thin piezoelectric films were formed using a RF magnetron sputtering apparatus. As a target, a 6-inch diameter sintered lead zirconate titanate (PZT+Mg) target having a stoichiometric composition prepared by excessively adding about 10 mol % of PbO and further adding 10 mol % of Mg was used (molar composition ratio Pb:Zr:Ti:Mg=1.10:0.60:0.40:0.10). Conditions for the film deposition were as follows. First, in a deposition chamber with the PZT target placed therein, the substrate on which the first electrode film and the orientation control film had been formed was preheated at 570° C. Then, sputtering was carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 100 seconds to form the first thin piezoelectric film. Subsequently, the deposition was stopped and the mixing ratio of the sputtering gas was immediately changed to $Ar:O_2=79:1$. With the other conditions unchanged, the second thin piezoelectric film was formed by sputtering for 2500 seconds.

As a result of the analyses and observations carried out in the same manner as in Example 8, the first electrode film was found to be a thin iridium film containing 1 mol % of titanium and constituted of an aggregate of columnar grains having an average cross-sectional diameter of 20 nm. The orientation control film and the first and second thin piezoelectric films were present as aggregates of columnar grains, respectively, and continuously linked. The thickness of the orientation control film was 20 nm. The thickness of the first thin piezoelectric film was 100 nm and the columnar grains had an average cross-sectional diameter of 70 nm. The thickness of the second thin piezoelectric film was 3900 nm and the columnar grains had an average cross-sectional diameter of 200 nm. The ratio of the thickness of the layered piezoelectric film to the average cross-sectional diameter of the columnar grains of the second thin piezoelectric film was 20.0.

As a result of the X-ray diffraction analysis, the orientation control film and the first and second thin piezoelectric films were found to have the perovskite crystal structure. The degree of (111) crystal orientation on the surface of the orientation control film was 70%, the degree of (111) crystal orientation on the surface of the first thin piezoelectric film was 80% and the degree of (111) crystal orientation on the surface of the second thin piezoelectric film was 100%.

Further, as a result of composition analysis on cation using the X-ray microanalyzer, the orientation control film was found to have the composition ratio of Pb:La:Ti=0.85:0.22:0.95. The first and second thin piezoelectric films were found to have the composition ratios of Pb:Zr:Ti:Mg=1.05:0.60:0.40:0.09 and Pb:Zr:Ti:Mg=1.00:0.60:0.40:0.10, respectively. Specifically, similarly to Example 8, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 8, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 38.3 µm at the maximum. Even after one billion time movements, the maximum displacement was unchanged. The films of the piezoelectric element 20 did not come off and cracks were not caused.

EXAMPLE 11

Mirror-polished ceramic material (alumina) was used for the substrate. A 120 nm thick ruthenium (Ru) alloy film containing nickel (Ni) was used as the first electrode film. In order to form the thin alloy film, the substrate was preheated at 400° C. in a ternary RF magnetron sputtering apparatus. Then, sputtering was carried out for 960 seconds using a gas mixture of argon and oxygen (gas volume ratio $Ar:O_2=16:1$) as sputtering gas at a total gas pressure maintained at 0.25 Pa, a ruthenium target as a first target under a high frequency power of 200 W and a nickel target as a second target under a high frequency power of 60 W. The purpose of adding nickel to ruthenium is to improve adhesion of the electrode film to the substrate. Even if nickel is not added, there is no effect on the property of the resulting piezoelectric element.

A 60 nm thick PLZT film having (111) preferred orientation was used as the orientation control film. In order to form the thin PLZT film, the substrate on which the first electrode film had been formed was preheated at 650° C. in the same ternary RF magnetron sputtering apparatus. Then, sputtering was carried out using a gas mixture of argon and oxygen (gas volume ratio $Ar:O_2=25:1.0$) as sputtering gas at a total gas pressure maintained at 0.5 Pa and a 4-inch diameter sintered PLZT target having a stoichiometric composition prepared by excessively adding about 20 mol % of PbO (molar composition ratio Pb:La:Zr:Ti=1.10:0.10:0.20:0.80) as a third target under a high frequency power of 250 W for 3600 seconds.

A layered piezoelectric film was provided by forming a first thin piezoelectric film made of a 5 nm thick PZT film having (111) preferred orientation and added with 5 mol % of Mn and a second thin piezoelectric film made of a 2500 nm thick (PZT+Mn) film having (111) crystal orientation. That is, the thickness of the layered piezoelectric film was 2505 nm.

In the same manner as Example 8, the first and second thin piezoelectric films were formed using a RF magnetron sputtering apparatus. As a target, a 6-inch diameter sintered PZT target having a stoichiometric composition prepared by excessively adding about 20 mol % of PbO and further adding 5 mol % of Mn was used (molar composition ratio Pb:Zr:Ti:Mn=1.20:0.40:0.60:0.05). Conditions for the film deposition were as follows. First, in a deposition chamber with the (PZT+Mn) target placed therein, the substrate on which the first electrode film and the orientation control film had been formed was preheated at 550° C. Then, sputtering was carried out using a gas mixture of argon and oxygen in the mixing ratio of $Ar:O_2=79:1$ as sputtering gas at a gas pressure of 0.2 Pa, a flow rate of 40 ml per minute and plasma generating power of 2 kW for 5 seconds to form the first thin piezoelectric film. Subsequently, the deposition was stopped and the temperature of the substrate was changed to 580° C. and the plasma generating power was changed to 3 kW. With the other conditions unchanged, the second thin piezoelectric film was formed by sputtering for 2000 seconds.

As a result of the analyses and observations carried out in the same manner as in Example 8, the first electrode film was found to be a thin ruthenium film containing 4 mol % of nickel and constituted of an aggregate of columnar grains having an average cross-sectional diameter of 25 mm. The orientation control film and the first and second thin piezoelectric films were present as aggregates of columnar grains, respectively, and continuously linked. The thickness of the orientation control film was 60 nm. The thickness of the first thin piezoelectric film was 5 nm and the columnar grains had an average cross-sectional diameter of 40 nm. The thickness of the second thin piezoelectric film was 2500 nm and the columnar grains had an average cross-sectional diameter of 60 nm. The ratio of the thickness of the layered piezoelectric film to the average cross-sectional diameter of the columnar grains of the second thin piezoelectric film was 41.7.

As a result of the X-ray diffraction analysis, the orientation control film and the first and second thin piezoelectric films were found to have the perovskite crystal structure. The degree of (111) crystal orientation on the surface of the orientation control film was 75%, the degree of (111) crystal orientation on the surface of the first thin piezoelectric film was 80% and the degree of (111) crystal orientation on the surface of the second thin piezoelectric film was 99%.

Further, as a result of composition analysis on cation using the X-ray microanalyzer, the orientation control film was found to have the composition ratio of Pb:La:Zr:Ti=1.05:0.10:0.22:0.78. The first and second thin piezoelectric films were found to have the composition ratios of Pb:Zr:Ti:Mn=1.10:0.40:0.60:0.05 and Pb:Zr:Ti:Mn=1.05:0.40:0.60:0.05, respectively. That is, similarly to Example 8, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 8, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 32.7 μm at the maximum. Even after one billion time movements, the maximum displacement was unchanged. The films of the piezoelectric element 20 did not come off and cracks were not caused.

EXAMPLE 12

Silicon was used as the substrate. A 120 nm thick palladium (Pd) film was used as the first electrode film. In order to form the thin palladium film, the substrate was preheated at 500° C. in a ternary RF magnetron sputtering apparatus. Then, sputtering was carried out using a gas mixture of argon and oxygen (gas volume ratio $Ar:O_2=16:1$) as sputtering gas at a total gas pressure maintained at 0.25 Pa and a palladium target as a first target under a high frequency power of 200 W for 960 seconds.

A 40 nm thick PLT film having (111) preferred orientation was used as the orientation control film. In order to form the thin PLT film, the substrate on which the first electrode film had been formed was preheated at 600° C. in the same ternary RF magnetron sputtering apparatus. Then, sputtering was carried out using a gas mixture of argon and oxygen (gas volume ratio $Ar:O_2=25:0.2$) as sputtering gas at a total gas pressure maintained at 1.0 Pa and a 4-inch diameter sintered PLT target having a stoichiometric composition prepared by excessively adding about 20 mol % of PbO (molar composition ratio Pb:La:Ti=0.90:0.30:1.0) as a second target under a high frequency power of 250 W for 2400 seconds.

A layered piezoelectric film was provided by forming a first thin piezoelectric film made of a 80 nm thick PZT film having (111) preferred orientation and a second thin piezoelectric film made of a 4500 nm thick PZT film having (111) crystal orientation. That is, the thickness of the layered piezoelectric film was 4580 nm.

In the same manner as Example 8, the first and second thin piezoelectric films were formed using a RF magnetron sputtering apparatus. As a target, a 6-inch diameter sintered PZT target having a stoichiometric composition prepared by excessively adding about 20 mol % of PbO was used (molar composition ratio Pb:Zr:Ti=1.20:0.58:0.42). Conditions for the film deposition were as follows. First, in a deposition chamber with the PZT target placed therein, the substrate on which the first electrode film and the orientation control film had been formed was preheated at 580° C. Then, sputtering was carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 75 seconds to form the first thin piezoelectric film. Subsequently, the deposition was stopped and the mixing ratio of the sputtering gas was immediately changed to Ar:O$_2$=79:1. With the other conditions unchanged, the second thin piezoelectric film was formed by sputtering for 3700 seconds.

As a result of the analyses and observations carried out in the same manner as in Example 8, the first electrode film was found to be an aggregate of columnar grains having an average cross-sectional diameter of 20 nm. The orientation control film and the first and second thin piezoelectric films were present as aggregates of columnar grains, respectively, and continuously linked. The thickness of the orientation control film was 40 nm. The thickness of the first thin piezoelectric film was 80 nm and the columnar grains had an average cross-sectional diameter of 50 nm. The thickness of the second thin piezoelectric film was 4500 nm and the columnar grains had an average cross-sectional diameter of 150 nm. The ratio of the thickness of the layered piezoelectric film to the average cross-sectional diameter of the columnar grains of the second thin piezoelectric film was 30.5.

As a result of the X-ray diffraction analysis, the orientation control film and the first and second thin piezoelectric films were found to have the perovskite crystal structure. The degree of (111) crystal orientation on the surface of the orientation control film was 55%, the degree of (111) crystal orientation on the surface of the first thin piezoelectric film was 70% and the degree of (111) crystal orientation on the surface of the second thin piezoelectric film was 98%.

Further, as a result of composition analysis on cation using the X-ray microanalyzer, the orientation control film was found to have the composition ratio of Pb:La:Ti=0.82:0.28:0.98. The first and second thin piezoelectric films were found to have the composition ratios of Pb:Zr:Ti=1.10:0.58:0.42 and Pb:Zr:Ti=1.05:0.58:0.42, respectively. That is, similarly to Example 8, the first and second thin piezoelectric films were perovskite PZT films which had grown to have preferred orientation along the (111) axis perpendicular to the substrate surface. The first and second thin piezoelectric films showed the same composition ratios of Zr and Ti, while the first thin piezoelectric film showed the composition ratio of Pb higher than that in the second thin piezoelectric film.

In the same manner as in Example 8, a triangle wave voltage of 0V to −80V was applied to the piezoelectric element 20 of the present example at a frequency of 2 kHz to measure the amount of displacement of the up-and-down movement of the tip of the piezoelectric element 20 in the Z direction. The tip of the piezoelectric element 20 was displaced by 31.5 μm at the maximum. Even after one billion time movements, the maximum displacement was unchanged. The films of the piezoelectric element 20 did not come off and cracks were not caused.

In Examples 8 to 12, a thin PZT film made of ternary oxide of Pb, Zr and Ti or the ternary oxide added with Mg or Mn is used as the layered piezoelectric film. However, a PZT film containing La (i.e., a PLZT film) or a PZT film containing Nb or Mg ions may also be used. As long as a thin perovskite oxide film is used, the layered piezoelectric film as described in Examples 8 to 12 is obtained.

COMPARATIVE EXAMPLE 3

For comparison with Examples 8 to 12, a piezoelectric element was fabricated as described below.

A piezoelectric element was formed in the same manner as Example 8 except that only the second thin piezoelectric film was formed on the orientation control film in place of the layered piezoelectric film.

The surface of the comparative sample was subjected to observation with a scanning electron microscope, X-ray diffraction analysis and composition analysis with an X-ray microanalyzer as described above. After that, the sample was broken to observe the broken-out section with the scanning electron microscope.

As a result of the above-described analyses and observations, the orientation control film and the thin piezoelectric film of the present comparative example were present as aggregates of columnar grains, respectively. The thickness of the thin piezoelectric film was 3500 nm and the columnar grains had an average cross-sectional diameter of 230 nm. The ratio of the thickness of the thin piezoelectric film to the average cross-sectional diameter of the columnar grains of the thin piezoelectric film was 15.2.

As a result of the X-ray diffraction analysis, both the orientation control film and the thin piezoelectric film of the present comparative example were found to have the perovskite crystal structure. The degree of (111) crystal orientation on the surface of the orientation control film was 50% and the degree of (111) crystal orientation on the surface of the thin piezoelectric film was 65%.

Further, as a result of composition analysis on cation using the X-ray microanalyzer, the composition ratio of the orientation control film of the present comparative example was Pb:La:Ti=1.05:0.10:0.98 and the composition ratio of the thin piezoelectric film was Pb:Zr:Ti=1.05:0.53:0.47.

As a result of composition analysis of the thin piezoelectric film in the depth direction from the surface thereof by Auger spectroscopic analysis, Zr and Ti were distributed uniformly from the interface with the second electrode film to the interface with the orientation control film.

Specifically, the present comparative example is the same as Example 8 in that the thin piezoelectric film was a perovskite PZT film which had grown as an aggregate of columnar grains in the direction perpendicular to the substrate surface. However, the average cross-sectional diameter of the columnar grains of the comparative thin piezoelectric film was larger than that of Example 8 and the degree of (111) crystal orientation was lower than that of Example 8.

In the same manner as Example 8, a triangle wave voltage of 0V to −80V was applied to the piezoelectric element of the present comparative example at a frequency of 2 kHz to measure the amount of displacement of the up-and-down movement of the tip of the piezoelectric element in the Z direction. The tip of the piezoelectric element was displaced by 20.0 μm at the maximum. Further, the piezoelectric element was driven by the triangle wave voltage to make the up-and-down movement one hundred million times to examine change of the movement of the piezoelectric element, and then the appearance of the piezoelectric element was observed through an optical microscope. As a result, the maximum displacement was reduced to 5.5 μm and the orientation control film partially came off the first electrode film.

COMPARATIVE EXAMPLE 4

For comparison with Examples 8 to 12, a piezoelectric element was fabricated as described below.

A piezoelectric element was formed in the same manner as Example 12 except that only the second thin piezoelectric film was formed on the first electrode film made of a thin palladium film in place of the orientation control film and the layered piezoelectric film.

The surface of the comparative sample was subjected to observation with a scanning electron microscope, X-ray diffraction analysis and composition analysis with an X-ray microanalyzer as described above. After that, the sample was broken to observe the broken-out section with the scanning electron microscope.

As a result of the above-described analyses and observations, the thin piezoelectric film of the present comparative example was present as an aggregate of columnar grains. The thickness of the thin piezoelectric film was 4500 nm and the columnar grains had an average cross-sectional diameter of 300 nm. The ratio of the thickness of the thin piezoelectric film to the average cross-sectional diameter of the columnar grains of the thin piezoelectric film was 15.0.

As a result of the X-ray diffraction analysis, the thin piezoelectric film of the present comparative example had the perovskite crystal structure. The degree of (111) crystal orientation of the thin piezoelectric film was 30%.

Further, as a result of composition analysis on cation using the X-ray microanalyzer, the composition ratio of the thin piezoelectric film of the present comparative example was Pb:Zr:Ti=1.05:0.53:0.47.

As a result of composition analysis of the thin piezoelectric film in the depth direction from the surface thereof by Auger spectroscopic analysis, Zr and Ti were distributed uniformly from the interface with the second electrode film to the interface with the first electrode film. In a portion of the thin piezoelectric film having a length of 10 nm from the interface with the first electrode film, the amount of Pb was slightly reduced (about 1/20 of the overall Pb distribution in the thin piezoelectric film). It is presumed that this phenomenon was caused by a trace amount of Pb which was diffused into the first electrode film, though it is impossible to confirm with the precision of the Auger spectroscopic analysis.

Specifically, the present comparative example is the same as Example 12 in that the thin piezoelectric film was a perovskite PZT film which had grown as an aggregate of columnar grains in the direction perpendicular to the substrate surface. However, the comparative example was different from Example 12 in that the average cross-sectional diameter of the columnar grains of the comparative thin piezoelectric film was larger than that of Example 12, the degree of (111) crystal orientation of the thin piezoelectric film was smaller than that of Example 12, the Pb distribution in the neighborhood of the interface with the first electrode film was the same as that in the overall Pb distribution, while the Pb distribution at the interface with the first electrode film was slightly lowered.

In the same manner as Example 12, a triangle wave voltage of 0V to −80V was applied to the piezoelectric element of the present comparative example at a frequency of 2 kHz to measure the amount of displacement of the up-and-down movement of the tip of the piezoelectric element in the Z direction. The tip of the piezoelectric element was displaced by 12.0 μm at the maximum. Further, the piezoelectric element was driven by the triangle wave voltage to make the up-and-down movement one billion times to examine change of the movement of the piezoelectric element, and then the appearance of the piezoelectric element was observed through an optical microscope. After that, the movement was stopped and the thin piezoelectric film came off the first electrode film.

Embodiment 6

The present embodiment is an inkjet head including the piezoelectric element of Embodiment 5 of the present invention. Hereinafter, an explanation of the inkjet head will be provided.

The inkjet head 201 according to Embodiment 6 of the present invention includes 10 ink dischargers 202 and a driving power source 203 which is connected to individual electrodes 33 for the ink dischargers 201 to drive the ink dischargers 201. The ink dischargers 202 are the same as those of Embodiment 2 except that the ink dischargers 202 include an actuator component B provided with a piezoelectric element similar to the piezoelectric element 20 of Embodiment 5 (see FIG. 6).

Hereinafter, a more specific explanation of the actuator component B will be provided.

EXAMPLE 13

Figure 25:
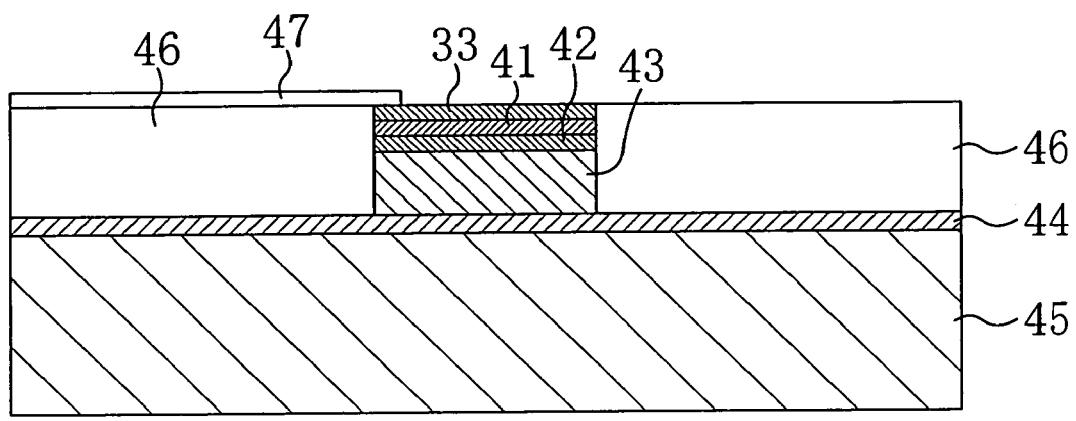
FIG. 25 is a view corresponding to the sectional view taken along the line VIII-VIII of FIG. 7 illustrating an actuator component according to Example 13 of Embodiment 6.

An explanation of the actuator component B is provided with reference to FIG. 25. FIG. 25 corresponds to the sectional view cut along the line VIII-VIII of FIG. 7 and illustrates the actuator component B according to Example 13 of Embodiment 6. As shown in FIG. 25, the actuator component B includes an individual electrode (first electrode film) 33 made of a 100 nm thick iridium (Ir) film, an orientation control film 41 which is positioned immediately below the individual electrode 33 and made of a 40 nm thick PLT film represented as $Pb_{1.10}La_{0.10}Ti_{1.00}O_3$, a first thin piezoelectric film 42 which is positioned immediately below the orientation film 41 and made of a 50 nm thick PZT film represented as $Pb_{1.15}Zr_{0.53}Ti_{0.48}O_3$, a second thin piezoelectric film 43 which is positioned immediately below the first thin piezoelectric film 42 and made of a 3500 nm thick PZT film represented as $Pb_{1.10}Zr_{0.53}Ti_{0.47}O_3$, a second electrode film 44 which is positioned immediately below the second thin piezoelectric film 43 and made of a 100 nm thick platinum film and a diaphragm layer (diaphragm plate) 45 which is positioned immediately below the second electrode film 44 and made of a 3500 nm thick chromium (Cr) film. The diaphragm layer 45 is displaced by the piezoelectric effect of the first and second thin piezoelectric films 42 and 43 to cause vibration. The second electrode film 44 and the diaphragm layer 45 are shared by the pressure chambers 32 of the ink dischargers 202. The orientation control film 41 and the first and second thin piezoelectric films 42 and 43 are in the same shape as the individual electrode 33. A layered film formed of the individual electrode 33, the orientation control film 41 and the first and second thin piezoelectric films 42 and 43 on the second electrode film 44 is surrounded by an electrically insulating organic film 46 made of a polyimide resin and has the same thickness as the layered film. On the electrically insulating organic film 46, a lead electrode film 47 which is made of a 100 nm thick gold film in the form of a lead wire is formed and connected to the individual electrode 33. A piezoelectric element is achieved by the individual electrode 33, the orientation control film 41 and the layered piezoelectric film including the first and second thin piezoelectric films 42 and 43 and the second electrode film 44. The piezoelectric element is the same as the piezoelectric element 20 of Embodiment 5. Thus, the actuator component B is obtained with high performance.

Hereinafter, a method for manufacturing the actuator component B will be described.

FIGS. 26A to 26E and 26A to 26D illustrate the steps of the method for manufacturing the actuator component B. First, on a silicon substrate 51 of 20 mm in length, 20 mm in width and 0.3 mm in thickness, a first electrode film 52, an orientation control film 53, a first thin piezoelectric film 54, a second thin piezoelectric film 55 and a second electrode film 44 are stacked in this order in the same manner as Example 8 of Embodiment 5. Thus, a structure 56 shown in FIG. 26A is achieved.

Then, as shown in FIG. 26B, a diaphragm layer 45 made of a 3500 nm thick chromium (Cr) film is formed on the structure 56 by RF sputtering at a room temperature.

Then, the diaphragm layer 45 is adhered to a pressure chamber component 58 made of glass using an acrylic resin adhesive 57 as shown in FIG. 26C. The pressure chamber component 58 is arranged to face the diaphragm layer 45 with the adhesive 57 interposed therebetween.

Then, the silicon substrate 51 is removed by dry etching using $SF_6$ gas as shown in FIG. 26D in a plasma etching apparatus.

Figure 27:
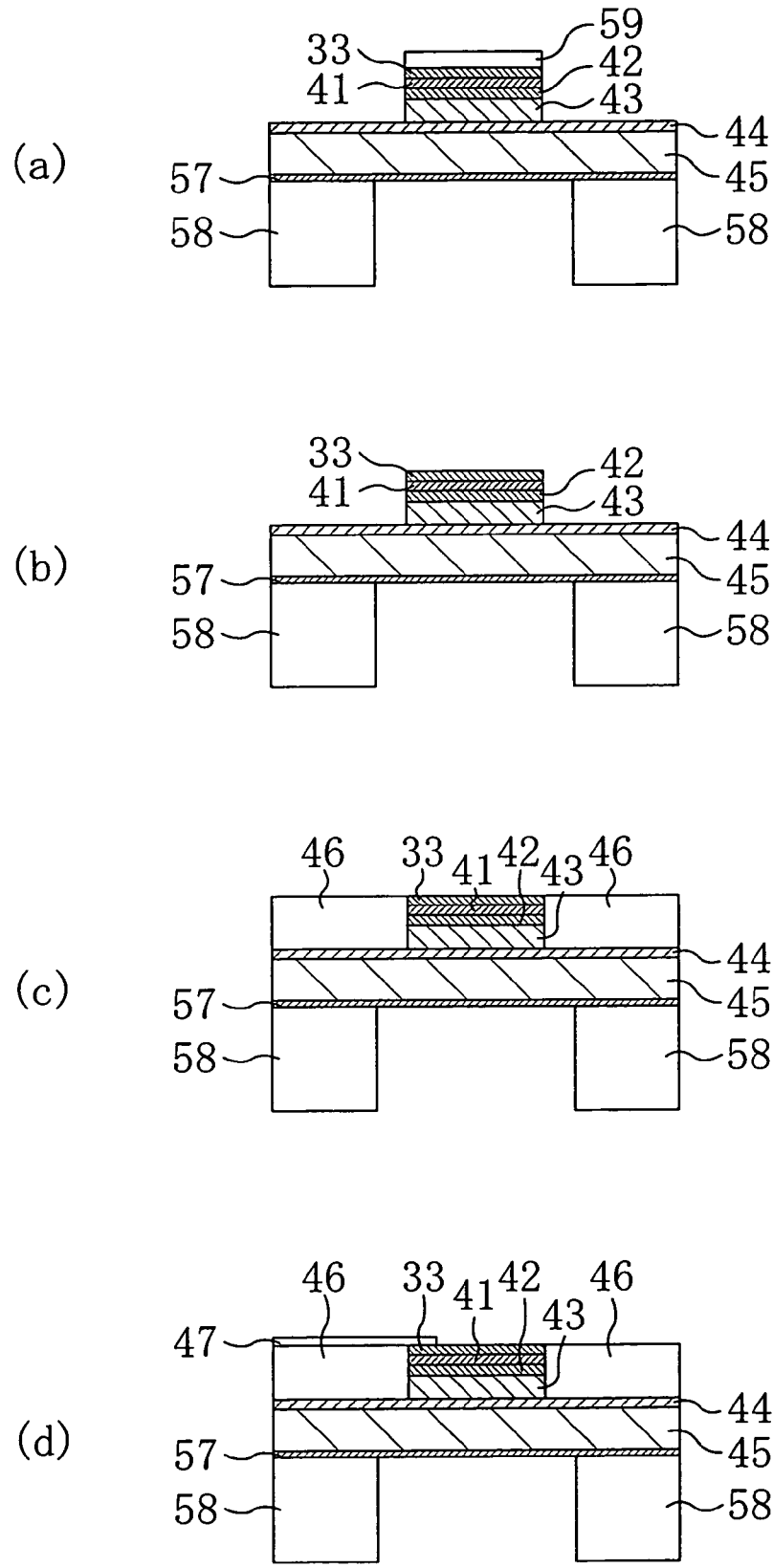
FIGS. 27A to 27D are views illustrating some of the steps of the method for manufacturing the actuator component according to Example 13 of Embodiment 6.

Subsequently, as shown in FIG. 26E, a resin photoresist film 59 is formed and patterned with accuracy such that the first electrode film 52, the orientation control film 53 and the layered film including the first and second thin piezoelectric films 54 and 55 are shaped into an oval having a shorter axis of 180 μm and a longer axis of 380 μm. Then, etching is carried out by dry etching using Ar gas and wet etching using weak hydrogen fluoride. Thus, an actuator structure having a layered film including the individual electrode 33, orientation control film 41, first thin piezoelectric film 42 and second thin piezoelectric film 43 as shown in FIG. 27A is obtained. Subsequently, the resin photoresist film 59 is removed by treatment with a resist remover as shown in FIG. 27B.

Then, as shown in FIG. 27C, an electrically insulating organic film 46 is formed on the second thin piezoelectric film 42 by printing. Further, a lead electrode film 47 is formed on the electrically insulating organic film 46 by DC sputtering as shown in FIG. 27D. Thus, an actuator component B as shown in FIG. 25 is obtained.

30 ink dischargers 202 were fabricated by the method of the present example. A sine wave voltage of 0V to −60V was applied between the two electrode films 33 and 44 of each of the ink dischargers 202 at a frequency of 200 Hz to examine change of the up-and-down movement as described above. Even after one billion time movements, no failure was occurred in all the ink dischargers 202.

Using 10 of the ink dischargers 202, inkjet heads 201 as shown in FIG. 6 were fabricated. The inkjet heads 201 offered the same effect as described in Example 6.

EXAMPLE 14

Figure 28:
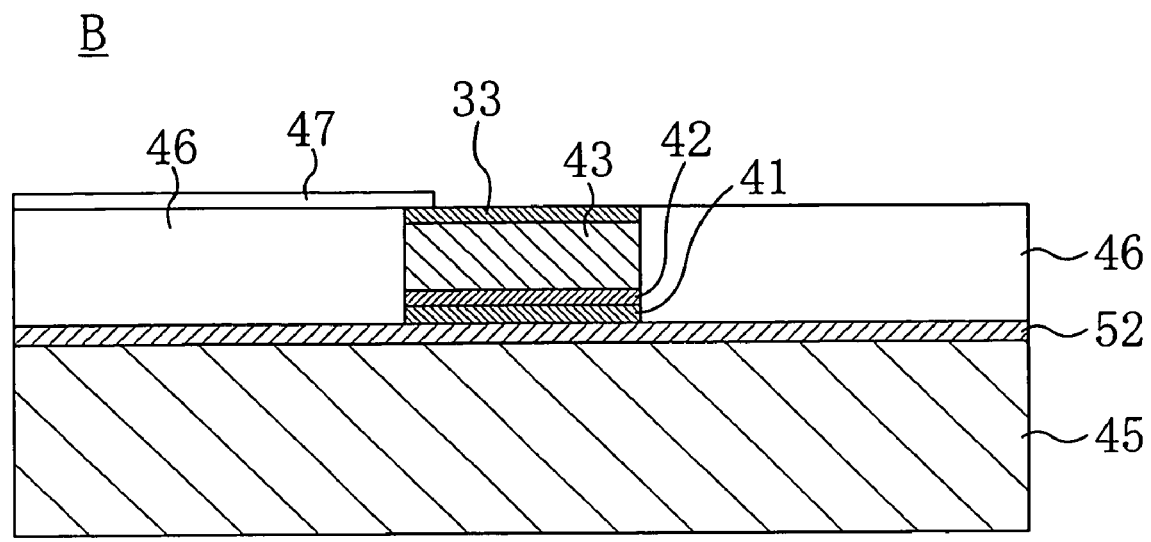
FIG. 28 is a view corresponding to the sectional view taken along the line VIII-VIII of FIG. 7 illustrating an actuator component according to Example 14 of Embodiment 6.

Referring to FIG. 28, another actuator component B having a different structure from Example 13 is described. FIG. 28 corresponds to the cross sectional view taken along the line VIII-VIII of FIG. 7 and illustrates the actuator component B according to Example 14 of Embodiment 7. As shown in FIG. 28, the actuator component B includes an individual electrode (second electrode film) 33 made of a 100 nm thick platinum (Pt) film, a second thin piezoelectric film 43 which is positioned immediately below the individual electrode 33 and made of a 4500 nm thick PZT film represented as $Pb_{1.05}Zr_{0.58}Ti_{0.42}O_3$, a first thin piezoelectric film 42 which is positioned immediately below the second thin piezoelectric film 43 and made of a 80 nm thick PZT film represented as $Pb_{1.10}Zr_{0.58}Ti_{0.42}O_3$, an orientation control film 41 which is positioned immediately below the first thin piezoelectric film 42 and made of a 40 nm thick PLT film represented as $Pb_{0.09}La_{0.30}Ti_{1.00}O_3$, a first electrode film 52 which is positioned immediately below the orientation control film 41 and made of a 200 nm thick palladium film and a diaphragm layer 45 which is positioned immediately below the first electrode film 52 and made of a 5000 nm thick silicon oxide ($SiO_2$) film. The diaphragm layer 45 is displaced by the piezoelectric effect of the first and second thin piezoelectric films 42 and 43 to cause vibration. The first electrode film 52 and the diaphragm layer 45 are shared by the pressure chambers 32 of the ink dischargers 202. The orientation control film 41 and the first and second thin piezoelectric films 42 and 43 are in the same shape as the individual electrode 33. A layered film formed of the individual electrode 33, the orientation control film 41 and the first and second thin piezoelectric films 42 and 43 on the first electrode film 52 is surrounded by an electrically insulating organic film 46 made of a polyimide resin and has the same thickness as the layered film. On the electrically insulating organic film 46, a lead electrode film 47 which is made of a 100 nm thick gold film in the form of a lead wire is formed and connected to the individual electrode 33. A piezoelectric element is achieved by the individual electrode 33, the orientation control film 41 and the layered piezoelectric film including the first and second thin piezoelectric films 42 and 43 and the first electrode film 52. The piezoelectric element is the same as the piezoelectric element 20 of Embodiment 5. Thus, the actuator component B is obtained with high performance.

Hereinafter, a method for manufacturing the actuator component B will be described.

FIGS. 29A to 29D and 30A to 30C illustrate the steps of the method for manufacturing the actuator component B. First, on a silicon substrate 51 (pressure chamber substrate) of 20 mm in length, 20 mm in width and 0.3 mm in thickness, a diaphragm layer 45 is formed. Then, on the diaphragm layer 45, a first electrode film 52, an orientation control film 53, a first thin piezoelectric film 54, a second thin piezoelectric film 55 and a second electrode film 44 are stacked in this order in the same manner as Example 5 of Embodiment 1. Thus, a structure 56 as shown in FIG. 29A is obtained.

Then, as shown in FIG. 29B, a resin photoresist film 59 is formed and patterned with accuracy such that the layered film including the second electrode film 44, the orientation control film 53 and the first and second thin piezoelectric films 54 and 55 is shaped into an oval having a shorter axis of 180 μm and a longer axis of 380 μm.

Then, etching is carried out by dry etching using Ar gas and wet etching using weak hydrogen fluoride. As a result, an actuator structure having the layered film including the individual electrode 33, the orientation control film 41 and the first and second thin piezoelectric films 42 and 43 is obtained as shown in FIG. 29C. Subsequently, the resin photoresist film 59 is removed by treatment with a resist remover as shown in FIG. 29D. Then, as shown in FIG. 30A, an electrically insulating organic film 46 is formed on the first electrode film 52 by printing.

Figure 30:
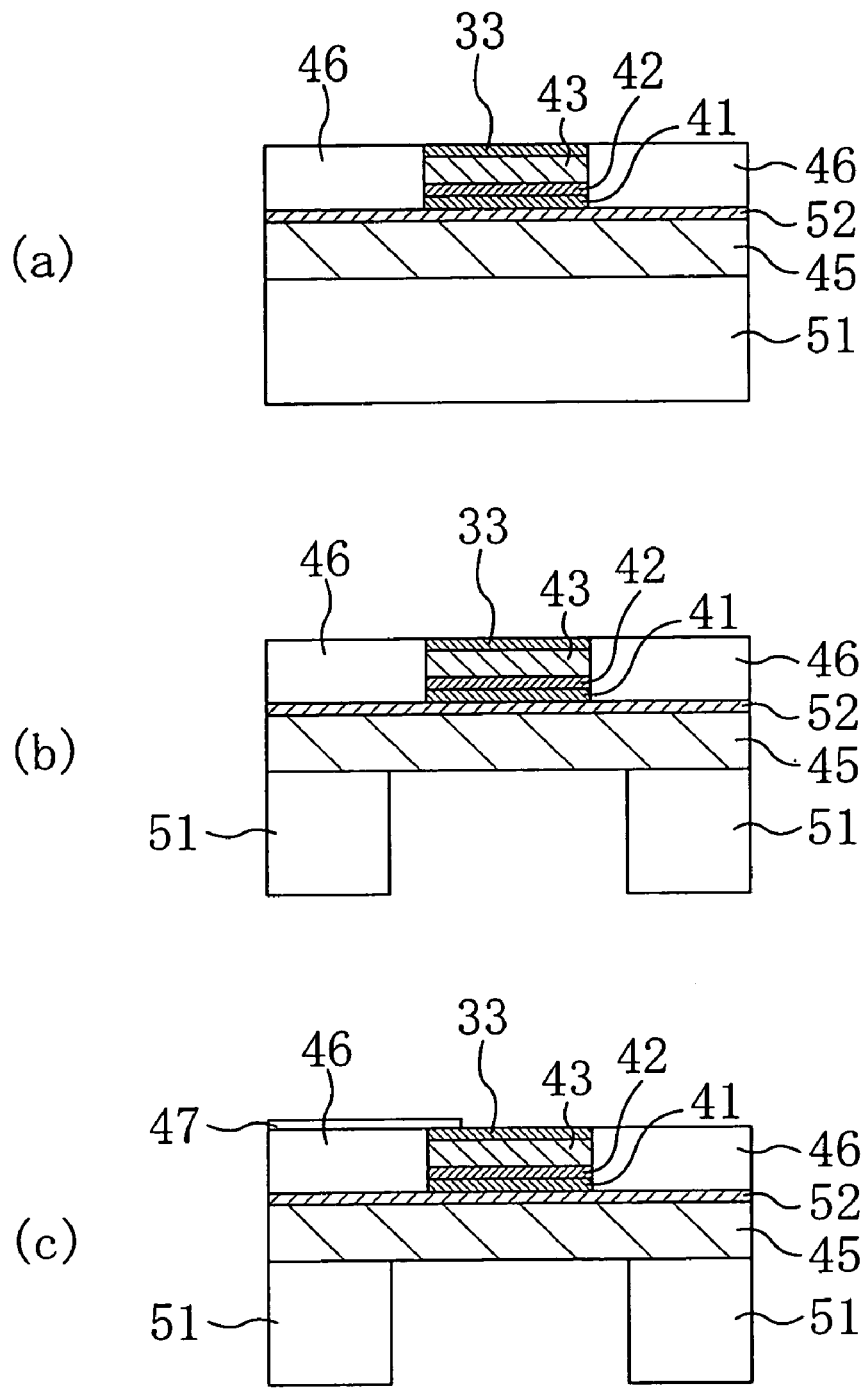
FIGS. 30A to 30C are views illustrating some of the steps of the method for manufacturing the actuator component according to Example 14 of Embodiment 6.

Then, as shown in FIG. 30B, part of the silicon substrate 51 is removed by dry etching using $SF_6$ gas in a plasma etching apparatus to provide a pressure chamber 32.

Then, a lead electrode film 47 is formed on the electrically insulating organic film 46 by DC sputtering as shown in FIG. 30C. Thus, an actuator component B shown in FIG. 28 is obtained.

30 ink dischargers 202 were fabricated by the method of the present example. A sine wave voltage of 0V to −60V was applied between the two electrode films 33 and 52 of each of the ink dischargers 202 at a frequency of 200 Hz to examine change of the up-and-down movement. Even after one billion time movements, no failure was occurred in all the ink dischargers 202.

Using 10 of the ink dischargers 202, inkjet heads 201 as shown in FIG. 6 were fabricated. The inkjet heads 201 offered the same effect as described in Example 6.

Embodiment 7

The present embodiment is directed to an inkjet recording device including the inkjet head of Embodiment 6 of the present invention. Hereinafter, an explanation of the inkjet recording device will be provided.

The inkjet recording device 81 according to Embodiment 7 of the present invention is substantially the same as the inkjet recording device of Embodiment 3 except that the inkjet head 201 according to Embodiment 6 is used (see FIG. 14).

According to the present embodiment, the same effect as Embodiment 3 is obtained.

Embodiment 8

The present embodiment is directed to an angular velocity sensor including the piezoelectric element of Embodiment 5 of the present invention. Hereinafter, an explanation of the angular velocity sensor will be provided.

Figure 31:
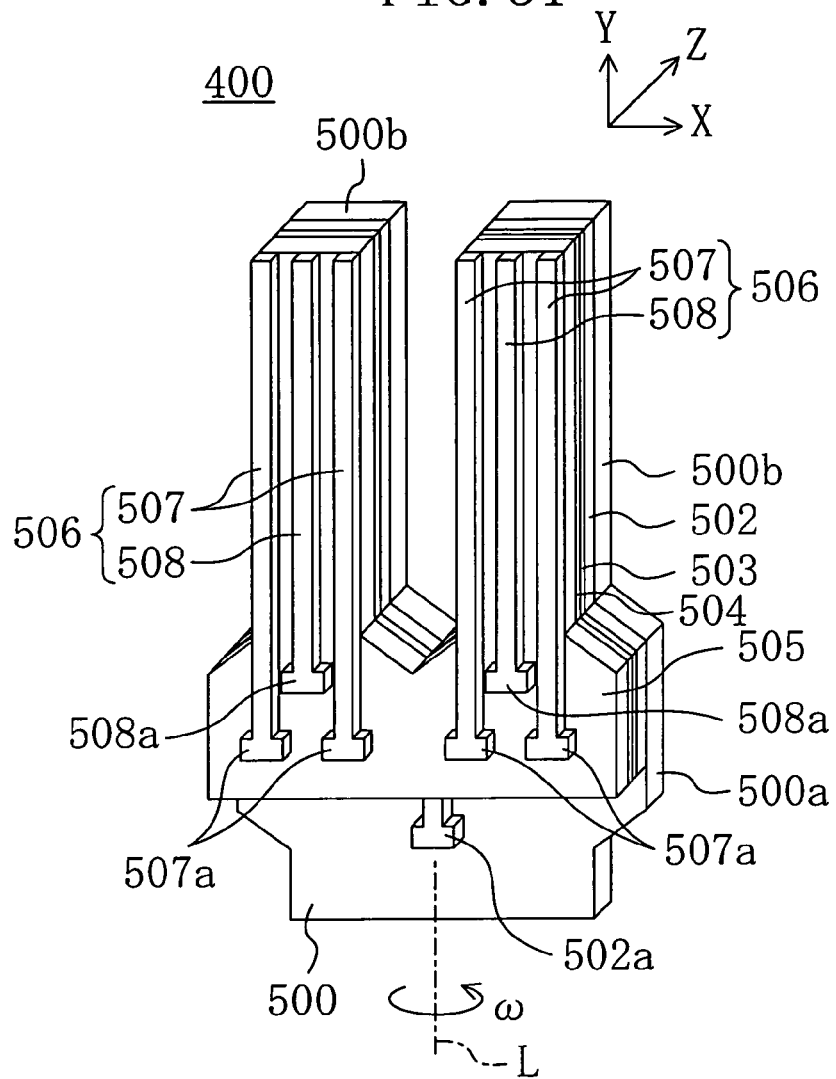
FIG. 31 is a schematic view illustrating an angular velocity sensor according to Embodiment 8.
Figure 32:
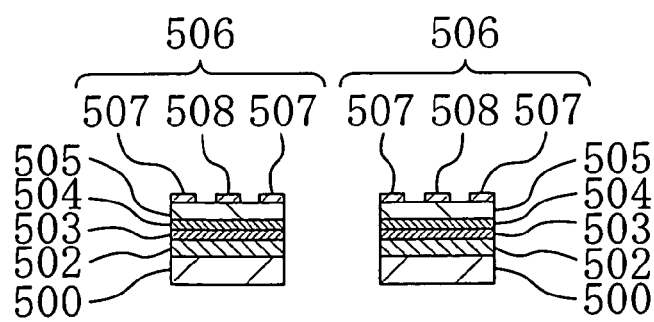
FIG. 32 is a sectional view illustrating the angular velocity sensor according to Embodiment 8.

FIGS. 31 and 32 are a schematic view and a sectional view illustrating the angular velocity sensor 400 according to Embodiment 8 of the present invention, respectively.

The angular velocity sensor 400 includes a substrate 500 made of a 0.3 mm thick silicon wafer. The substrate 500 includes a stationary part 500a and a pair of vibrating parts 500b extending from the stationary part 500a in a certain direction (the direction of extension of the center axis of rotation of angular velocity to be detected; in the present embodiment, a direction corresponding to the direction of Y shown in FIG. 31). The stationary part 500a and the pair of vibrating parts 500b provide the form of a tuning fork as viewed from the thickness direction of the substrate 500 (the Z direction in FIG. 31). The paired vibrating parts 500b corresponding to arms of the tuning fork are arranged side by side in the width direction of the vibrating parts 500b and extend parallel to each other. The substrate 500 may be a glass substrate, a metal substrate or a ceramic substrate.

On each of the vibrating parts 500b and a portion of the stationary part 500a closer to the vibrating parts 500b of the substrate 500, a first electrode film 502, an orientation control film 503, a first thin piezoelectric film 504, a second thin piezoelectric film 505 and a second electrode film 506 are stacked in this order. The first electrode film 502, the orientation control film 503, a layered piezoelectric film including the first and second thin piezoelectric films 504 and 505 and the second electrode film 506 constitute a piezoelectric element. The piezoelectric element is the same as the piezoelectric element 20 of Embodiment 5. Specifically, the first electrode film 502, orientation control film 503, first thin piezoelectric film 504, second thin piezoelectric film 505 and second electrode film 506 are the same as the first electrode 2, orientation control film 3, first piezoelectric film 4, second thin piezoelectric film 5 and second electrode film 6 of Embodiment 5, respectively.

Except for the above, Embodiment 8 is substantially the same as Embodiment 4.

Hereinafter, referring to FIGS. 33A to 33F, an explanation of a method for manufacturing the angular velocity sensor 400 will be provided. First, as shown in FIG. 33A, a substrate 500 made of a silicon wafer of 0.3 mm in thickness and 4 inch in diameter is prepared (see also FIG. 18). Then, a first electrode film 502 made of a 220 nm thick iridium (Ir) film is formed on the substrate 500 by sputtering as shown in FIG. 33B. The first electrode film 502 is obtained by sputtering on the substrate 500 heated at 400° C. using an Ir target and argon gas at 1 Pa and a high frequency power of 200 W in a sputtering apparatus for 12 minutes.

Then, a 40 nm thick orientation control film 503 is formed on the first electrode film 502 by sputtering as shown in FIG. 33C. In order to form the orientation control film 503, the substrate 500 is heated to 600° C. and sputtering is carried out for 12 minutes in a mixed atmosphere of argon and oxygen (gas volume ratio $Ar:O_2=19:1$) at a degree of vacuum of 0.8 Pa and a high frequency power of 300 W using a sintered PLT target containing 14 mol % of lanthanum prepared by excessively adding 12 mol % of lead oxide (PbO). The step of forming the orientation control film 503 includes the step of providing the orientation control film 503 with (111) preferred orientation.

Then, a first thin piezoelectric film 504 is formed on the orientation control film 503 by sputtering as shown in FIG. 33D. Subsequently, a second thin piezoelectric film 505 is formed on the first thin piezoelectric film 504 by sputtering to achieve a layered piezoelectric film. The first thin piezoelectric film 504 is made of a 50 nm thick PZT film having (111) preferred orientation and the second thin piezoelectric film 505 is made of a 3500 nm thick PZT film having (111) crystal orientation. To obtain the layered piezoelectric film, a 6-inch diameter sintered PZT target having a stoichiometric composition prepared by excessively adding about 20 mol % of PbO (molar composition ratio Pb:Zr:Ti=1.20:0.53:0.47) is used as a target. The substrate 500 on which the first electrode film 502 and the orientation control film 503 have been formed is preheated at 580° C. Then, sputtering is carried out using a gas mixture of argon and oxygen in the mixing ratio of $Ar:O_2=38:2$ as sputtering gas at a gas pressure of 0.2 Pa, a flow rate of 40 ml per minute and plasma generating power of 3 kW for 50 seconds to form the first thin piezoelectric film 504. Subsequently, the deposition was stopped and the mixing ratio of the sputtering gas is immediately changed to $Ar:O_2=79:1$. With the other conditions unchanged, the second thin piezoelectric film 505 is formed by sputtering for 2900 seconds. The step of forming the layered piezoelectric film includes the step of providing the layered piezoelectric film with (111) preferred orientation by the orientation control film 503.

Then, a 200 nm thick second electrode film 506 is formed on the second thin piezoelectric film 505 by sputtering as shown in FIG. 33E. The second electrode film 506 is obtained by sputtering using a Pt target in argon gas at 1 Pa under a room temperature and high frequency power of 200 W for 10 minutes.

Then, as shown in FIG. 33F, the second electrode film 506 is shaped into drive electrodes 507 and a detection electrode 508 by patterning (see also FIG. 18). Specifically, a photosensitive resin is applied onto the second electrode film 506 and exposed to light to provide patterns of the drive electrodes 507 and the detection electrode 508. Then, part of the photosensitive resin which has not been exposed to light is removed and part of the second electrode film 506 from the surface of which the photosensitive resin has been removed is removed by etching. Then, the photosensitive resin remaining on the drive electrodes 507 and the detection electrode 508 is removed.

Subsequently, patterning is carried out on the first thin piezoelectric film 504, second thin piezoelectric film 505, orientation control film 503 and first electrode film 502. Then, patterning is further carried out on the substrate 500 to achieve a stationary part 500a and vibrating parts 500b. Subsequently, the substrate 500 is shaped in the form of a tuning fork as shown in FIG. 31. Thus, the angular velocity sensor 400 is obtained.

As described above, the present embodiment offers the same effect as Embodiment 4.

In the present embodiment, only a single pair of the vibrating parts 500b is provided on the substrate 500. However, multiple pairs of the vibrating parts 500b may be provided such that the angular velocities along the multiple axes extending in different directions can be detected.

Further, in the present embodiment, the first electrode 502, the orientation control film 503, the first thin piezoelectric film 504, the second thin piezoelectric film 505 and the second electrode film 506 are stacked in this order on the vibrating parts 500b and part of the stationary part 500a closer to the vibrating parts 500b. However, these films may be formed only on the vibrating parts 500b.

Other Embodiments

In the above-described embodiments, the piezoelectric element of the present invention is applied to the inkjet head (inkjet recording device) and the angular velocity sensor. However, other than those mentioned above, the present invention may be applied to thin-film capacitors, charge-storage capacitors of nonvolatile memories, various kinds of actuators, infrared sensors, ultrasonic sensors, pressure sensors, acceleration sensors, flow sensors, shock sensors, piezoelectric transformers, piezoelectric igniters, piezoelectric speakers, piezoelectric microphones, piezoelectric filters, piezoelectric pickups, tuning-fork type radiators, delay lines and other devices. In particular, the present invention is suitably applied to a thin-film piezoelectric actuator for a disk system (used as a memory device in a computer), in which a head for recording/reproducing information in/out of a rotary-driven disk is provided on a substrate of a head support mechanism. The head is displaced by deforming the substrate using a thin-film piezoelectric element disposed on the substrate (e.g., see Japanese Unexamined Patent Publication No. 2001-332041). Specifically, in the same manner as in the above-described embodiments, the thin-film piezoelectric element is a product achieved by stacking a first electrode film, a first thin piezoelectric film, a second thin piezoelectric film and a second electrode film in this order and bonding the second electrode film to a substrate, or alternatively, by stacking a first electrode film, an orientation control film, a first thin piezoelectric film, a second thin piezoelectric film and a second electrode film in this order and bonding the second electrode film to a substrate.

INDUSTRIAL APPLICABILITY

The piezoelectric element of the present invention is useful not only as an inkjet head but also as an angular velocity sensor used for gyroscopic devices. Moreover, the piezoelectric element may also be applied to micromachine devices represented by optical switch components.

The invention claimed is:

1. A piezoelectric element comprising a first electrode film, a layered piezoelectric film including a first thin piezoelectric film provided on the first electrode film and a second thin piezoelectric film provided on the first thin piezoelectric film and a second electrode film provided on the layered piezoelectric film, wherein the layered piezoelectric film is made of rhombohedral or tetragonal perovskite oxide having preferred orientation along the (111) plane, the first and second thin piezoelectric films are aggregates of columnar grains, respectively, which are continuously linked to each other, the columnar grains of the second thin piezoelectric film have a larger average cross-sectional diameter than the columnar grains of the first thin piezoelectric film and the ratio of the thickness of the layered piezoelectric film to the average cross-sectional diameter of the columnar grains of the second thin piezoelectric film is 20 to 60 inclusive.

2. A piezoelectric element according to claim 1, wherein the columnar grains of the first thin piezoelectric film have an average cross-sectional diameter of 40 nm to 70 nm inclusive and a length of 5 nm to 100 nm inclusive.

3. A piezoelectric element according to claim 1, wherein the columnar grains of the second thin piezoelectric film have an average cross-sectional diameter of 60 nm to 200 nm inclusive and a length of 2500 nm to 5000 nm inclusive.

4. A piezoelectric element according to claim 1, wherein the first and second thin piezoelectric films are made of oxide based on perovskite lead zirconate titanate, the degree of (111) crystal orientation of the first thin piezoelectric film is 50% to 80% inclusive and the degree of (111) crystal orientation of the second thin piezoelectric film is 95% to 100% inclusive.

5. A piezoelectric element according to claim 1, wherein the chemical composition ratio of the layered piezoelectric film is represented as $[Pb]:[Zr]:[Ti]=(1+a):b:(1-b)$, the first and second thin piezoelectric films have the same value b of 0.40 to 0.60 inclusive, the first thin piezoelectric film has a larger Pb content than the second thin piezoelectric film, the first thin piezoelectric film has the value a of 0.05 to 0.15 inclusive and the second thin piezoelectric film has the value a of 0 to 0.10 inclusive.

6. A piezoelectric element according to claim 1, wherein the layered piezoelectric film is made of lead zirconate titanate added with at least one of magnesium and manganese in an amount of more than 0 and not more than 10 mol %.

7. A piezoelectric element according to claim 1, wherein the first electrode film is made of noble metal of Pt, Ir, Pd or Ru or an alloy containing the noble metal and is an aggregate of columnar grains having an average cross-sectional diameter of 20 nm to 30 nm inclusive.

8. An inkjet head comprising: a piezoelectric element according to claim 1 including a first electrode film, a layered piezoelectric film including a first thin piezoelectric film and a second thin piezoelectric film and a second electrode film stacked in this order; a diaphragm layer disposed on the second electrode film side surface of the piezoelectric element; and a pressure chamber member including a pressure chamber for containing ink which is bonded to the surface of the diaphragm layer opposite to the second electrode film, such that the ink in the pressure chamber is discharged out by displacing the diaphragm layer in the thickness direction by the piezoelectric effect of the layered piezoelectric film.

9. An inkjet recording device comprising an inkjet head according to claim 8 and a relative movement mechanism for relatively moving the inkjet head and a recording medium, wherein recording is carried out by discharging the ink in the pressure chamber from a nozzle hole communicating with the pressure chamber onto the recording medium while the inkjet head and the recording medium are relatively moved by the relative movement mechanism.

10. An inkjet head comprising: a piezoelectric element according to claim 1 including a first electrode film, a layered piezoelectric film including a first thin piezoelectric film and a second thin piezoelectric film and a second electrode film stacked in this order; a diaphragm layer disposed on the first electrode film side surface of the piezoelectric element; and a pressure chamber member including a pressure chamber for containing ink which is bonded to the surface of the diaphragm layer opposite to the first electrode film, such that the ink in the pressure chamber is discharged out by displacing the diaphragm layer in the thickness direction by the piezoelectric effect of the layered piezoelectric film.

11. An inkjet recording device comprising
an inkjet head according to claim 10 and
a relative movement mechanism for relatively moving the inkjet head and a recording medium, wherein
recording is carried out by discharging the ink in the pressure chamber from a nozzle hole communicating with the pressure chamber onto the recording medium while the inkjet head and the recording medium are relatively moved by the relative movement mechanism.

12. A piezoelectric element according to claim 1 further comprising an orientation control film disposed between the first electrode film and the first thin piezoelectric film, wherein
the orientation control film is made of cubic or tetragonal perovskite oxide having preferred orientation along the (111) plane.

13. A piezoelectric element according to claim 12, wherein the columnar grains of the first thin piezoelectric film have an average cross-sectional diameter of 40 nm to 70 nm inclusive and a length of 5 nm to 100 nm inclusive.

14. A piezoelectric element according to claim 12, wherein the columnar grains of the second piezoelectric film have an average cross-sectional diameter of 60 nm to 200 nm inclusive and a length of 2500 nm to 5000 nm inclusive.

15. A piezoelectric element according to claim 12, wherein the first and second thin piezoelectric films are made of oxide based on perovskite lead zirconate titanate,
the degree of (111) crystal orientation of the first thin piezoelectric film is 50% to 80% inclusive and
the degree of (111) crystal orientation of the second thin piezoelectric film is 95% to 100% inclusive.

16. A piezoelectric element according to claim 12, wherein the chemical composition ratio of the layered piezoelectric film is represented as $[Pb]:[Zr]:[Ti]=(1+a):b:(1-b)$, the first and second thin piezoelectric films have the same value b of 0.40 to 0.60 inclusive,
the first thin piezoelectric film has a larger Pb content than the second thin piezoelectric film,
the first thin piezoelectric film has the value a of 0.05 to 0.15 inclusive and
the second thin piezoelectric film has the value a of 0 to 0.10 inclusive.

17. A piezoelectric element according to claim 12, wherein the orientation control film is made of oxide based on perovskite lead lanthanum zirconate titanate and
the degree of (111) crystal orientation of the orientation control film is 50% or more.

18. A piezoelectric element according to claim 12, wherein the chemical composition ratio of the orientation control film is represented as $[Pb]:[La]:[Zr]:[Ti]=x \times (1-z):z:y:(1-y)$, the value x is 1.0 to 1.20 inclusive,
the value y is 0 to 0.20 inclusive and
the value z is more than 0 and not more than 0.30.

19. A piezoelectric element according to claim 12, wherein the orientation control film is made of lead lanthanum zirconate titanate added with at least one of magnesium and manganese in an amount of more than 0 and not more than 10 mol %.

20. A piezoelectric element according to claim 12, wherein the layered piezoelectric film is made of lead zirconate titanate added with at least one of magnesium and manganese in an amount of more than 0 and not more than 10 mol %.

21. A piezoelectric element according to claim 12, wherein the first electrode film is made of noble metal of Pt, Ir, Pd or Ru or an alloy containing the noble metal and is an aggregate of columnar grains having an average cross-sectional diameter of 20 nm to 30 nm inclusive.

22. An inkjet head comprising: a piezoelectric element according to claim 12 including a first electrode film, an orientation control film, a layered piezoelectric film including a first thin piezoelectric film and a second thin piezoelectric film and a second electrode film stacked in this order; a diaphragm layer disposed on the second electrode film side surface of the piezoelectric element; and a pressure chamber member including a pressure chamber for containing ink which is bonded to the surface of the diaphragm layer opposite to the second electrode film, such that the ink in the pressure chamber is discharged out by displacing the diaphragm layer in the thickness direction by the piezoelectric effect of the layered piezoelectric film.

23. An inkjet recording device comprising
an inkjet head according to claim 22 and
a relative movement mechanism for relatively moving the inkjet head and a recording medium, wherein
recording is carried out by discharging the ink in the pressure chamber from a nozzle hole communicating with the pressure chamber onto the recording medium while the inkjet head and the recording medium are relatively moved by the relative movement mechanism.

24. An inkjet head comprising: a piezoelectric element according to claim 12 including a first electrode film, an orientation control film, a layered piezoelectric film including a first thin piezoelectric film and a second thin piezoelectric film and a second electrode film stacked in this order; a diaphragm layer disposed on the first electrode film side surface of the piezoelectric element; and a pressure chamber member including a pressure chamber for containing ink which is bonded to the surface of the diaphragm layer opposite to the first electrode film, such that the ink in the pressure chamber is discharged out by displacing the diaphragm layer in the thickness direction by the piezoelectric effect of the layered piezoelectric film.

25. An inkjet recording device comprising
an inkjet head according to claim 24 and
a relative movement mechanism for relatively moving the inkjet head and a recording medium, wherein
recording is carried out by discharging the ink in the pressure chamber from a nozzle hole communicating with the pressure chamber onto the recording medium while the inkjet head and the recording medium are relatively moved by the relative movement mechanism.

* * * * *

UNITED STATES PATENT AND TRADEMARK OFFICE
CERTIFICATE OF CORRECTION

| | | |
|---|---|---|
| PATENT NO. | : 7,530,676 B2 | Page 1 of 1 |
| APPLICATION NO. | : 10/560001 | |
| DATED | : May 12, 2009 | |
| INVENTOR(S) | : Tomozawa et al. | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 417 days Delete the phrase "by 417 days" and insert -- by 572 days --

Signed and Sealed this

First Day of June, 2010

David J. Kappos
*Director of the United States Patent and Trademark Office*